(12) United States Patent
Murakami et al.

(10) Patent No.: US 8,048,538 B2
(45) Date of Patent: Nov. 1, 2011

(54) ORGANIC ELECTROLUMINESCENT DEVICE

(75) Inventors: Takeshi Murakami, Minami-Ashigara (JP); Kazunari Yagi, Minami-Ashigara (JP); Seiji Ichijima, Minami-Ashigara (JP); Tatsuya Igarashi, Minami-Ashigara (JP); Tasuku Satou, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 825 days.

(21) Appl. No.: 11/911,665

(22) PCT Filed: Apr. 25, 2006

(86) PCT No.: PCT/JP2006/309142
§ 371 (c)(1),
(2), (4) Date: Oct. 16, 2007

(87) PCT Pub. No.: WO2006/115301
PCT Pub. Date: Nov. 2, 2006

(65) Prior Publication Data
US 2009/0079329 A1    Mar. 26, 2009

(30) Foreign Application Priority Data

Apr. 25, 2005 (JP) ................................ 2005-126262
Aug. 29, 2005 (JP) ................................ 2005-247418

(51) Int. Cl.
*H01L 51/54* (2006.01)
(52) U.S. Cl. ........ 428/690; 428/917; 313/504; 313/506; 257/E51.044
(58) Field of Classification Search .................. None
See application file for complete search history.

(56) References Cited

U.S. PATENT DOCUMENTS

| 2004/0166365 A1 | 8/2004 | Ise et al. | |
|---|---|---|---|
| 2005/0170207 A1 * | 8/2005 | Ma et al. | 428/690 |
| 2005/0260445 A1 * | 11/2005 | Walters et al. | 428/690 |
| 2006/0024522 A1 * | 2/2006 | Thompson | 428/690 |
| 2006/0154106 A1 * | 7/2006 | Walters et al. | 428/690 |
| 2006/0258043 A1 * | 11/2006 | Bold et al. | 438/99 |

FOREIGN PATENT DOCUMENTS

| WO | 00/57676 A1 | 9/2000 |
|---|---|---|
| WO | 2004/108857 A1 | 12/2004 |
| WO | WO 2005/019373 A2 * | 3/2005 |

* cited by examiner

*Primary Examiner* — Marie R. Yamnitzky
(74) *Attorney, Agent, or Firm* — Sughrue Mion, PLLC

(57) ABSTRACT

A organic electroluminescent device comprising: a pair of electrodes; and at least one organic layer between the pair of electrodes, wherein the at least one organic layer contains a specific compound in which a transition metal and a carbene carbon are bonded to each other.

6 Claims, No Drawings

ORGANIC ELECTROLUMINESCENT DEVICE

TECHNICAL FIELD

The present invention relates to an organic electroluminescent device which can emit light by converting electric energy into optical energy.

BACKGROUND ART

Since an organic electroluminescent device (organic EL device) can emit high-brightness light with a low voltage, the organic EL device has been actively studied. In general, the organic EL device includes an organic layer (hereinafter, also referred to as an organic compound layer) having a light emitting layer and a pair of electrodes with the organic layer therebetween and uses light emitted from exciters generated by recombining electrons injected from a negative electrode and holes injected from a positive electrode with each other in the light emitting layer.

In recent years, increase in efficiency of the organic EL device has been advanced by using a phosphorescent material. An iridium complex (WO 00/57676) and a platinum complex are known as the phosphorescent material, but the phosphorescent material requires improvement in efficiency, durability, and emitted color.

DISCLOSURE OF THE INVENTION

An object of the present invention is to provide an organic electroluminescent device which can emit a variety of color light with high durability or high light emitting efficiency.

The object is accomplished by the following means.

(1) An organic electroluminescent device comprising:
a pair of electrodes; and
at least one organic layer between the pair of electrodes,
wherein the at least one organic layer contains a compound represented by Formula (1):

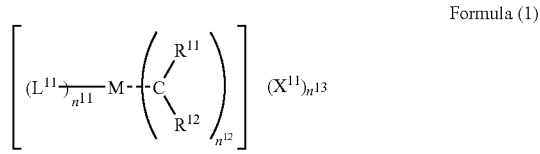

Formula (1)

wherein M represents a transition metal atom or a transition metal ion;
$R^{11}$ and $R^{12}$ each independently represents a hydrogen atom or a substituent group, and $R^{11}$ and $R^{12}$ may be independently bonded to M or $R^{11}$ and $R^{12}$ may be bonded to each other to form a cyclic structure;
$L^{11}$ represents a ligand, and $L^{11}$ may be bonded to at least one of $R^{11}$ and $R^{12}$;
$X^{11}$ represents a counter ion;
$n^{11}$ represents an integer of 0 to 5;
$n^{12}$ represents an integer of 1 to 6;
$n^{13}$ represents an integer of 0 to 3; and
C represents a carbene carbon, which is bonded to $R^{11}$ and $R^{12}$ to coordinate with M.

(2) The organic electroluminescent device as described in (1) above,
wherein the compound represented by Formula (1) is a compound represented by Formula (2):

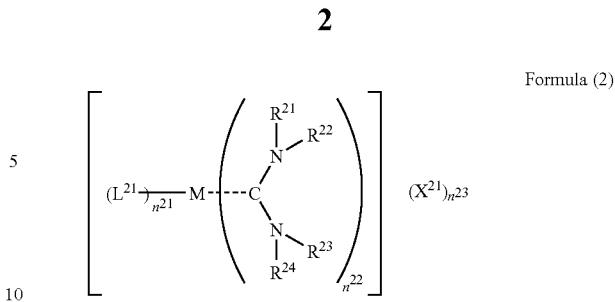

Formula (2)

wherein M represents a transition metal atom or a transition metal ion;
$R^{21}$, $R^{22}$, $R^{23}$ and $R^{24}$ each independently represents a hydrogen atom or a substituent group, and $R^{21}$, $R^{22}$, $R^{23}$ and $R^{24}$ may be independently bonded to M or $R^{21}$, $R^{22}$, $R^{23}$ and $R^{24}$ may be bonded to each other to form a cyclic structure;
$L^{21}$ represents a ligand, and $L^{21}$ may be bonded to at least one of $R^{21}$, $R^{22}$, $R^{23}$ and $R^{24}$;
$X^{21}$ represents a counter ion;
$n^{21}$ represents an integer of 0 to 5;
$n^{22}$ represents an integer of 1 to 6;
$n^{23}$ represents an integer of 0 to 3; and
C represents a carbene carbon, which is bonded to two nitrogen atoms to coordinate with M.

(3) The organic electroluminescent device as described in (2) above,
wherein the compound represented by Formula (2) is a compound represented by Formula (3):

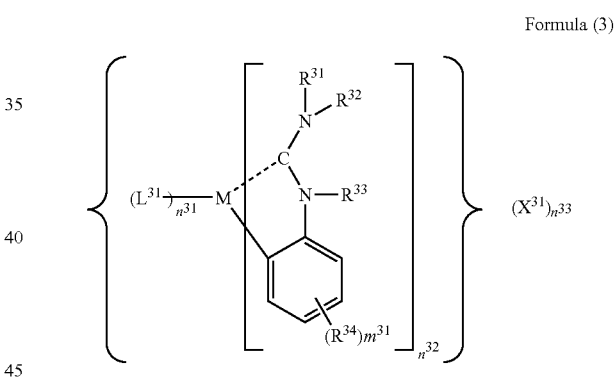

Formula (3)

wherein M represents a transition metal atom or a transition metal ion;
$R^{31}$, $R^{32}$ and $R^{33}$ each independently represents a hydrogen atom or a substituent group, and $R^{31}$, $R^{32}$ and $R^{33}$ may be bonded to each other to form a cyclic structure or $R^{31}$, $R^{32}$ and $R^{33}$ may coordinate with M through an atom of $R^{31}$, $R^{32}$ and $R^{33}$ respectively;
$R^{34}$ represents a substituent group, provided that when $R^{34}$ is plural, a plurality of $R^{34}$ may equal to or different from each other, and a plurality of $R^{34}$ may be bonded to each other to form a cyclic structure or $R^{34}$ may coordinate with M through an atom of $R^{34}$;
$L^{31}$ represents a ligand;
$X^{31}$ represents a counter ion;
$n^{31}$ represents an integer of 0 to 4;
$n^{32}$ represents an integer of 1 to 3;
$n^{33}$ represents an integer of 0 to 2; and
$m^{31}$ represents an integer of 0 to 4; and
C represents a carbene carbon, which is bonded to two nitrogen atoms to coordinate with M by means of two electrons of the carbene carbon.

(4) The organic electroluminescent device as described in (3) above,
wherein the compound represented by Formula (3) is a compound represented by Formula (4):

Formula (4)

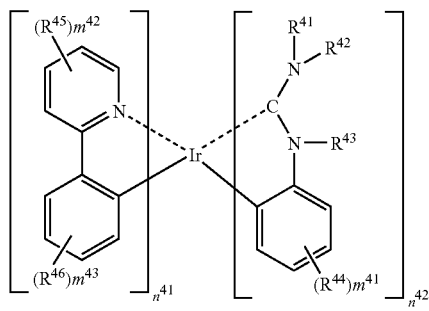

wherein $R^{41}$, $R^{42}$ and $R^{43}$ each independently represents a hydrogen atom or a substituent group, and $R^{41}$, $R^{42}$ and $R^{43}$ may be bonded to each other to form a cyclic structure or $R^{41}$, $R^{42}$ and $R^{43}$ may coordinate with M through an atom of $R^{41}$, $R^{42}$ and $R^{43}$ respectively;

$R^{44}$, $R^{45}$ and $R^{46}$ each independently represents a substituent group, provided that when $R^{44}$, $R^{45}$ and $R^{46}$ are plural respectively, a plurality of $R^{44}$, a plurality of $R^{45}$ and a plurality of $R^{46}$ may be bonded to each other to form a cyclic structure respectively or $R^{44}$, $R^{45}$ and $R^{46}$ may coordinate with M through an atom of $R^{44}$, $R^{45}$ and $R^{46}$ respectively;

$n^{41}$ represents an integer of 0 to 2;

$n^{42}$ represents an integer of 1 to 3; and $m^{41}$, $m^{42}$ and $m^{43}$ each independently represents an integer of 0 to 4.

(5) The organic electroluminescent device as described in any of (1) to (4) above,
wherein a ligand containing the carbene carbon is a tridentate to hexadentate ligand.

(6) The organic electroluminescent device as described in (1) above,
wherein the compound represented by Formula (1) is a compound represented by Formula (5):

Formula (5)

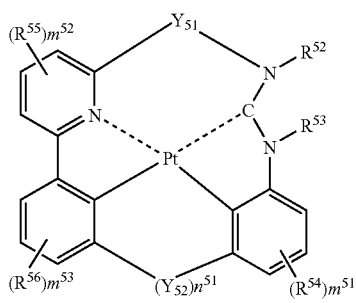

wherein $R^{52}$ and $R^{53}$ each independently represents a hydrogen atom or a substituent group, and $R^{52}$ and $R^{53}$ may be bonded to each other to form a cyclic structure;

$R^{54}$, $R^{55}$ and $R^{56}$ each independently represents a substituent group, provided that when $R^{54}$, $R^{55}$ and $R^{56}$ are plural respectively, a plurality of $R^{54}$, a plurality of $R^{55}$ and a plurality of $R^{56}$ may be bonded to each other to form a cyclic structure respectively;

$Y^{51}$ and $Y^{52}$ each independently represents a single bond or a connection group;

$n^{51}$ represents 0 or 1; and $m^{51}$, $m^{52}$ and $m^{53}$ each independently represents an integer of 0 to 4.

(7) The organic electroluminescent device as described in any of (1) to (6) above,
wherein the at least one organic layer includes a light emitting layer, and
wherein the light emitting layer contains at least a light emitting material and a compound represented by any of Formulae (1) to (5).

(8) The organic electroluminescent device as described in any of (1) to (7) above,
wherein the at least one organic layer includes a light emitting layer, and
wherein at least one layer between the light emitting layer and a positive electrode contains a compound represented by any of Formulae (1) to (5).

(9) The organic electroluminescent device as described in any of (1) to (7) above,
wherein the at least one organic layer includes a light emitting layer, and
wherein at least one layer between the light emitting layer and a negative electrode contains a compound represented by any of Formulae (1) to (5).

In an organic electroluminescent device having at least one organic layer between a pair of electrodes, it is possible to improve the durability of a device (reduction of the driving voltage and inhibition for the generation of dark spots along with the deterioration of a device when it is driven for a long time.) or the light emitting efficiency of a device by using a compound represented by any of formulae (1) to (5) which has a bond between a transition metal and a carbene carbon in the organic layer.

Further, by employing a compound represented by any of formulae (1) to (5) in at least one organic layer laminated especially between a light emitting layer and a positive electrode or between a light emitting layer and a negative electrode, it is possible to further improve a light emitting efficiency in addition to the durability of a device (reduction of the driving voltage and inhibition for the generation of dark spots along with the deterioration of a device when it is driven for a long time.)

BEST MODE FOR CARRYING OUT THE INVENTION

Hereinafter, the present invention will be described in detail.

The present invention provides an organic electroluminescent device having at least one organic layer between a pair of electrodes. Here, the at least one organic layer contains a compound represented by formulae (1) to (5) (having the same meaning as the compound according to the present invention in which a transition metal and a carbene carbon are bonded to each other.)

Formula (1) is described. M represents a transition metal atom or a transition metal ion. $R^{11}$ and $R^{12}$ represent a hydrogen atom or a substituent group independently. Both or one of $R^{11}$ and $R^{12}$ may coordinate with M through an atom(s) of both or one of $R^{11}$ and $R^{12}$. $L^{11}$ represents a ligand and $X^{11}$ represents a counter ion. $n^{11}$ represents an integer of 0 to 5, $n^{12}$ represents an integer of 1 to 6, and $n^{13}$ represents an integer of 0 to 3. C represents a carbene carbon. The carbene carbon is bonded to $R^{11}$ and $R^{12}$ (preferably in a covalent bond) and coordinates with M by means of two electrons of carbon.

The transition metal atom used in the present invention is not particularly limited, but is preferably one of ruthenium, rhodium, palladium, tungsten, rhenium, osmium, iridium, and platinum, more preferably one of palladium, rhenium, rhodium, iridium, and platinum, and most preferably one of palladium, rhodium, iridium, and platinum.

Examples of the substituent group represented by $R^{11}$ and $R^{12}$ can include an alkyl group (which has preferably a carbon number of 1 to 30, more preferably a carbon number of 1 to 20, and most preferably a carbon number of 1 to 10, and examples of which can include methyl, ethyl, iso-propyl, tert-butyl, n-octyl, n-decyl, n-hexadecyl, cyclopropyl, cyclopentyl, and cyclohexyl), an alkenyl group (which has preferably a carbon number of 2 to 30, more preferably a carbon number of 2 to 20, and most preferably a carbon number of 2 to 10, and examples of which can include vinyl, aryl, 2-butenyl, and 3-pentenyl), and an alkinyl group (which has preferably a carbon number of 2 to 30, more preferably a carbon number of 2 to 20, and most preferably a carbon number of 2 to 10, and examples of which can include propargyl and 3-pentinyl).

In addition, other examples of the substituent group represented by $R^{11}$ and $R^{12}$ can include an aryl group (which has preferably a carbon number of 6 to 30, more preferably a carbon number of 6 to 20, and most preferably a carbon number of 6 to 12, and examples of which can include phenyl, p-methylphenyl, naphthyl, and anthranil), a substituted or non-substituted amino group (which has preferably a carbon number of 0 to 30, more preferably a carbon number of 0 to 20, and most preferably a carbon number of 0 to 10, and examples of which can include amino, methyl amino, dimethyl amino, diethyl amino, dibenzyl amino, diphenyl amino, and ditolyl amino), an alkoxy group (which has preferably a carbon number of 1 to 30, more preferably a carbon number of 1 to 20, and most preferably a carbon number of 1 to 10, and examples of which can include methoxy, ethoxy, butoxy, and 2-ethylhexyloxy), an aryloxy group (which has preferably a carbon number of 6 to 30, more preferably a carbon number of 6 to 20, and most preferably a carbon number of 6 to 12, and examples of which can include phenyloxy, 1-naphthyloxy, and 2-naphthyloxy), and a heterocyclic oxy group (which has preferably a carbon number of 1 to 30, more preferably a carbon number of 1 to 20, and most preferably a carbon number of 1 to 12, and examples of which can include pyridyloxy, pyrazyloxy, pyrimidyloxy, and quinolyloxy).

In addition, other examples of the substituent group represented by $R^{11}$ and $R^{12}$ can include an acyl group (which has preferably a carbon number of 1 to 30, more preferably a carbon number of 1 to 20, and most preferably a carbon number of 1 to 12, and examples of which can include acetyl, benzoyl, formyl, and pivaloyl), an alkoxycarbonyl group (which has preferably a carbon number of 2 to 30, more preferably a carbon number of 2 to 20, and most preferably a carbon number of 2 to 12, and examples of which can include methoxycarbonyl and ethoxycarbonyl), an aryloxycarbonyl group (which has preferably a carbon number of 7 to 30, more preferably a carbon number of 7 to 20, and most preferably a carbon number of 7 to 12, and examples of which can include phenyloxycarbonyl), an acyloxy group (which has preferably a carbon number of 2 to 30, more preferably a carbon number of 2 to 20, and most preferably a carbon number of 2 to 10), and examples of which can include acetoxy and benzoyloxy), and an acyl amino group (which has preferably a carbon number of 2 to 30, more preferably a carbon number of 2 to 20, and most preferably a carbon number of 2 to 10, and examples of which can include acetyl amino and benzoyl amino).

In addition, other examples of the substituent group represented by $R^{11}$ and $R^{12}$ can include an alkoxycarbonyl amino group (which has preferably a carbon number of 2 to 30, more preferably a carbon number of 2 to 20, and most preferably a carbon number of 2 to 12, and examples of which can include methoxycarbonyl amino), an aryloxycarbonyl amino group (which has preferably a carbon number of 7 to 30, more preferably a carbon number of 7 to 20, and most preferably a carbon number of 7 to 12, and examples of which can include phenyloxycarbonyl amino), a sulfonyl amino group (which has preferably a carbon number of 1 to 30, more preferably a carbon number of 1 to 20, and most preferably a carbon number of 1 to 12, and examples of which can include methane sulfonyl amino and benzene sulfonyl amino), and a sulfamoyl group (which has preferably a carbon number of 0 to 30, more preferably a carbon number of 0 to 20, and most preferably a carbon number of 0 to 12, and examples of which can include sulfamoyl, methylsulfamoyl, dimethylsulfamoyl, and phenylsulfamoyl).

In addition, other examples of the substituent group represented by $R^{11}$ and $R^{12}$ can include a carbamoyl group (which has preferably a carbon number of 1 to 30, more preferably a carbon number of 1 to 20, and most preferably a carbon number of 1 to 12, and examples of which can include carbamoyl, methylcarbamoyl, diethylcarbamoyl, and phenylcarbamoyl), an alkylthio group (which has preferably a carbon number of 1 to 30, more preferably a carbon number of 1 to 20, and most preferably a carbon number of 1 to 12, and examples of which can include methylthio and ethylthio), an arylthio group (which has preferably a carbon number of 6 to 30, more preferably a carbon number of 6 to 20, and most preferably a carbon number of 6 to 12, and examples of which can include phenylthio), and a heterocyclic thio group (which has preferably a carbon number of 1 to 30, more preferably a carbon number of 1 to 20, and most preferably a carbon number of 1 to 12, and examples of which can include pyridylthio, 2-benzimizolylthio, 2-benzoxazolylthio, and 2-benzthiazolylthio).

In addition, other examples of the substituent group represented by $R^{11}$ and $R^{12}$ can include a sulfonyl group (which has preferably a carbon number of 1 to 30, more preferably a carbon number of 1 to 20, and most preferably a carbon number of 1 to 12, and examples of which can include mesyl and tosyl), a sulfinyl group (which has preferably a carbon number of 1 to 30, more preferably a carbon number of 1 to 20, and most preferably a carbon number of 1 to 12, and examples of which can include methane sulfinyl and benzene sulfinyl), an ureido group (which has preferably a carbon number of 1 to 30, more preferably a carbon number of 1 to 20, and most preferably a carbon number of 1 to 12, and examples of which can include ureido, methylureido, and phenylureido), an amide phosphate group (which has preferably a carbon number of 1 to 30, more preferably a carbon number of 1 to 20, and most preferably a carbon number of 1 to 12, and examples of which can include diethyl amide phosphate and phenyl amide phosphate), an hydroxy group, a mercapto group, and a halogen atom (examples of which can include a fluorine atom, a chlorine atom, a bromine atom, and an iodine atom).

In addition, other examples of the substituent group represented by $R^{11}$ and $R^{12}$ can include a cyano group, a sulfo group, a carboxyl group, a nitro group, a hydroxamic acid group, a sulfino group, a hydrazino group, an imino group, a heterocyclic group (which has preferably a carbon number of 1 to 30 and more preferably a carbon number of 1 to 12 and which includes, for example, a nitrogen atom, an oxygen atom, and a sulfur atom as the hetero atom, examples of which can include imidazolyl, pyridyl, quinolyl, furyl, thienyl, piperidyl, morpholino, benzoxazolyl, benzimidazolyl, benzthiazolyl, carbazolyl, and azepinyl), a silyl group (which has preferably a carbon number of 3 to 40, more preferably a carbon number of 3 to 30, and most preferably a carbon number of 3 to 24, and examples of which can include trimethylsilyl and triphenylsilyl), and a silyloxy group (which has preferably a carbon number of 3 to 40, more preferably a carbon number of 3 to 30, and most preferably a carbon number of 3 to 24, and examples of which can include methylsilyloxy and triphenylsilyloxy). These substituent groups may be substituted again.

$R^{11}$ and $R^{12}$ may form a cyclic structure by bonding. $R^{11}$ and $R^{12}$ may coordinate with M through an atom of $R^{11}$ and $R^{12}$. At least one of $R^{11}$ and $R^{12}$ may be bonded to $L^{11}$ to form a chelate ligand. $R^{11}$ and $R^{12}$ are preferably one of an alkoxy group, an aryloxy group, a hetero aryloxy group, and a substituted amino group and more preferably one of an alkoxy group and a substituted amino group.

$L^{11}$ represents a ligand. Examples of the ligand can include ligands described in "Photochemistry and Photophysics of Coordination Compounds" published in 1987 by Springer-Verlag Co. and written by H. Yersin, and "Organic Metal Chemistry—Fundamentals and Applications" published in 1982 by Shokabou Co. and written by Yamamoto Akio. The ligand is preferably one of a halogen ligand (examples of which can include a chlorine ligand and a fluorine ligand), a nitrogen-containing heterocyclic ligand (examples of which can include bipyridyl, phenanthroline, phenylpyridine, pyrazolylpyridine, benzimidazolylpyridine, phenylpyrazole, picolinate, and dipicolinate), a diketone ligand, a nitrile ligand, a CO ligand, a isonitrile ligand, a phosphorous ligand (examples of which can include phosphine derivatives, phosphorous ester derivatives, and phosphinine derivatives), and a carbonic acid ligand (examples of which can include an acetic acid ligand), and more preferably a nitrogen-containing heterocyclic ligand (examples of which can include bipyridyl, phenanthroline, phenylpyridine, pyrazolylpyridine, benzimidazolylpyridine, and phenylpyrazole).

A nitrogen-containing heterocycle in the nitrogen-containing heterocyclic ligand is preferably one of a pyridine cycle, a pyrazine cycle, a pyrimidine cycle, a pyridazine cycle, a pyrrole cycle, a pyrazole cycle, an imidazole cycle, a triazole cycle, a thiazole cycle, an oxazole cycle, an oxadiazole cycle, a thiadiazole cycle, an azaphosphinine cycle and is more preferably >one of a pyridine cycle, a pyrazole cycle, and an imidazole cycle.

The nitrogen-containing heterocyclic ligand may have a substituent group. Examples of the substituent group can include the groups described in relation to $R^{11}$, and an alkyl group, an aryl group, an alkoxy group, a fluorine atom, a cyano group, and a substituted amino group are preferable.

$X^{11}$ represents a counter ion. The counter ion is not particularly limited, but is preferably one of an alkali metal ion, an alkali earth metal ion, a halogen ion, a perchlorate ion, a $PF_6$ ion, an ammonium ion (for example, a tetramethyl ammonium ion), a borate ion, and a phosphonium ion, and more preferably one of a perchlorate ion and a $PF_6$ ion.

$n^{11}$ represents an integer of 0 to 5, preferably an integer of 1 to 4, and more preferably an integer of 1 or 2. When n is plural, a plurality of $L^{11}$ may be equal to or different from each other. $n^{12}$ represents an integer of 1 to 6, preferably an integer of 1 to 4, and more preferably an integer of 1 to 3. When $n^{12}$ is plural, a plurality of carbene ligands represented by $R^{11}$—C—$R^2$ may be equal to or different from each other. $n^{13}$ represents an integer of 0 to 3, preferably 0 or 1, and more preferably 0. When $n^{13}$ is plural, a plurality of $X^{11}$ may be equal to or different from each other.

Formula (2) is described. M, $L^{21}$, $X^{21}$, $n^{21}$, $n^{22}$, and $n^{23}$ are the same as M, $L^{11}$, $X^{11}$, $n^{11}$, $n^{12}$, and $n^{13}$ of Formula (1) described above and preferable ranges thereof are also the same. $R^{21}$, $R^{22}$, $R^{23}$, and $R^{24}$ represent a hydrogen atom or a substituent group and examples of the substituent group can include the groups described with reference to $R^{11}$. $R^{21}$, $R^{22}$, $R^{23}$, and $R^{24}$ may form a ring structure, respectively, by bonding. $R^{21}$, $R^{22}$, $R^{23}$, and $R^{24}$ may coordinate with M through an atom of $R^{21}$, $R^{22}$; $R^{23}$, and $R^{24}$, respectively. $R^2$, $R^{22}$, $R^{23}$, and $R^{24}$ may be bonded to $L^{21}$ to form a chelate ligand, respectively. $R^{21}$, $R^{22}$, $R^{23}$, and $R^{24}$ are preferably one of an alkyl group, an aryl group, a heteroaryl group, an alkenyl group, an alkoxy group, an aryloxy group, an alkyl amino group, an aryl amino group, and a heterocyclic amino group, more preferably one of an alkyl group, an aryl group, a heteroaryl group, an alkoxy group, and an aryloxy group, and most preferably one of an alkyl group, an aryl group, and a heteroaryl group.

A carbene ligand formed out of a carbene carbon, two nitrogen atoms, $R^{21}$, $R^{22}$, $R^{23}$, and $R^{24}$ has preferably a ring-shaped structure containing the carbene carbon and the two nitrogen atoms, more preferably a 5-membered or 6-membered ring structure, and most preferably a 5-membered ring structure represented by Formula (Z-1).

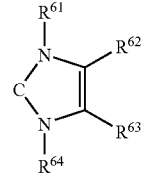

Formula (Z-1)

In the above-mentioned formula, $R^{61}$, $R^{62}$, $R^{63}$, and $R^{64}$ represent a hydrogen atom or a substituent group. C represents a carbene carbon. The carbene carbon is boned to two nitrogen atoms and has two electrons, which can coordinate with a transition metal, on the carbon.

Formula (Z-1) is described. $R^{61}$, $R^{62}$, $R^{63}$, and $R^{64}$ are the same as M, $R^{22}$, $R^{23}$, $L^{21}$, and $X^{21}$ of Formula (2) described above and preferable ranges thereof are also the same.

Formula (3) is described. M, $R^{31}$, $R^{32}$, $R^{33}$, $L^{31}$, and $X^{31}$ are the same as M, $R^{21}$, $R^{22}$, $R^{23}$, $L^{21}$, and $X^{21}$ of Formula (2) described above and preferable ranges thereof are also the same, respectively. $R^{34}$ represents a substituent group and examples of the substituent group can include the groups described with reference to $R^{11}$. A plurality of $R^{34}$ may equal to or different from each other. The plurality of $R^{34}$ may form a ring structure, respectively, by bonding or the atom on $R^{34}$ may coordinate with M. $R^{34}$ is preferably one of an alkyl group, an aryl group, a heteroaryl group, an alkoxy group, a fluorine atom, a cyano group, and a substituted amino group, more preferably one of an alkyl group, an aryl group, a fluorine atom, and a cyano group, and most preferably one of a fluorine atom and a cyano group. $n^{31}$ represents an integer of 0 to 4 and preferably an integer of 1 to 4. $n^{32}$ represents an integer of 1 to 3 and preferably 1 or 2. $n^{33}$ represents an integer of 0 to 2 and preferably 0 or 1. $m^{31}$ represents an integer of 0 to 4 and preferably an integer of 0 to 2. When $m^3$ is plural, a plurality of $R^{34}$ may be equal to or different from each other.

Formula (4) is described. $R^{41}$, $R^{42}$, $R^{43}$, $n^{42}$, and $m^{41}$ are the same as $R^{31}$, $R^{32}$, $R^{33}$, $R^{34}$, $n^{32}$, and $m^{31}$ of Formula (3) described above and preferable ranges thereof are also the same, respectively. $R^{45}$ and $R^{46}$ represent a substituent group and examples of the substituent group can include the groups described with reference to $R^{11}$. When $m^{42}$ is plural, a plurality of $R^{45}$ may be equal to or different from each other. A plurality of $R^{45}$ may form a ring structure, respectively, by bonding or the atom on $R^{45}$ may coordinate with an iridium atom. $R^{45}$ is preferably one of an alkyl group, an aryl group, a heteroaryl group, an alkoxy group, a fluorine atom, a cyano group, and a substituted amino group, more preferably one of an alkyl group, an aryl group, an alkoxy group, and a substituted amino group, and most preferably one of an alkoxy group and a substituted amino group. $n^{43}$ represents an integer of 0 to 4 and preferably an integer of 0 to 2. When $m^{43}$ is plural, a plurality of $R^{46}$ may be equal to or different from each other. A plurality of $R^{46}$ may form a ring structure, respectively, by bonding or the atom on $R^{46}$ may coordinate with an iridium atom. $R^{46}$ is preferably one of an alkyl group, an aryl group, a heteroaryl group, an alkoxy group, a fluorine atom, a cyano group, and a substituted amino group, more preferably one of an alkyl group, an aryl group, a fluorine atom, and a cyano group, and most preferably one of a fluorine atom and a cyano group. $m^{43}$ represents an integer of 0 to 4 and preferably an integer of 0 to 2. $n^{41}$ represents an integer of 0 to 2 and preferably 1 or 2.

In the compounds represented by Formulas (1) to (4), the ligand including a carbene carbon is preferably tridentate to hexadentate and more preferably tridentate or quadridentate.

Formula (5) is described. $R^{52}$ and $R^{53}$ represent a hydrogen atom or a substituent group and examples of the substituent group can include the groups described with reference to $R^{11}$. $R^{52}$ and $R^{53}$ may form a ring structure, respectively, by bonding, are preferably one of an alkyl group, an aryl group, a heteroaryl group, an alkenyl group, an alkoxy group, an aryloxy group, an alkyl amino group, an aryl amino group, and a heterocyclic amino group, more preferably one of an alkyl group, an aryl group, a heteroaryl group, an alkoxy group, and an aryloxy group, and most preferably one of an alkyl group, an aryl group, and a heteroaryl group.

A carbene ligand formed out of a carbene carbon, two nitrogen atoms, and $R^{52}$ and $R^{53}$ has preferably a ring-shaped structure containing the carbene carbon and the two nitrogen atoms, more preferably a 5-membered or 6-membered ring structure, and most preferably a 5-membered ring structure represented by Formula (Z-2).

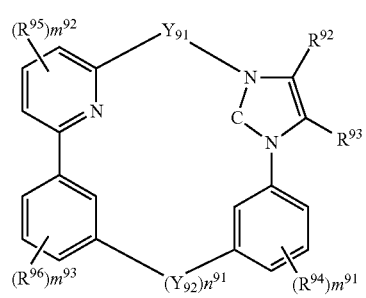

Formula (Z-2)

In the above-mentioned formula, $R^{92}$, and $R^{93}$ represent a hydrogen atom or a substituent group and $R^{94}$, $R^{95}$, and $R^{96}$ represent a substituent group. $Y^{91}$ and $Y^{92}$ represent a single bond or a connection group. $n^{91}$ represent 0 or 1 and $m^{91}$, $m^{92}$, and $m^{93}$ represent an integer of 0 to 4. C represents a carbene carbon. The carbene carbon is boned to two nitrogen atoms and has two electrons, which can coordinate with a transition metal, on the carbon.

$R^{54}$ and $R^{56}$ represent a substituent group and examples of the substituent group can include the groups described with reference to $R^{11}$. When $m^{51}$ and $m^{53}$ are plural, a plurality of $R^{54}$ and $R^{56}$ may be equal to or different from each other and may form a ring structure, respectively, by bonding. $R^{54}$ and $R^{56}$ are preferably one of an alkyl group, an aryl group, a heteroaryl group, an alkoxy group, a fluorine atom, a cyano group, and a substituted amino group, more preferably one of an alkyl group, an aryl group, a fluorine atom, and a substituted amino group, and most preferably one of a fluorine atom and a substituted amino group. $m^{51}$ and $m^{532}$ represent an integer of 0 to 4 and preferably an integer of 0 to 2.

$R^{55}$ represents a substituent group and examples of the substituent group can include the groups described with reference to $R^{11}$. A plurality of $R^{55}$ may be equal to or different from each other, or may form a ring structure, respectively, by bonding. $R^{55}$ is preferably one of an alkyl group, an aryl group, a heteroaryl group, an alkoxy group, a fluorine atom, a cyano group, and a substituted amino group, more preferably one of an alkyl group, an aryl group, an alkoxy group, and a substituted amino group, and most preferably one of an alkoxy group and a substituted amino group. $m^{52}$ represents an integer of 0 to 4 and preferably an integer of 0 to 2. $Y^{51}$ and $Y^{52}$ represent a single bond or a connection group. The connection group is not particularly limited, but is preferably a connection group having one of a carbon atom, a nitrogen atom, an oxygen atom, a sulfur atom, and a silicon atom. Specific examples thereof are described below but the connection group is not limited.

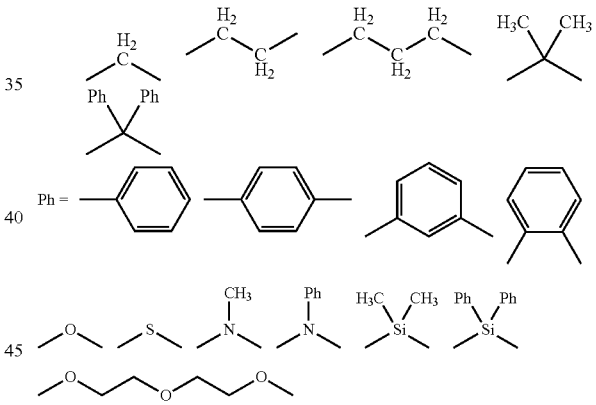

The connection groups may be substituted again and examples of the substituent group can include the substituent groups described with reference to $R^{11}$ in Formula (1). The substituent group is preferably one of an alkyl group, an aryl group, a heteroaryl group, an alkenyl group, an alkoxy group, an aryloxy group, an alkyl amino group, an aryl amino group, and a heterocyclic amino group, more preferably one of an alkyl group, an aryl group, a heteroaryl group, an alkoxy group, and an aryloxy group, and most preferably one of an alkyl group, an aryl group, and a heteroaryl group. $Y^{51}$ and $Y^{52}$ are preferably one of a single bond, an alkyl group, an aryl group, and a silyl group, and more preferably one of a single bond, a dimethyl methylene group, and an ethylene group. $n^{51}$ represents 0 or 1 and preferably 0.

Formula (Z-2) is described. $R^{92}$, $R^{93}$, $R^{94}$, $R^{95}$, $R^{96}$, $Y^{91}$, $Y^{92}$, $m^{91}$, $m^{92}$, $m^{93}$, and $n^{91}$ are the same as $R^{52}R^{53}$, $R^{54}$, $R^{55}R^{56}$, $Y^{51}$, $Y^{52}$, $m^{51}$, $m^{52}$, $m^{53}$, and $n^{51}$ of Formula (5) described above and preferable ranges thereof are also the same.

The compounds represented by Formulas (1) to (5) may be low-molecular compounds. The oligomer compounds and the polymer compounds (of which the weight-average molecular weight (in polystyrene equivalent)) are preferably in the range of 1,000 to 5,000,000, more preferably in the range of 2,000 to 1,000,000, and most preferably in the range of 3,000 to 100,000). In case of the polymer compounds, the structures represented by Formulas (1) to (5) may be included in the main chain of a polymer or in the side chain of the polymer. The polymer compounds may be a homo-polymer compound or a copolymer. The compounds according to the present invention is preferably is a low-molecular compound.

Examples of the compounds according to the present invention are described below, but the present invention is not limited to the examples.

Compound (1)

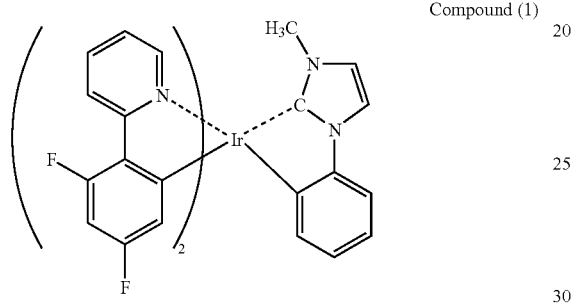

Compound (2)

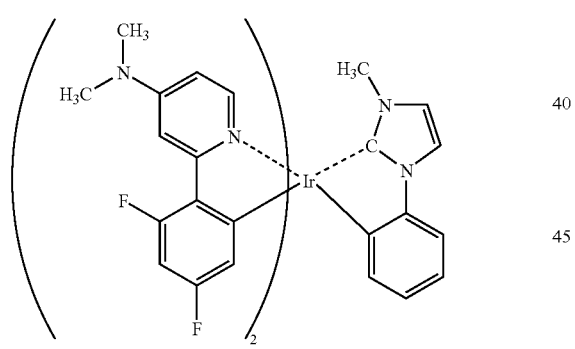

Compound (3)

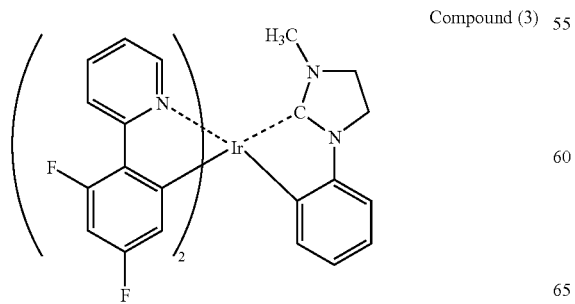

Compound (4)

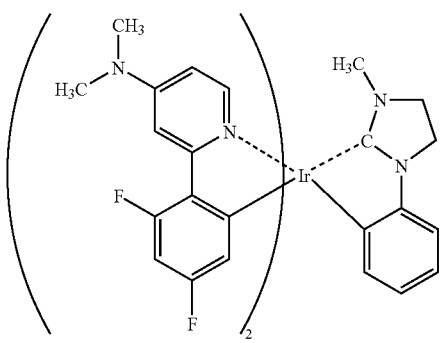

Compound (5)

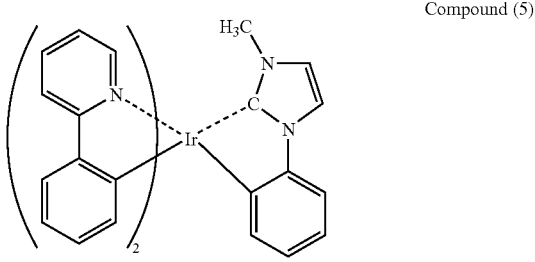

Compound (6)

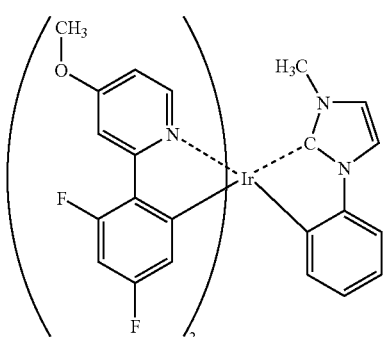

Compound (7)

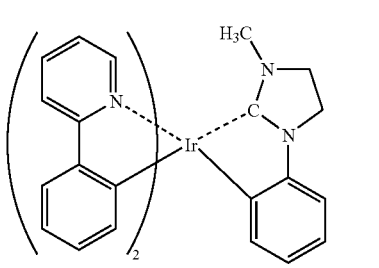

Compound (8)

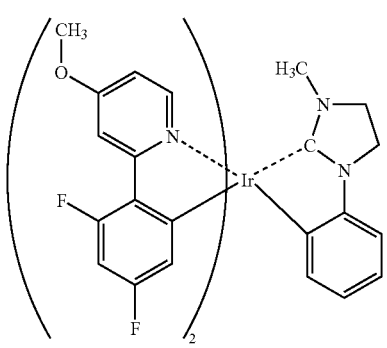

Compound (9)
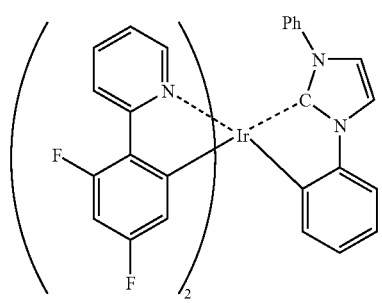
Compound (10)
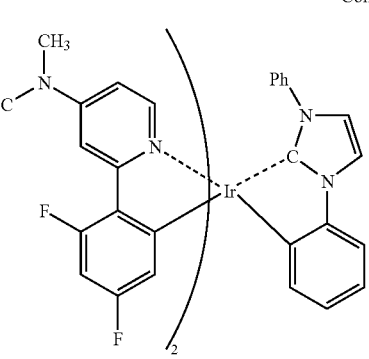
Compound (11)
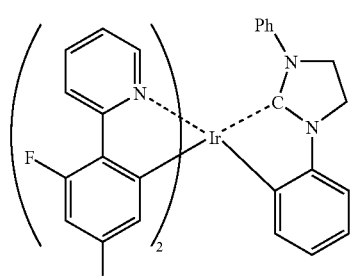
Compound (12)
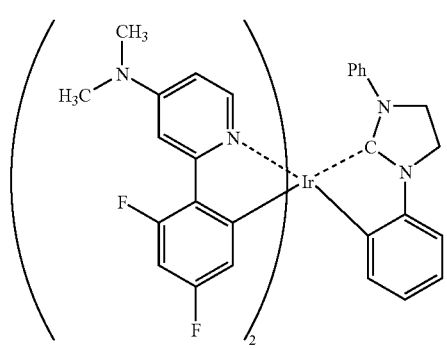
Compound (13)
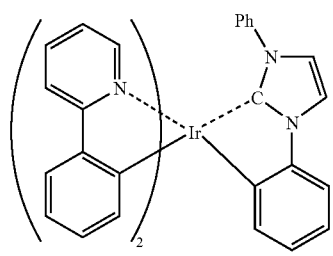
Compound (14)
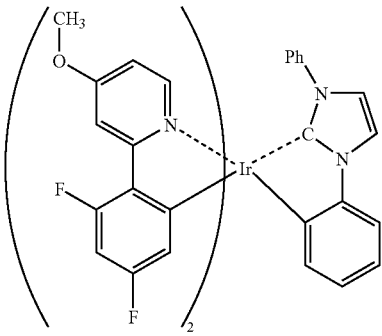
Compound (15)
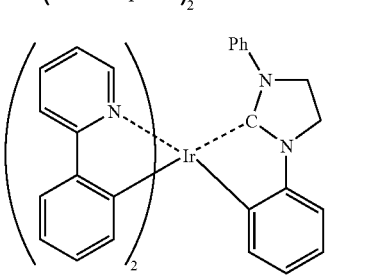
Compound (16)
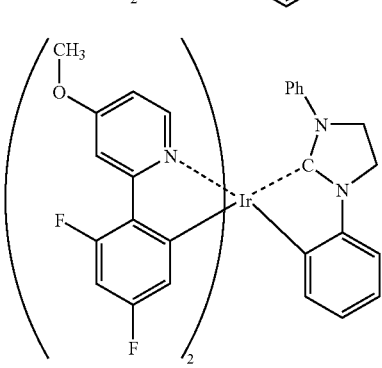
Compound (17)
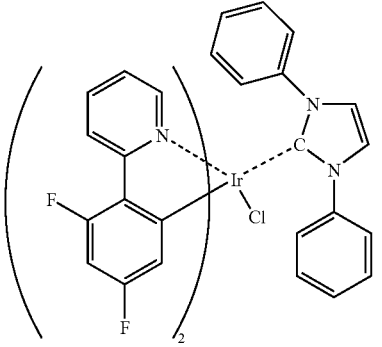
Compound (18)
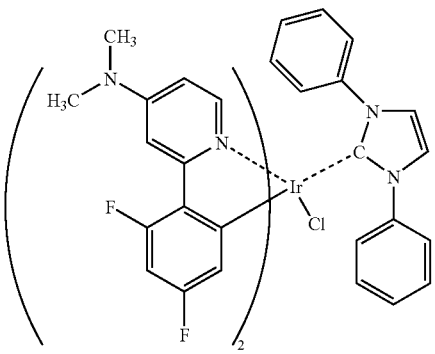

Compound (19)
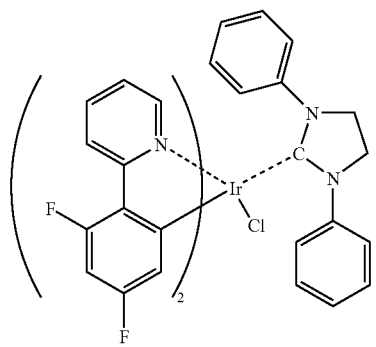
Compound (20)
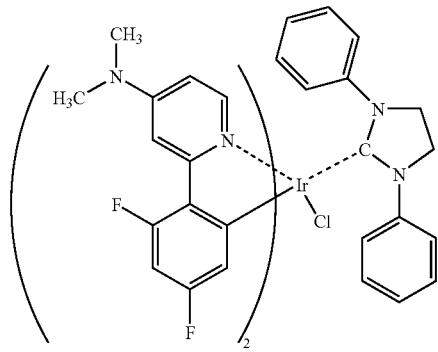
Compound (21)
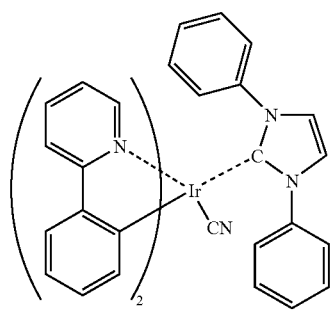
Compound (22)
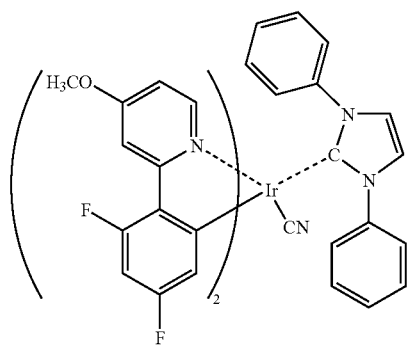
Compound (23)
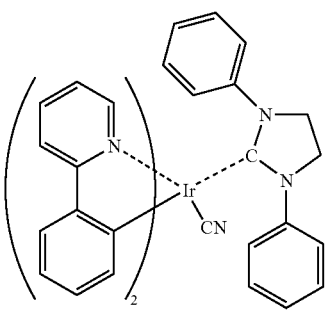
Compound (24)
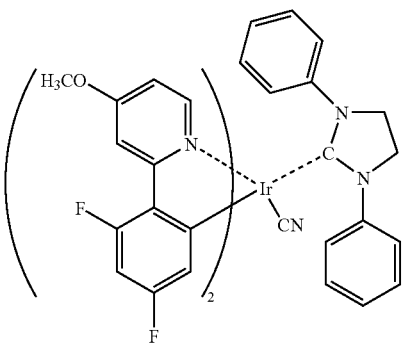
Compound (25)
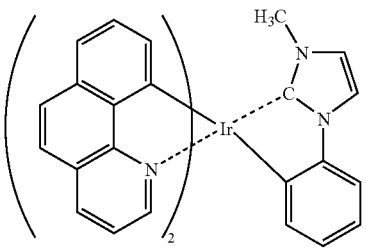
Compound (26)
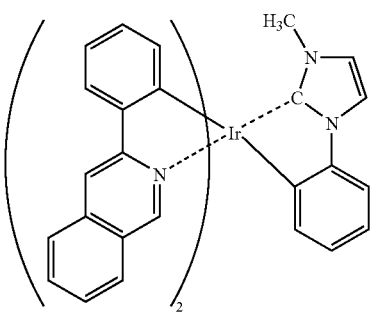
Compound (27)
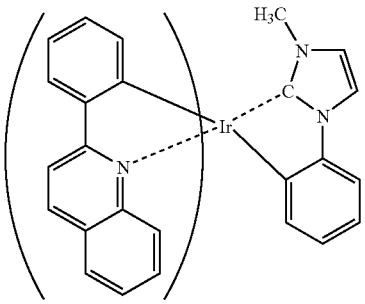

Compound (28)
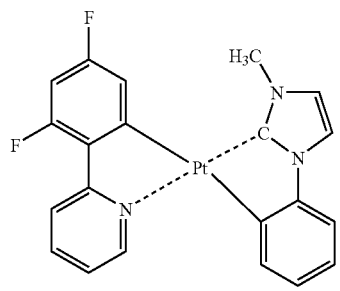
Compound (29)
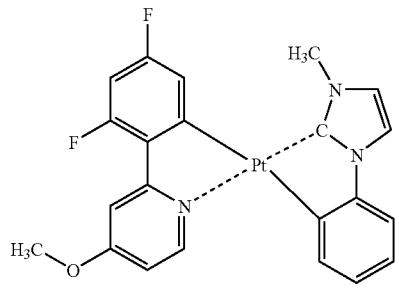
Compound (30)
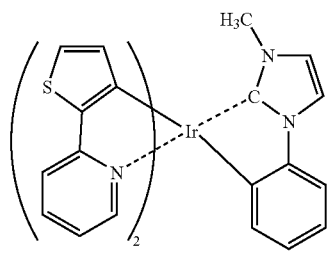
Compound (31)
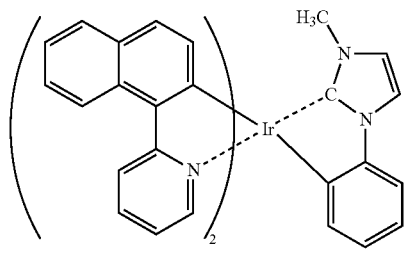
Compound (32)
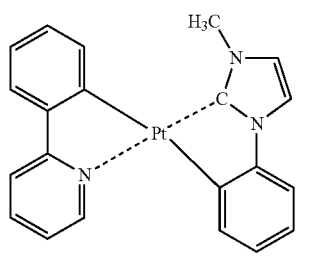
Compound (33)
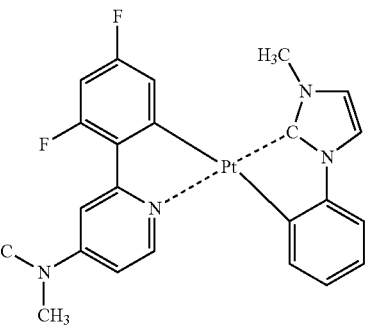
Compound (34)
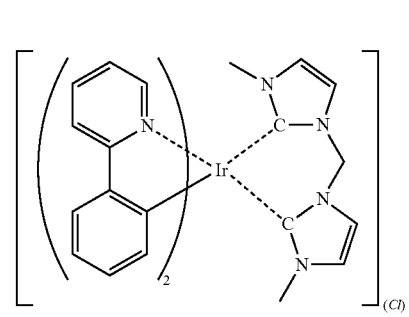
Compound (35)
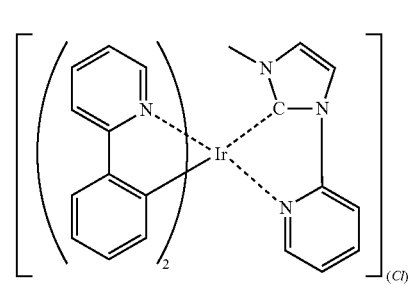
Compound (36)
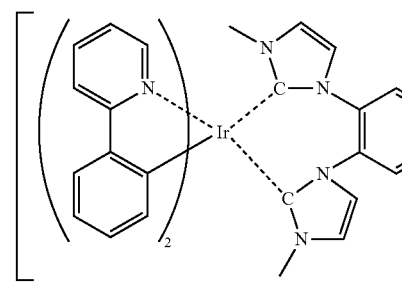
Compound (37)
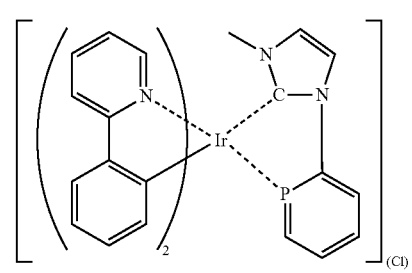

Compound (38)
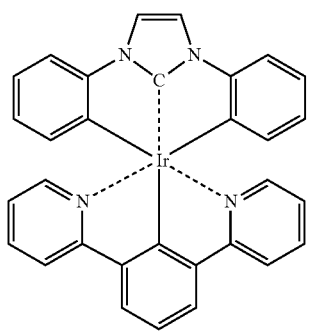
Compound (39)
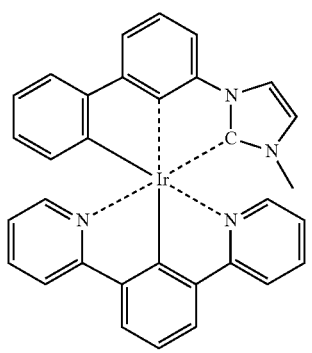
Compound (40)
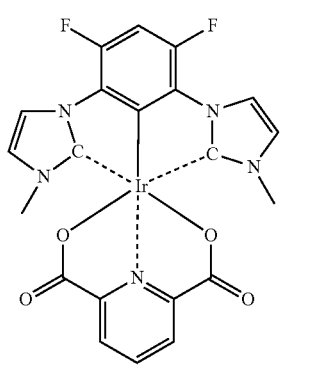
Compound (41)
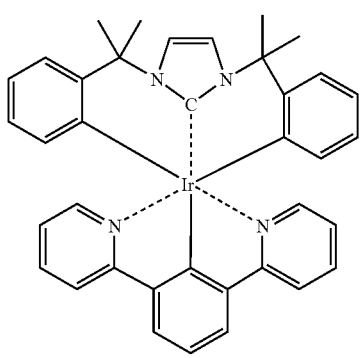
Compound (42)
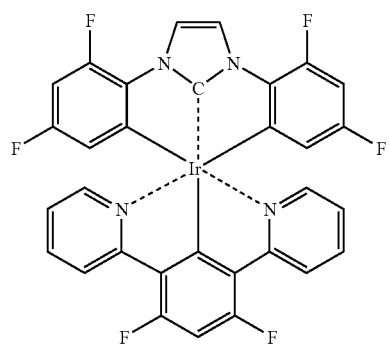
Compound (43)
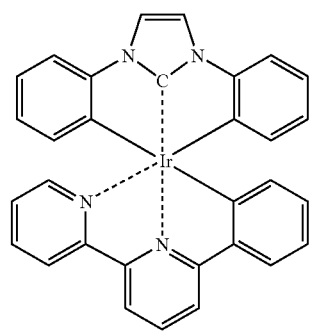
Compound (44)
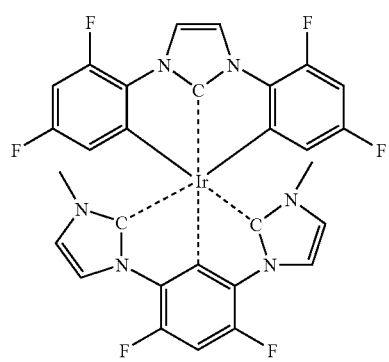
Compound (45)
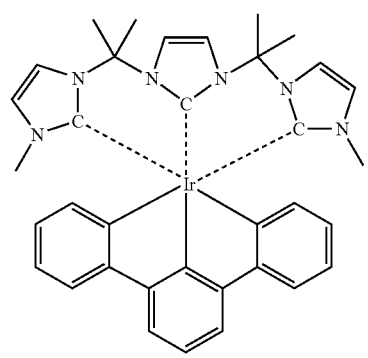
Compound (46)
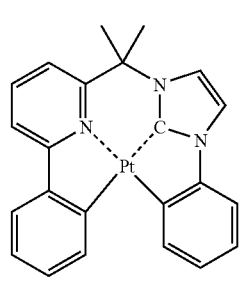

Compound (47)
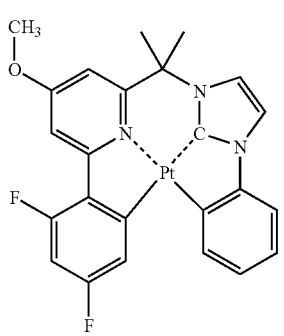
Compound (48)
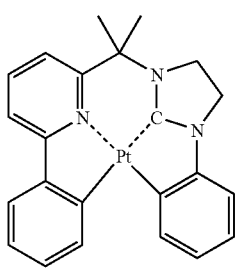
Compound (49)
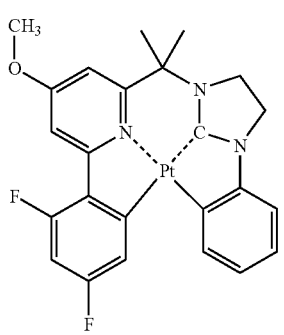
Compound (50)
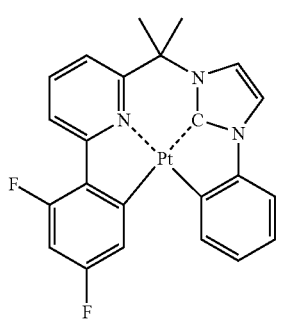
Compound (51)
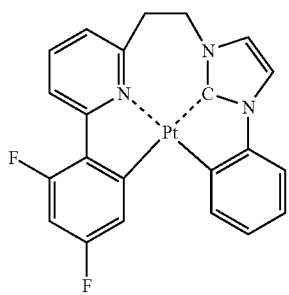
Compound (52)
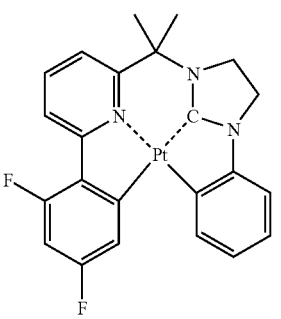
Compound (53)
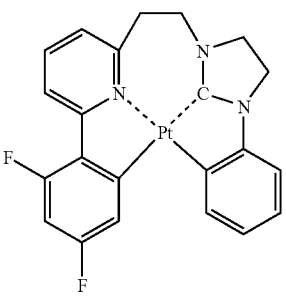
Compound (54)
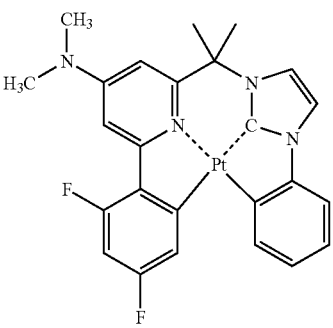
Compound (55)
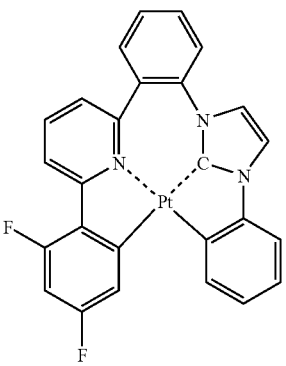
Compound (56)
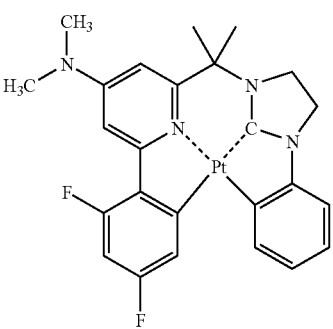

Compound (57)
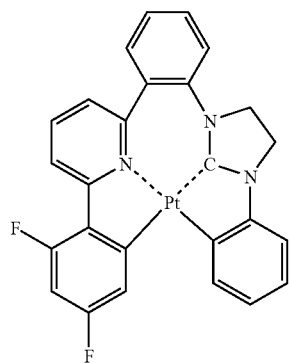
Compound (58)
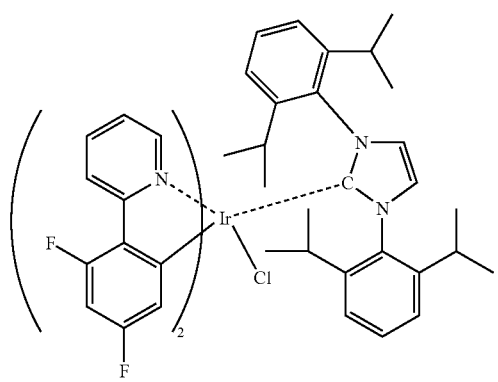
Compound (59)
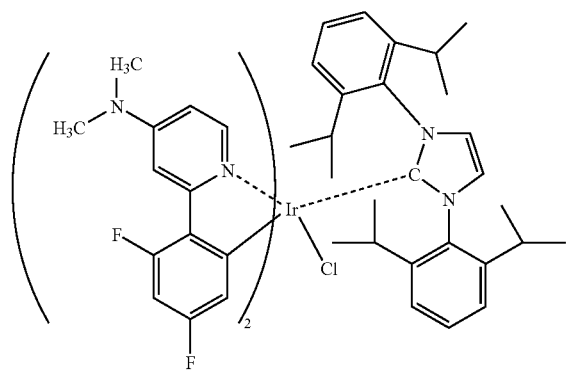
Compound (60)
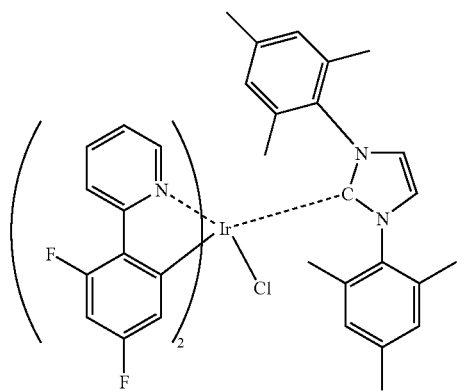
Compound (61)
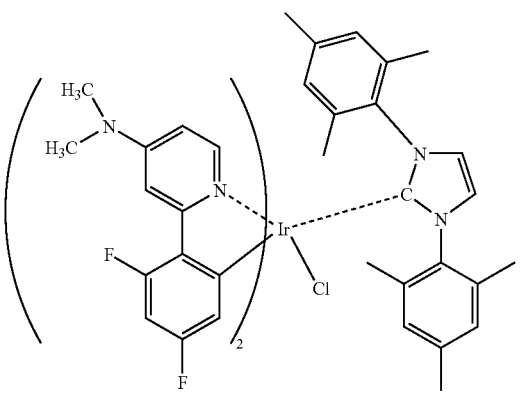
Compound (62)
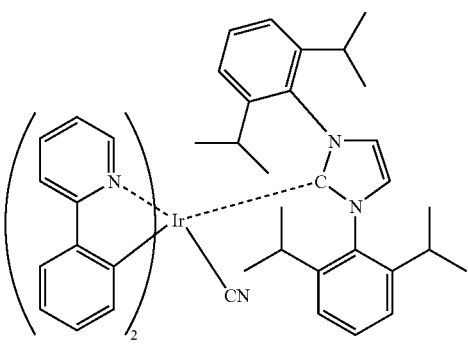
Compound (63)
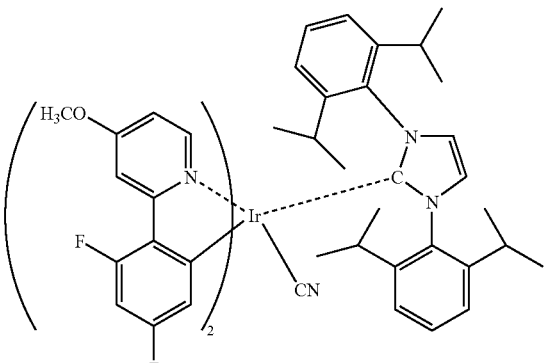
Compound (64)
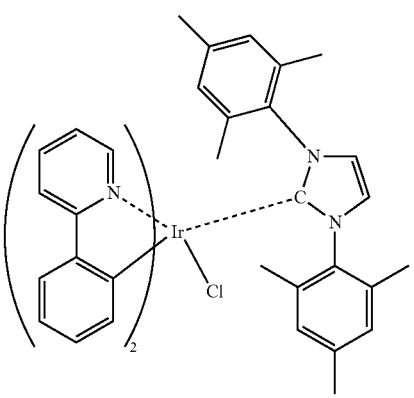

Compound (65)
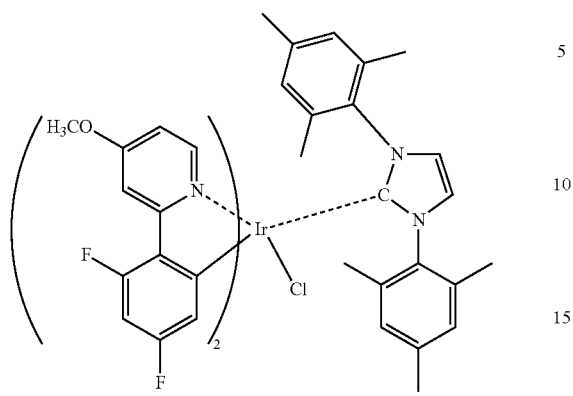
Compound (66)
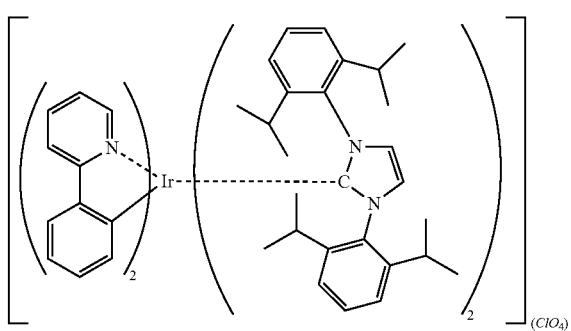
(ClO₄)
Compound (67)
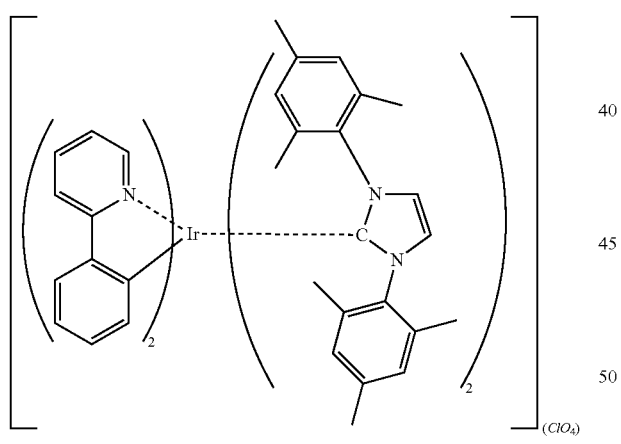
(ClO₄)
Compound (68)
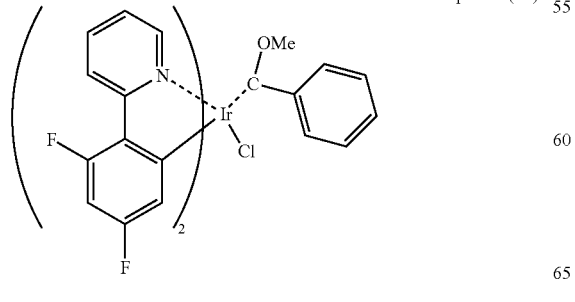
Compound (69)
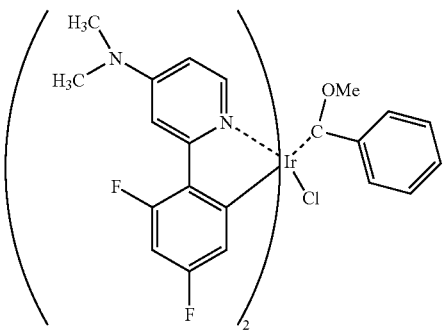
Compound (70)
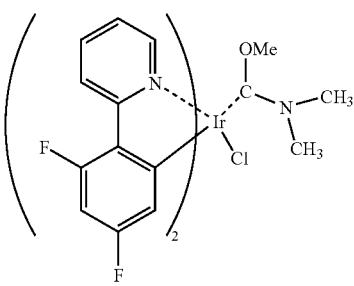
Compound (71)
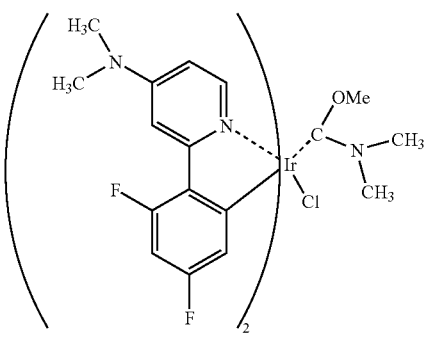
Compound (72)
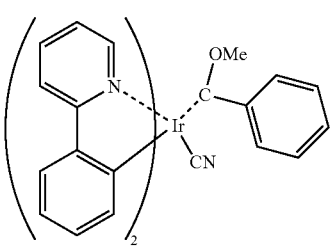
Compound (73)
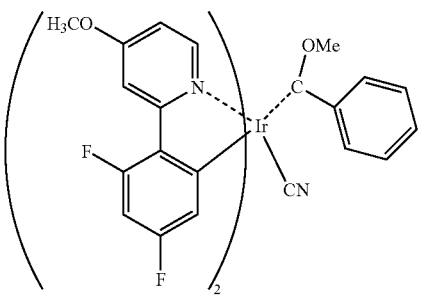

Compound (74)
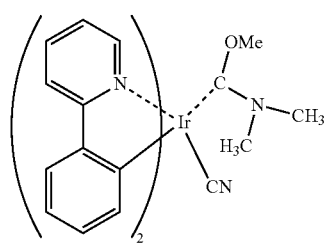
Compound (75)
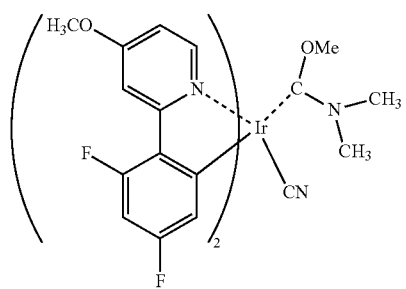
Compound (76)
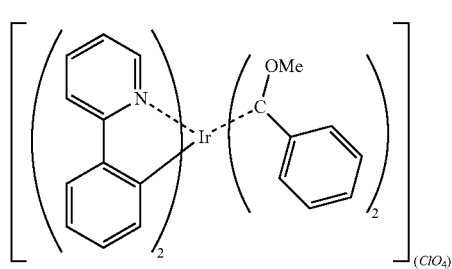
Compound (77)
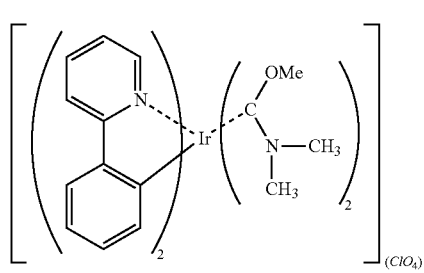
Compound (78)
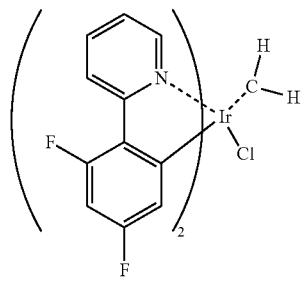
Compound (79)
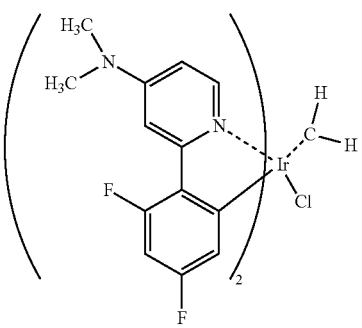
Compound (80)
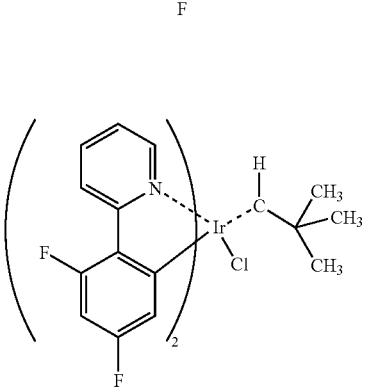
Compound (81)
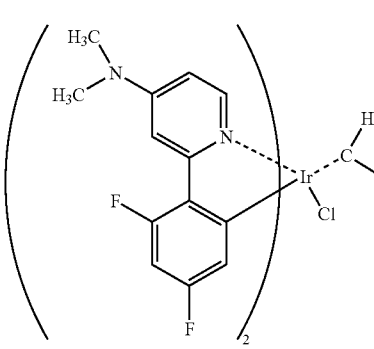
Compound (82)
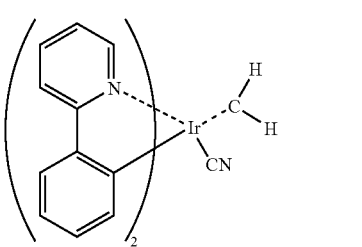
Compound (83)
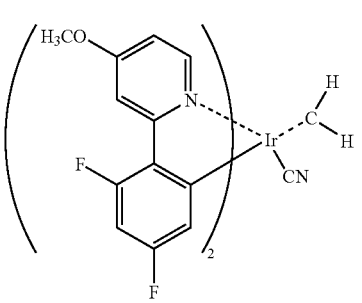

Compound (84)
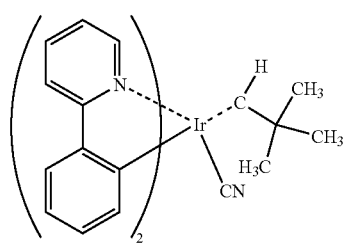
Compound (85)
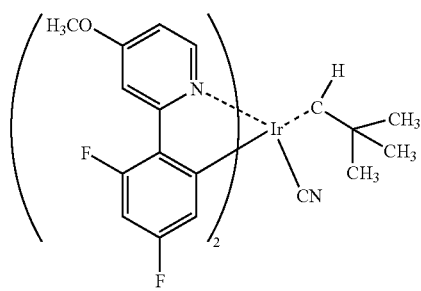
Compound (86)
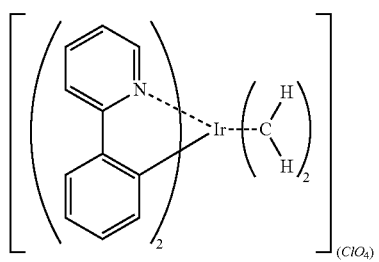
Compound (87)
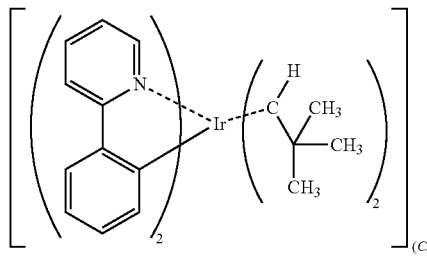
Compound (88)
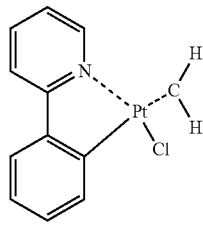
Compound (89)
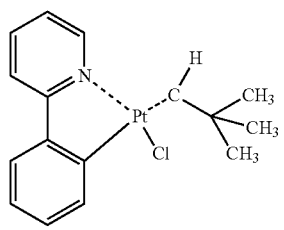
Compound (90)
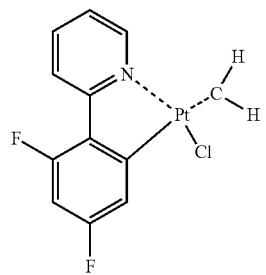
Compound (91)
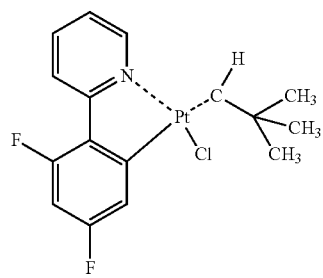
Compound (92)
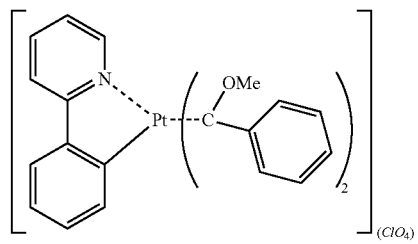
Compound (93)
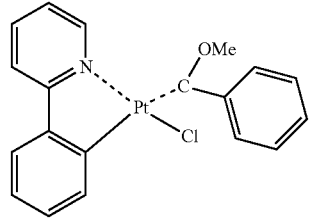
Compound (94)
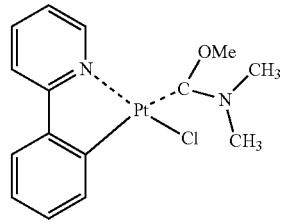
Compound (95)
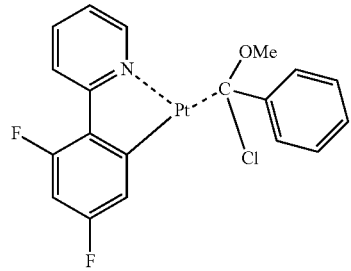

-continued
Compound (96)
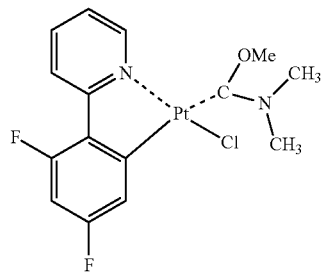
Compound (97)
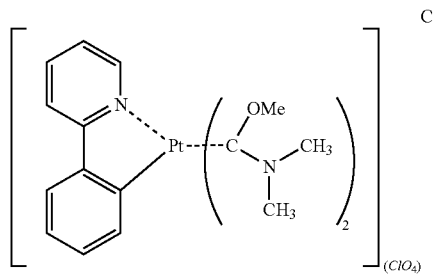
Compound (98)
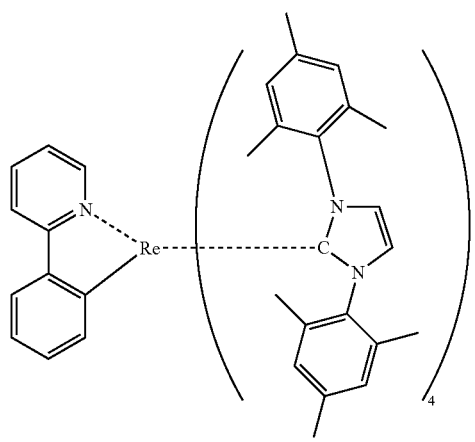
Compound (99)
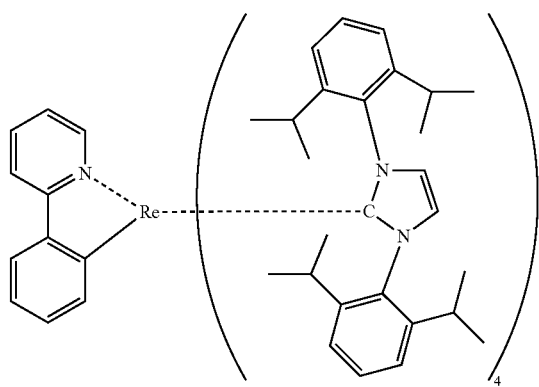
-continued
Compound (100)
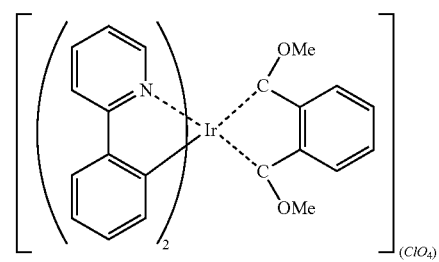
Compound (101)
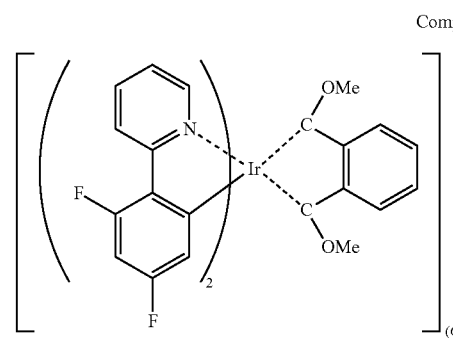
Compound (102)
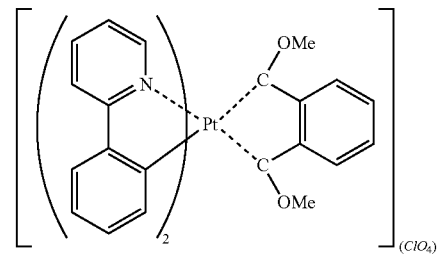
Compound (103)
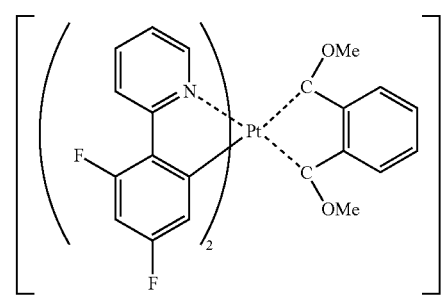
Compound (104)
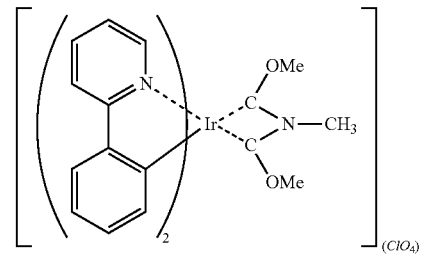

Compound (105)
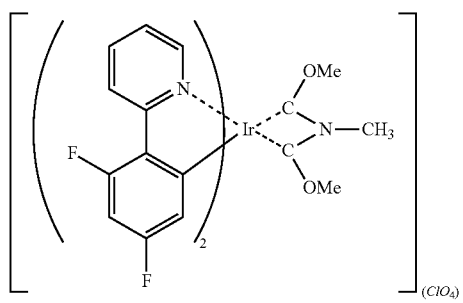
Compound (106)
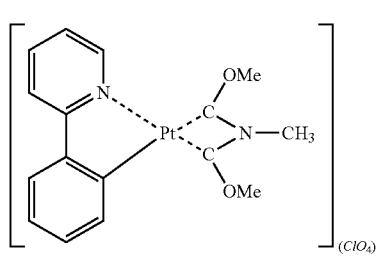
Compound (107)
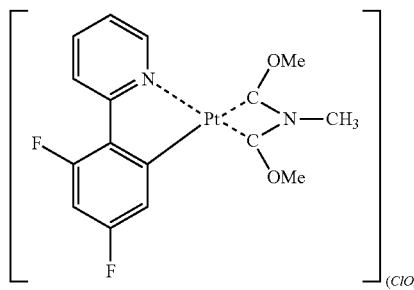
Compound (108)
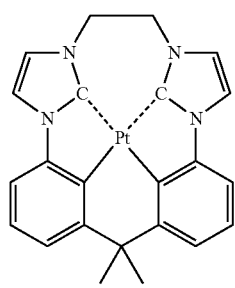
Compound (109)
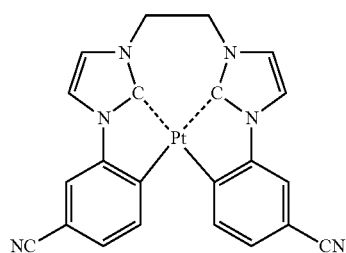
Compound (110)
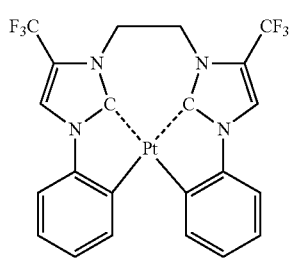
Compound (111)
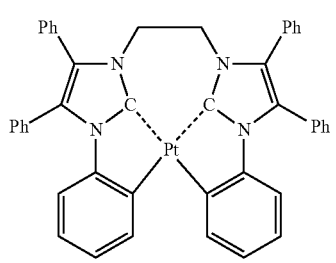
Compound (112)
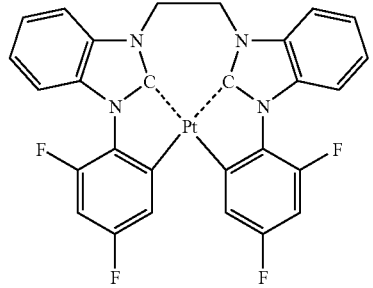
Compound (113)
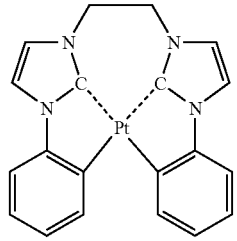
Compound (114)
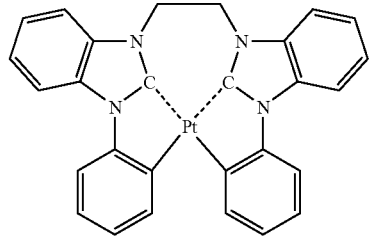
Compound (115)
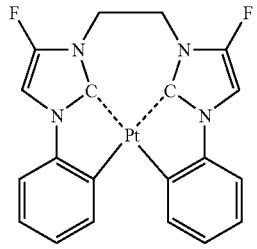

Compound (116)
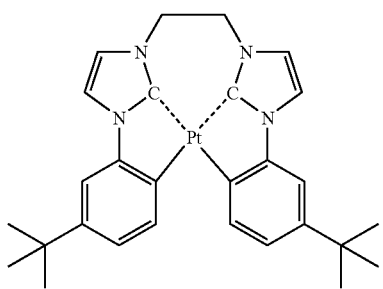
Compound (117)
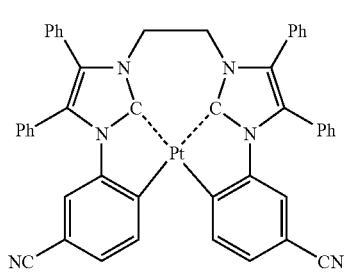
Compound (118)
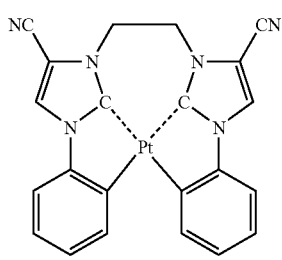
Compound (119)
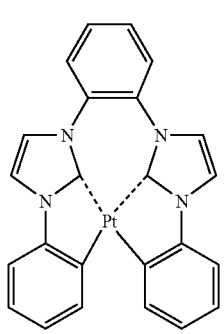
Compound (120)
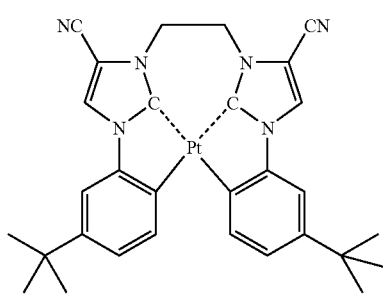
Compound (121)
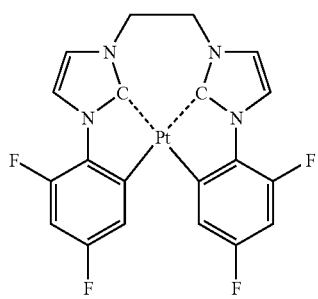
Compound (122)
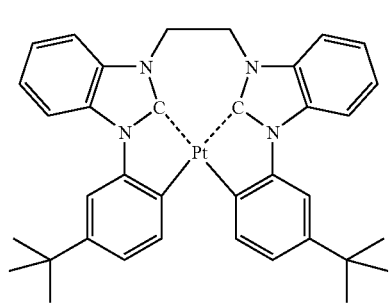
Compound (123)
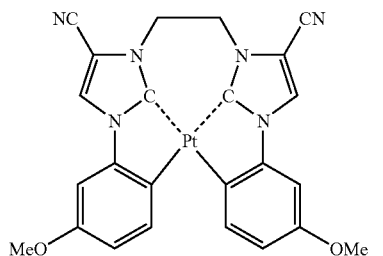
Compound (124)
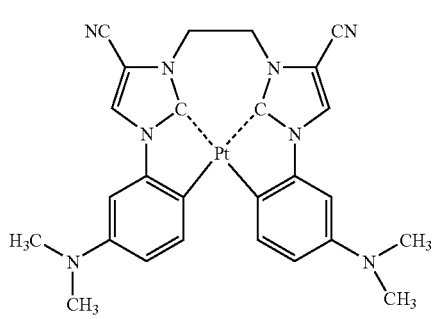
Compound (125)
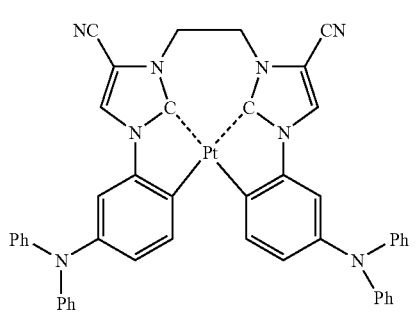

Compound (126)
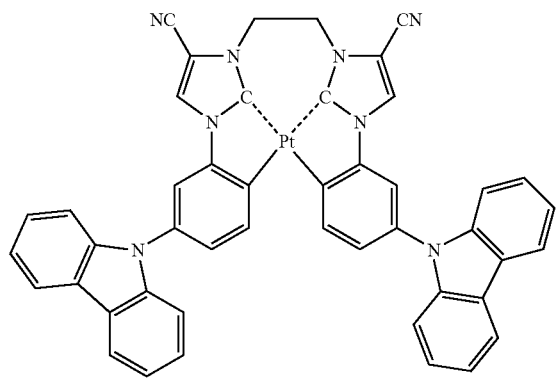
Compound (127)
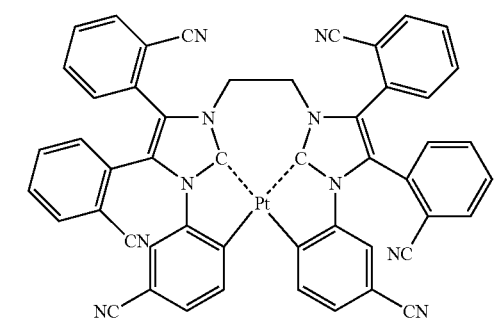
Compound (128)
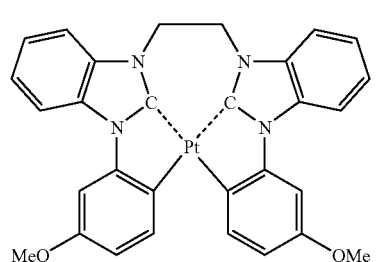
Compound (129)
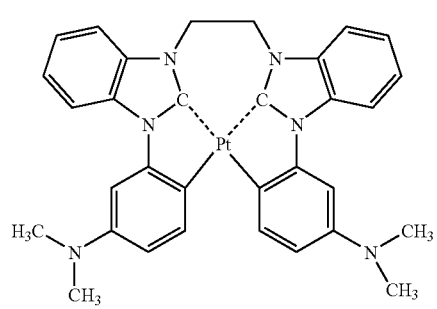
Compound (130)
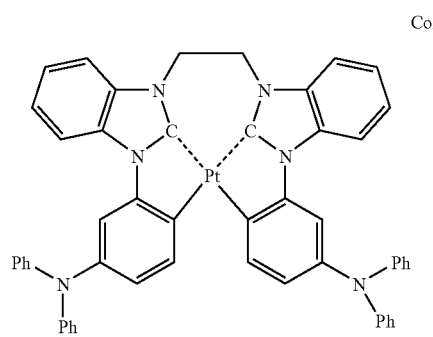
Compound (131)
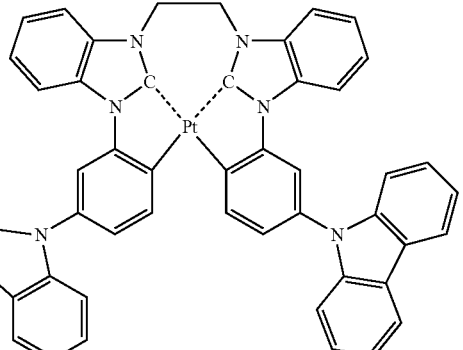
Compound (132)
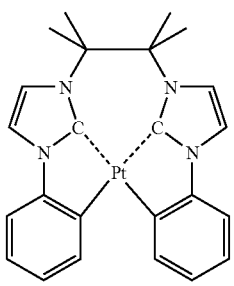
Compound (133)
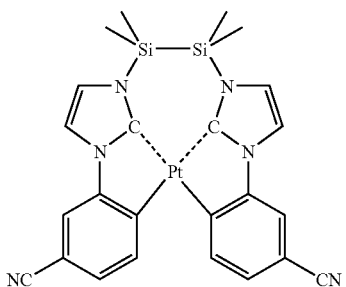
Compound (134)
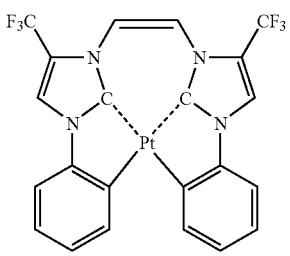
Compound (135)
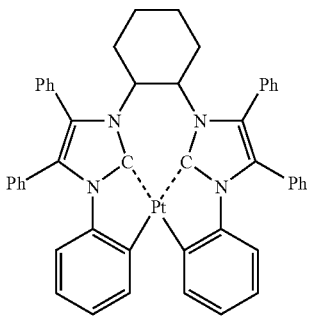

Compound (136)
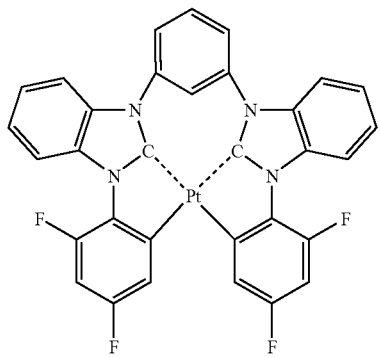
Compound (137)
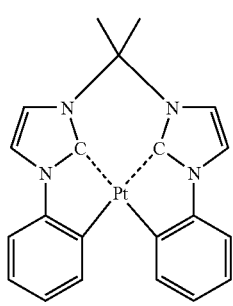
Compound (138)
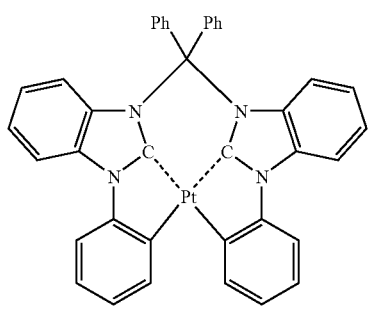
Compound (139)
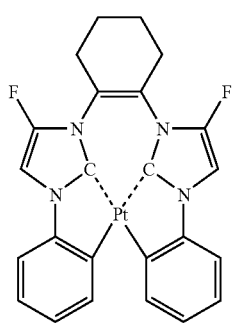
Compound (140)
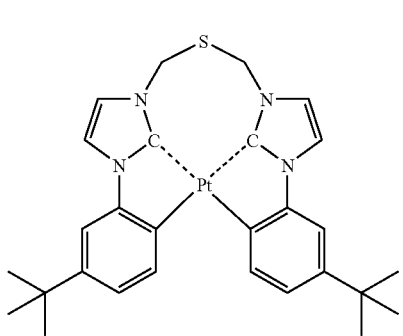
Compound (141)
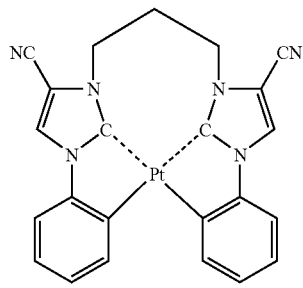
Formula (142)
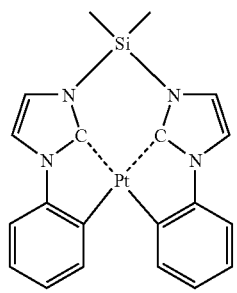
Formula (143)
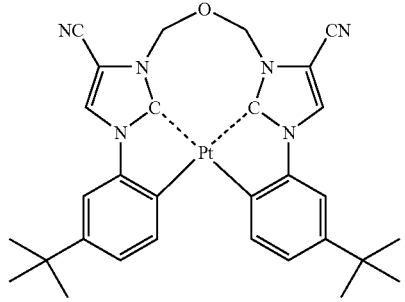
Formula (144)
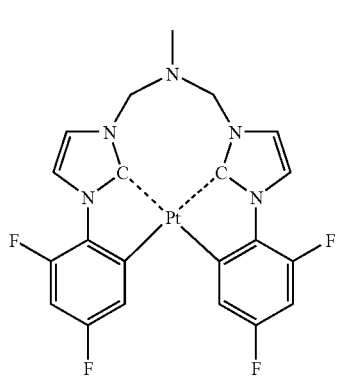
Formula (145)
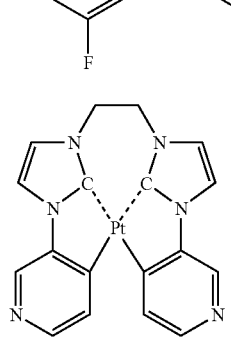

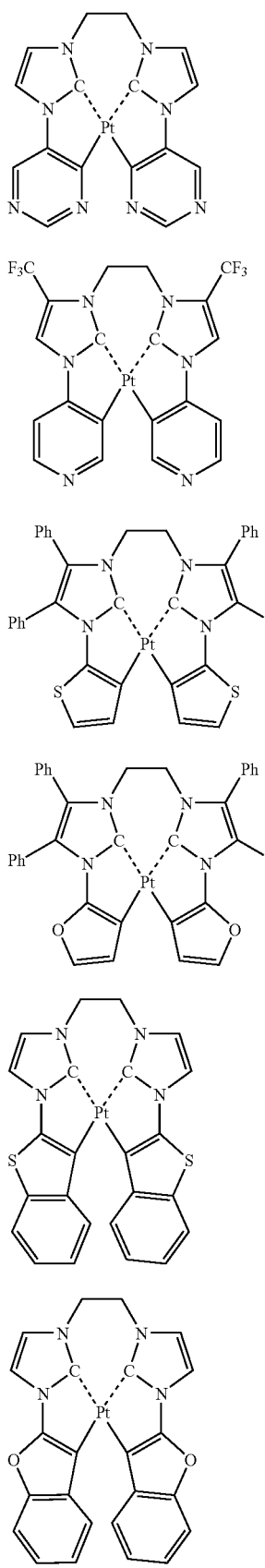

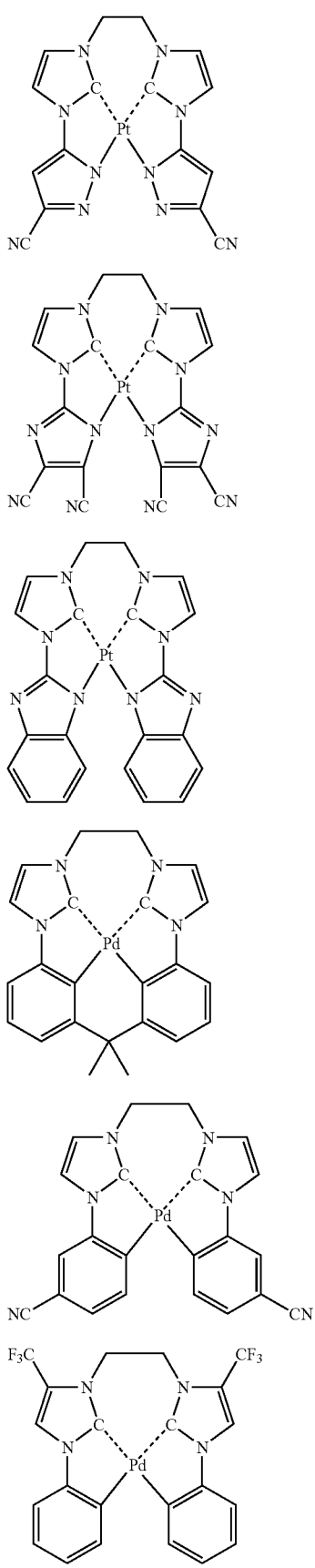
Compound (157)
Compound (158)
Compound (159)
Compound (160)
Compound (161)
Compound (162)
Compound (163)
Compound (164)
Compound (165)
Compound (166)
Compound (167)
Compound (168)

Compound (169)
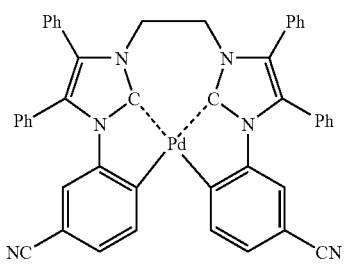
Compound (170)
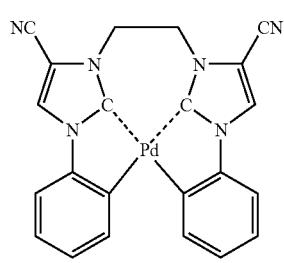
Compound (171)
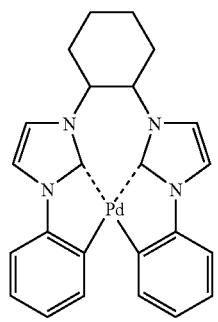
Compound (172)
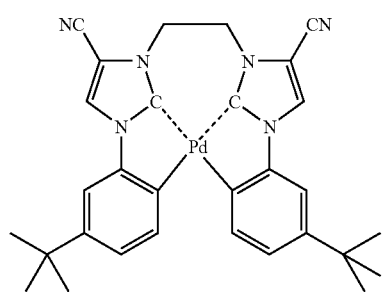
Compound (173)
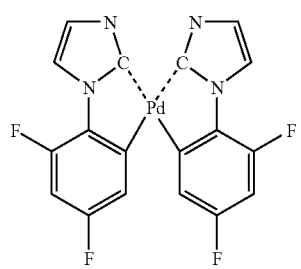
Compound (174)
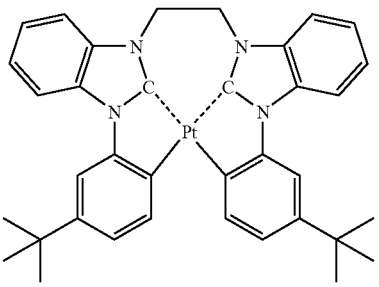
Compound (175)
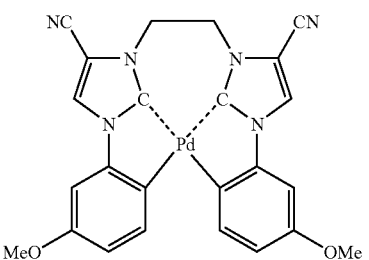
Compound (176)
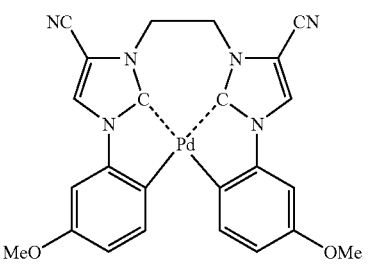
Compound (177)
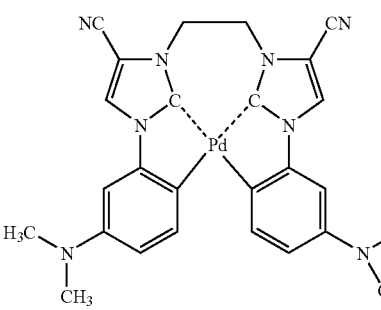
Compound (178)
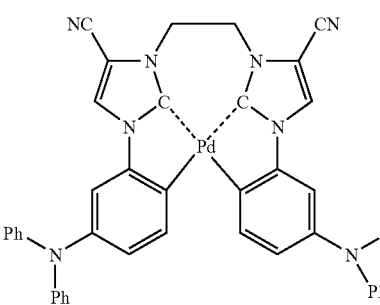
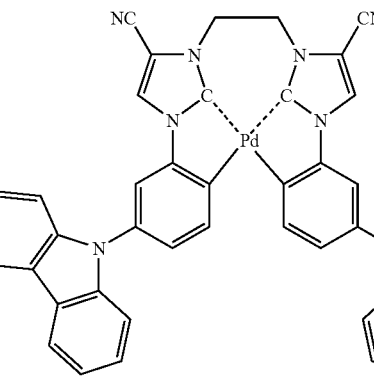

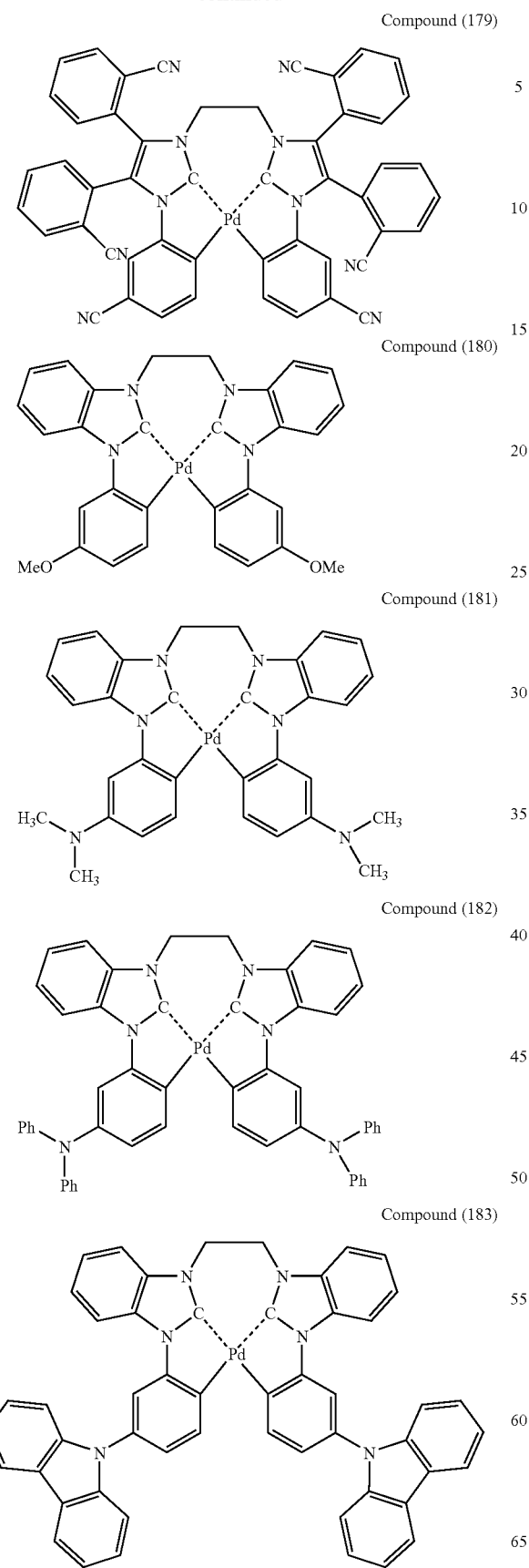
Compound (179)
Compound (180)
Compound (181)
Compound (182)
Compound (183)
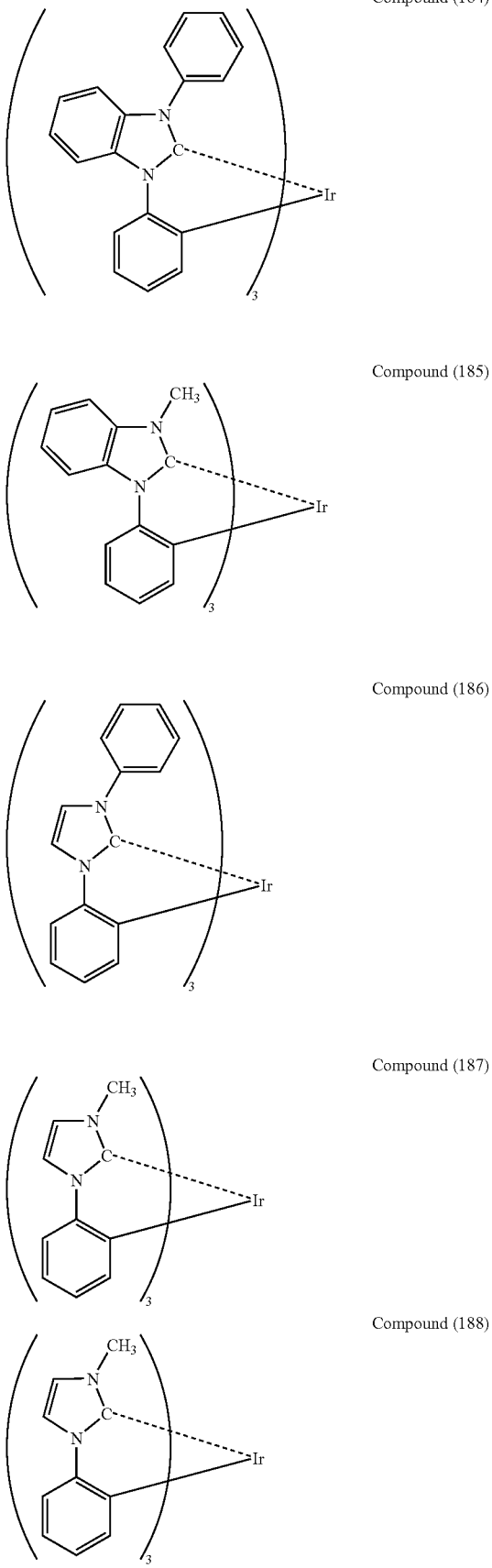
Compound (184)
Compound (185)
Compound (186)
Compound (187)
Compound (188)

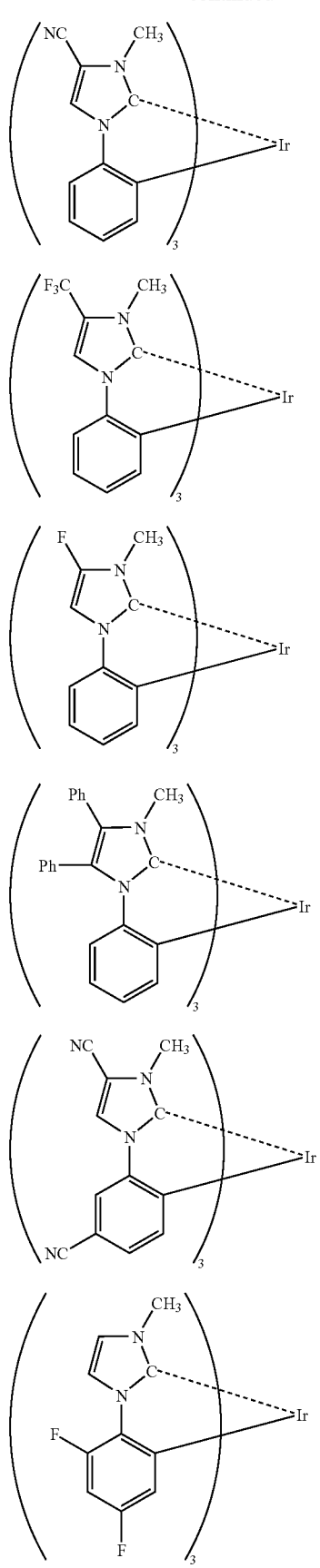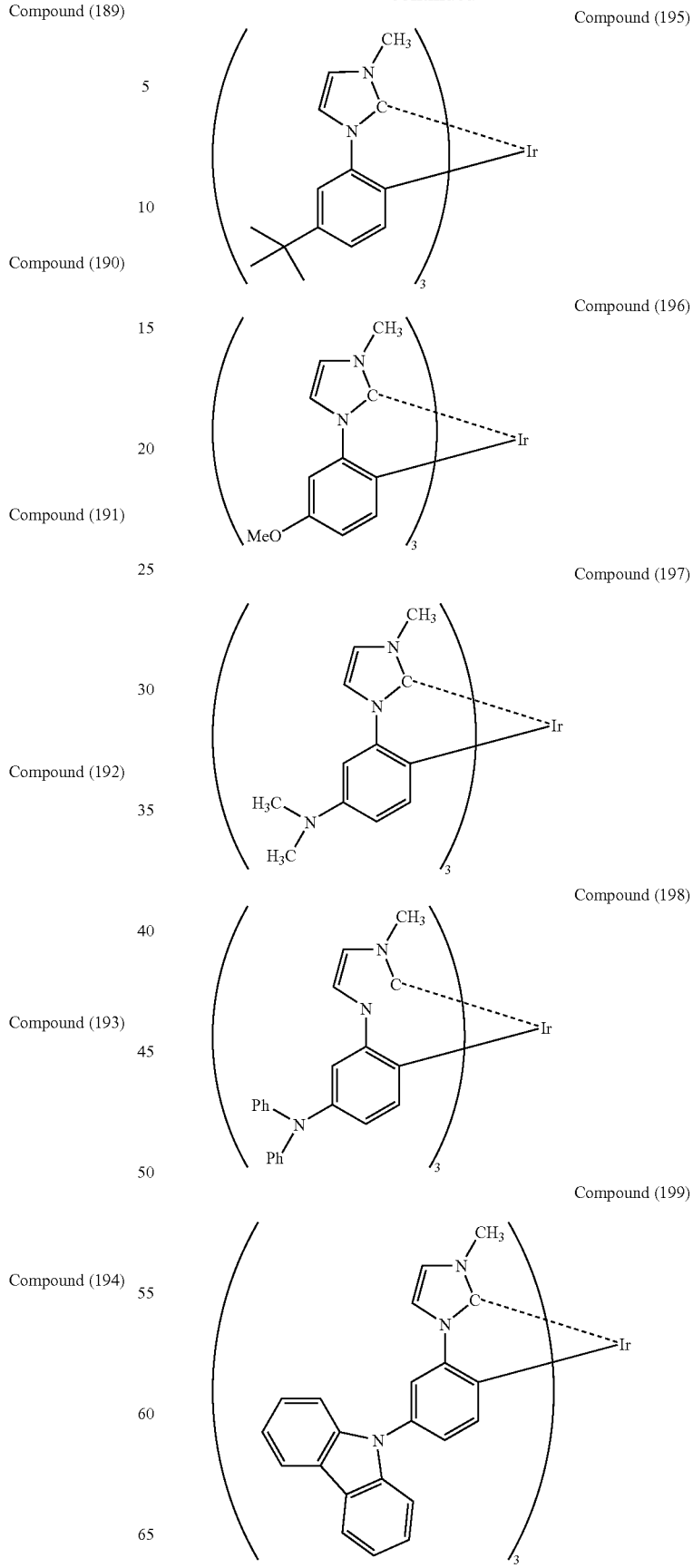

Compound (200)
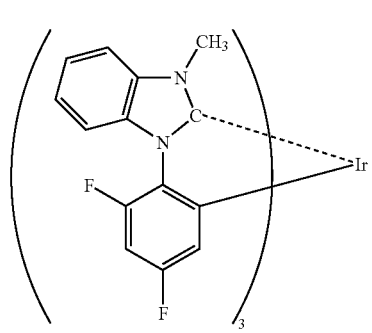
Compound (201)
Compound (202)
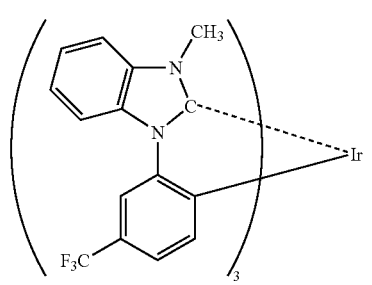
Compound (203)
Compound (204)
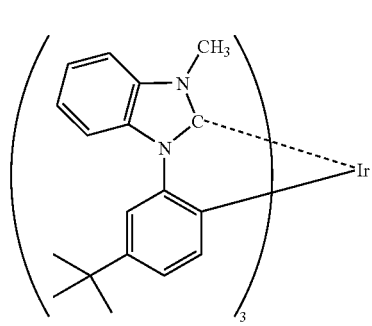
Compound (205)
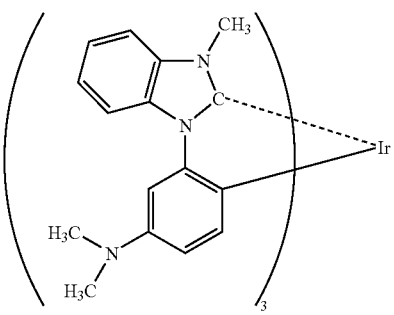
Compound (206)
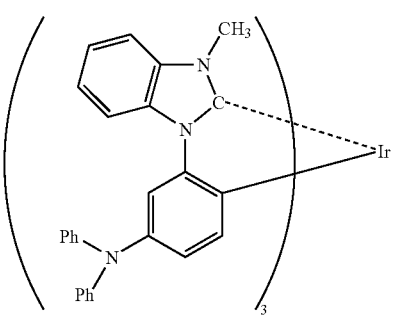
Compound (207)
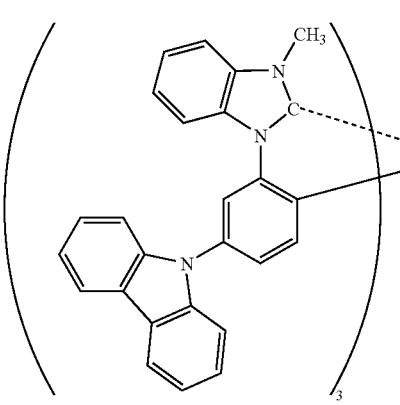
Compound (208)
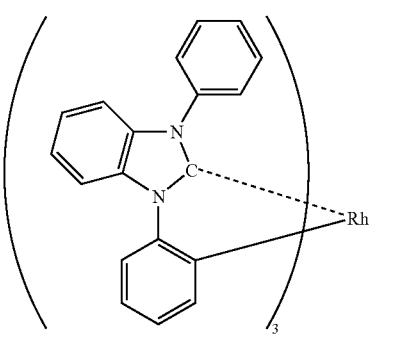

Compound (209)
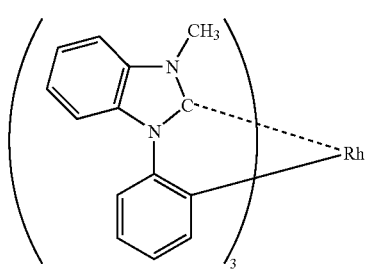
Compound (210)
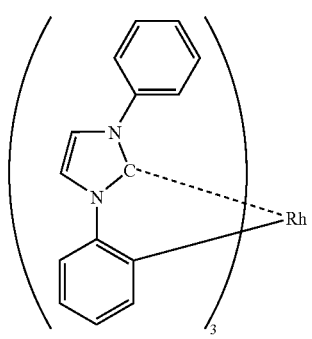
Compound (211)
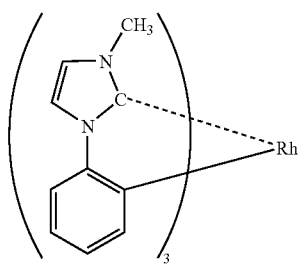
Compound (212)
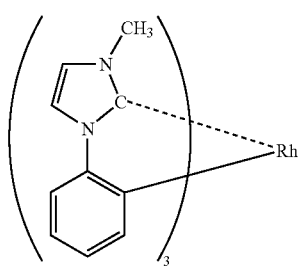
Compound (213)
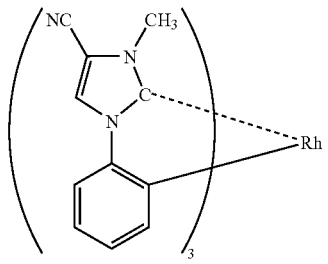
Compound (214)
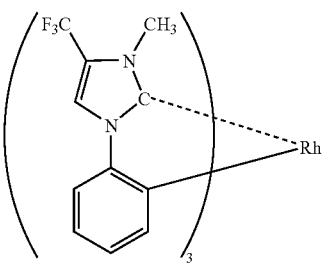
Compound (215)
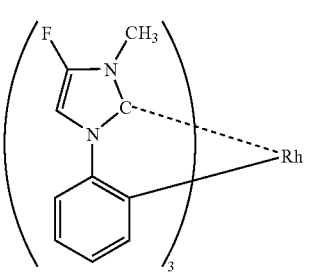
Compound (216)
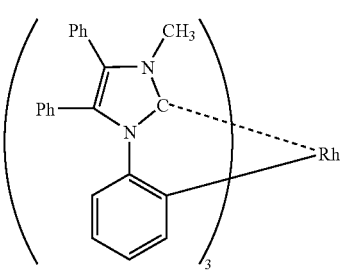
Compound (217)
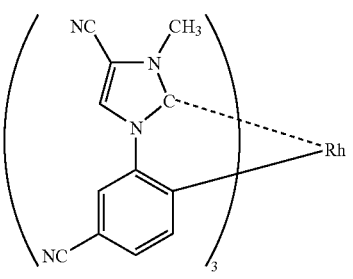
Compound (218)
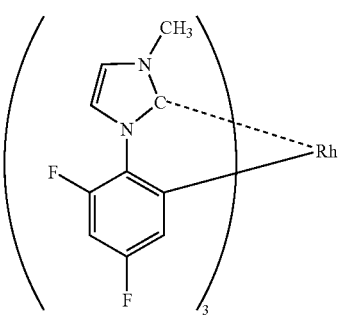

Compound (219)
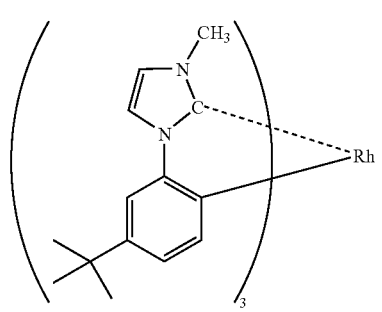
Compound (220)
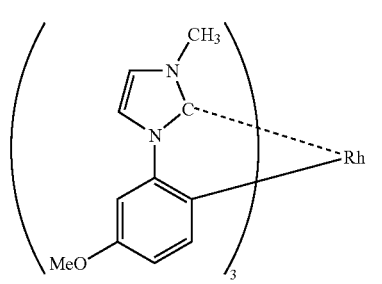
Compound (221)
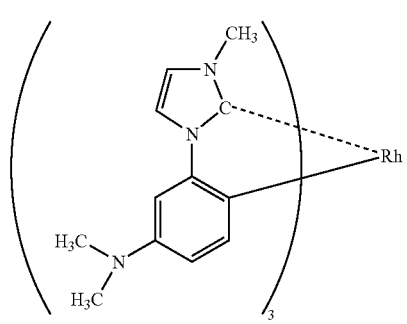
Compound (222)
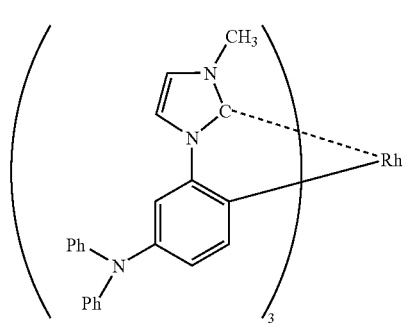
Compound (223)
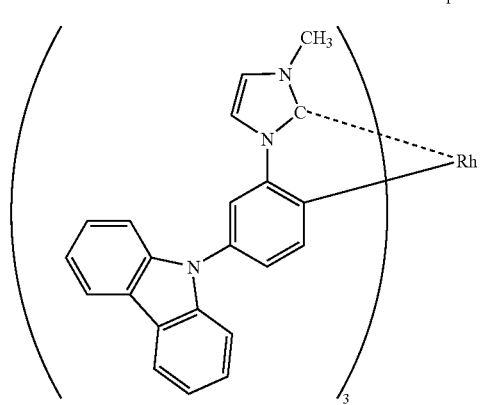
Compound (224)
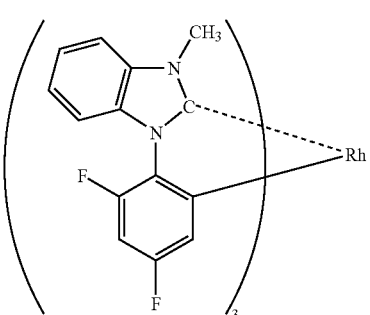
Compound (225)
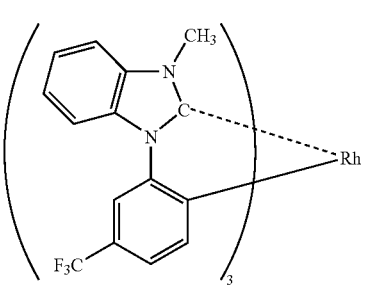
Compound (226)
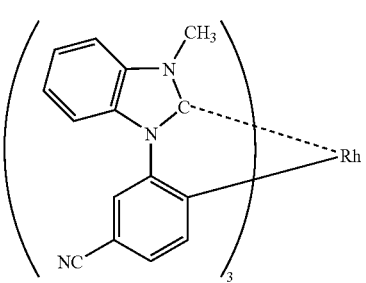
Compound (227)
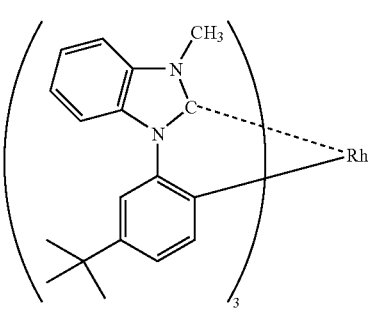
Compound (228)
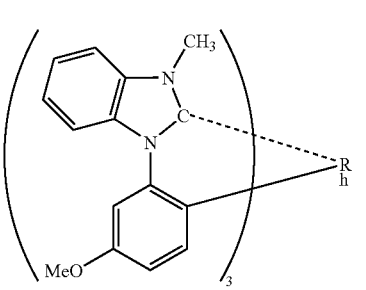

Compound (229)
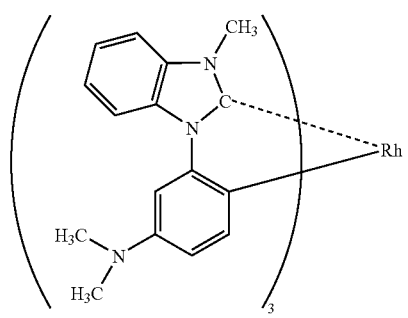
Compound (230)
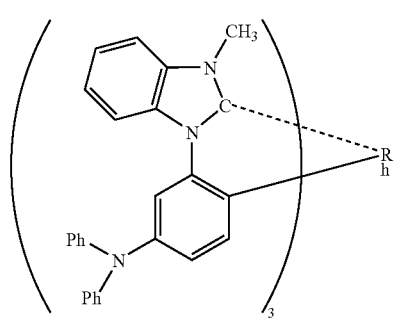
Compound (231)
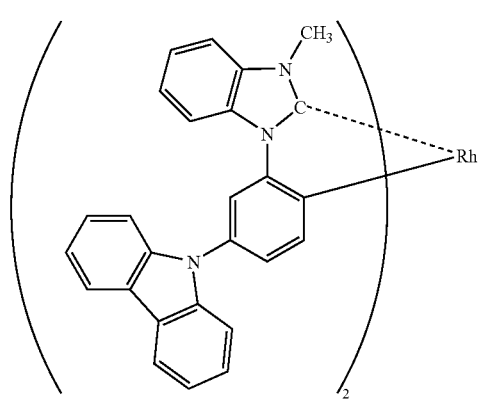
Compound (232)
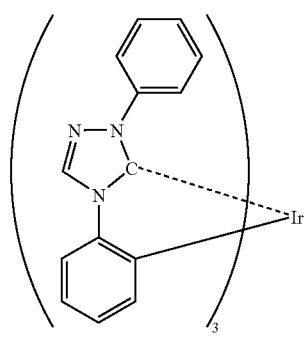
Compound (233)
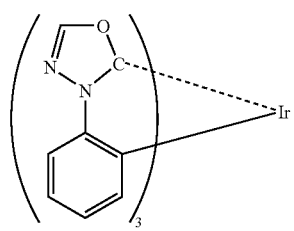
Compound (234)
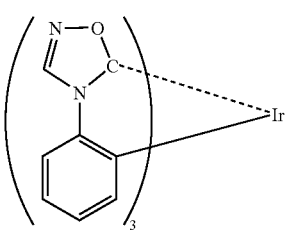
Compound (235)
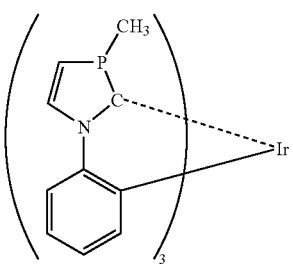
Compound (236)
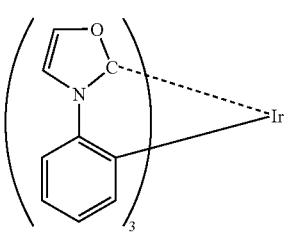
Compound (237)
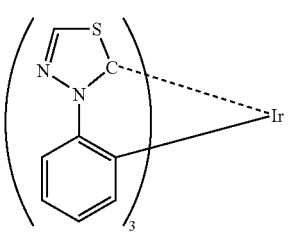
Compound (238)
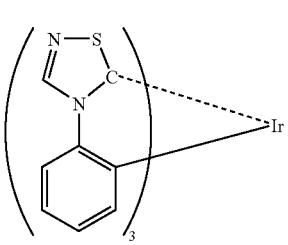
Compound (239)
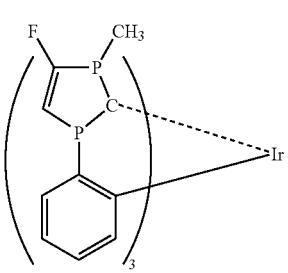

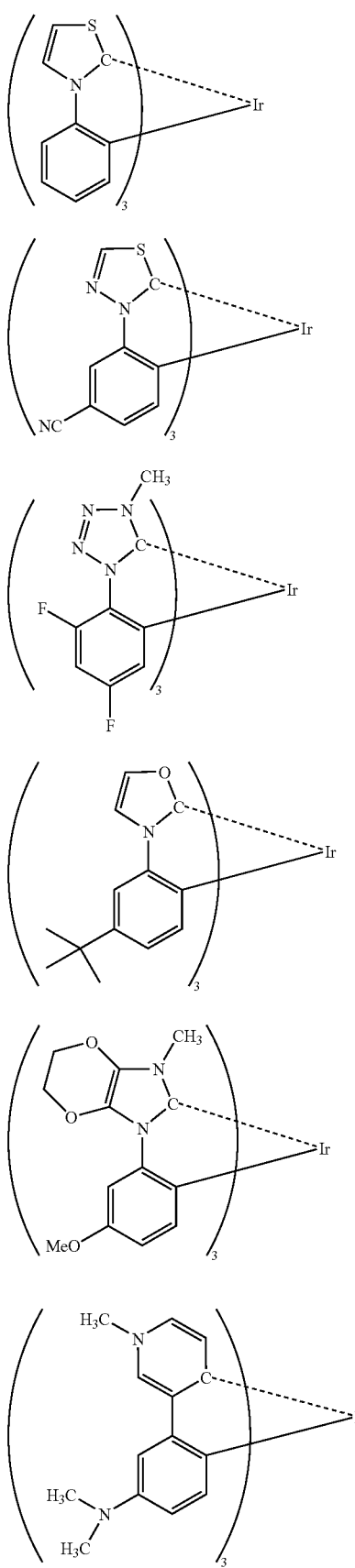
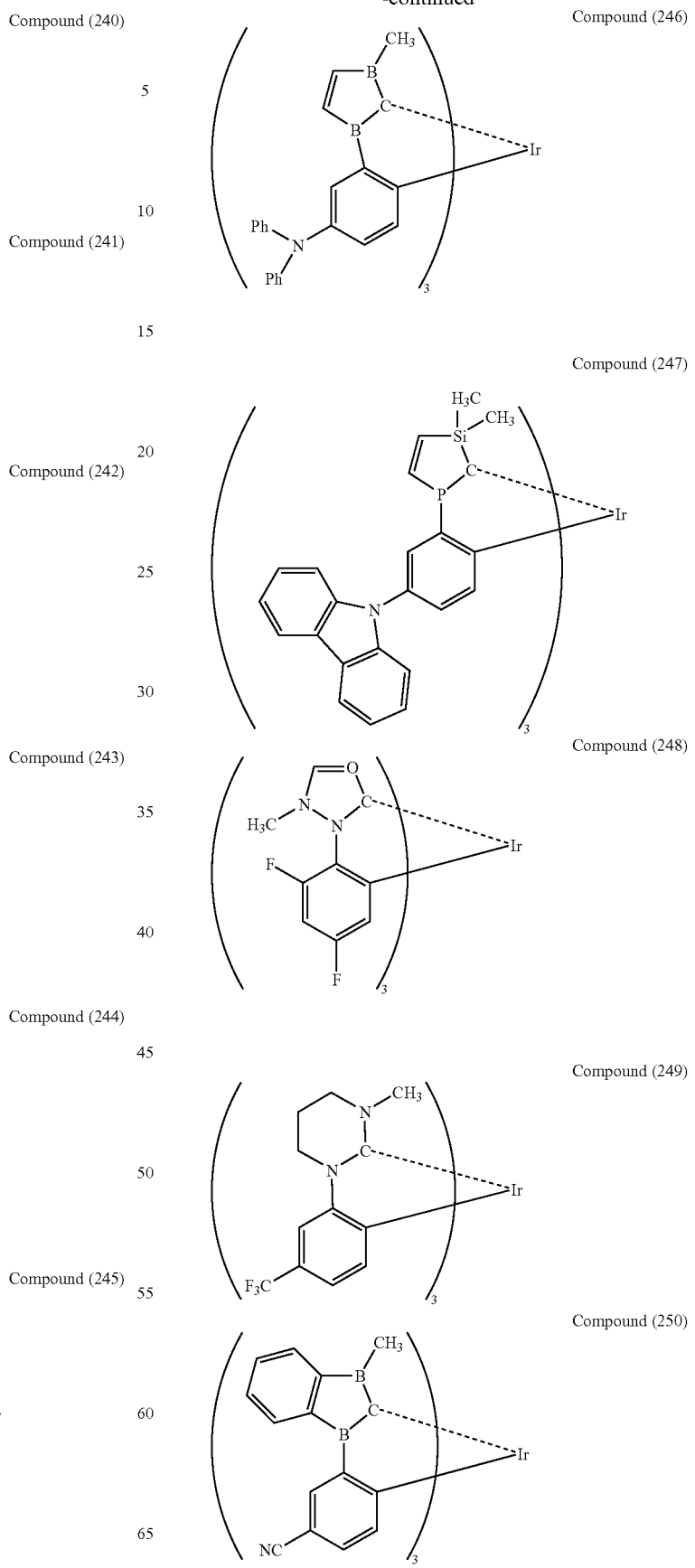

Compound (251)
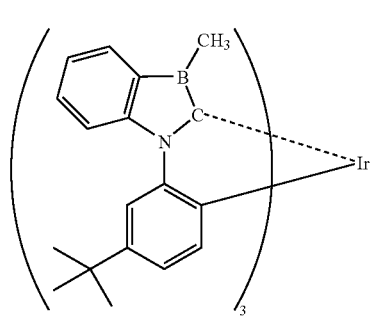
Compound (252)
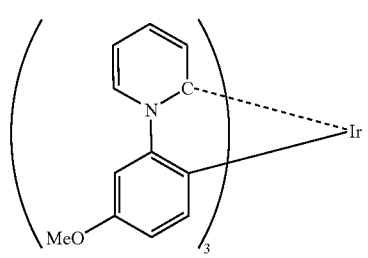
Compound (253)
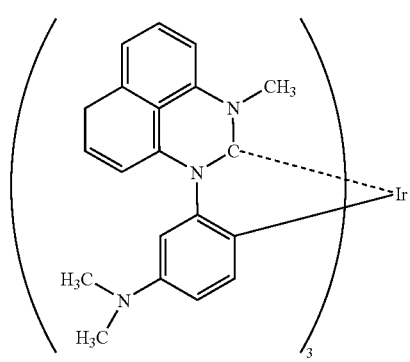
Compound (254)
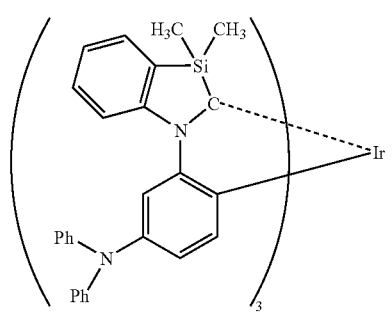
Compound (255)
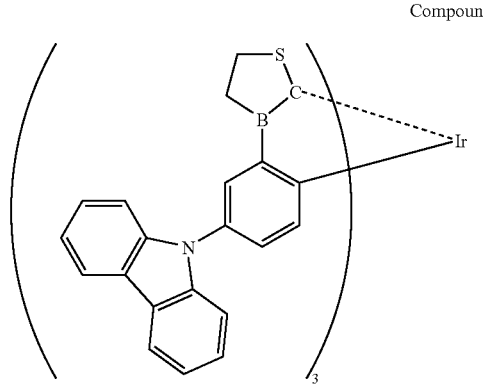
Compound (256)
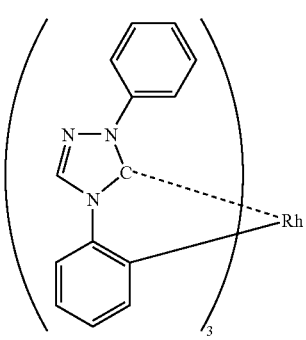
Compound (257)
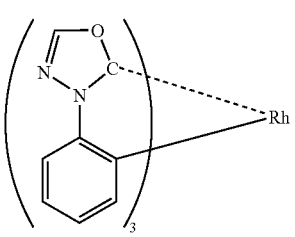
Compound (258)
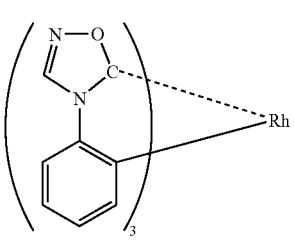
Compound (258)
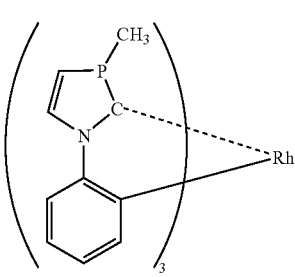
Compound (259)
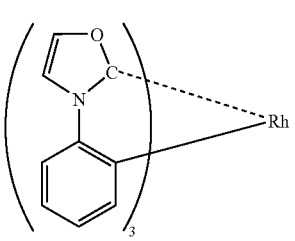
Compound (260)
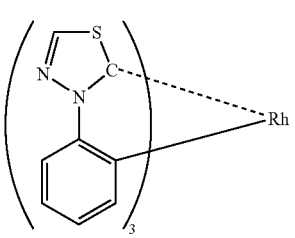

Compound (261)
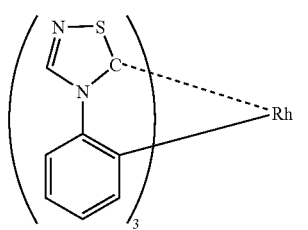
Compound (262)
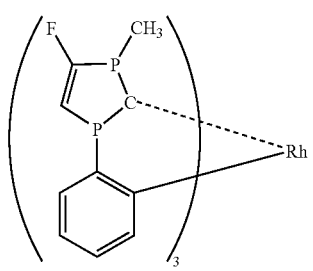
Compound (264)
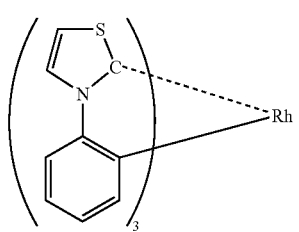
Compound (265)
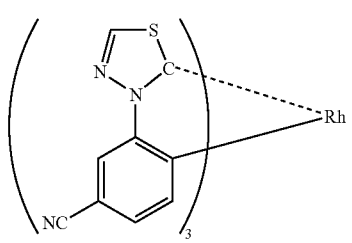
Compound (266)
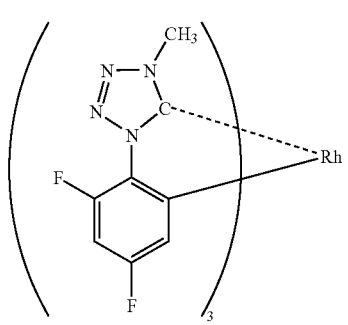
Compound (267)
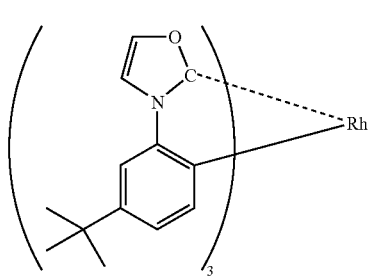
Compound (268)
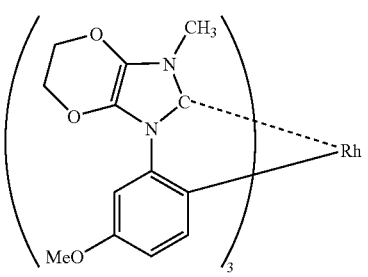
Compound (269)
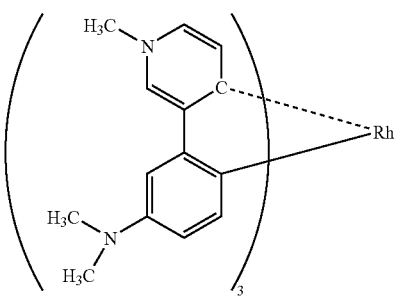
Compound (270)
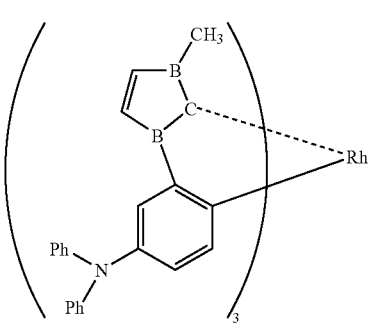
Compound (271)
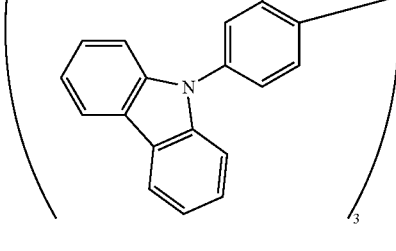
Compound (272)
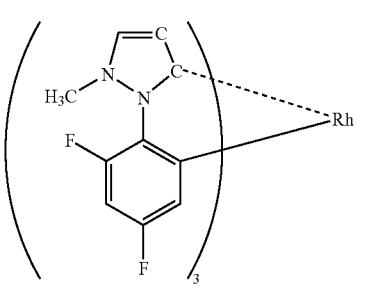

-continued

Compound (273)
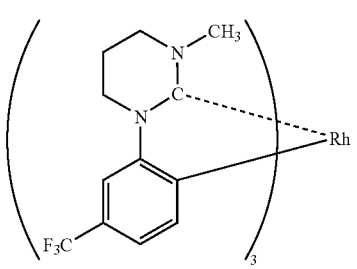

Compound (274)
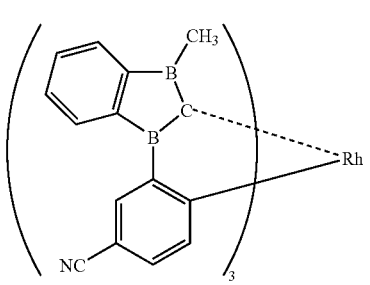

Compound (275)
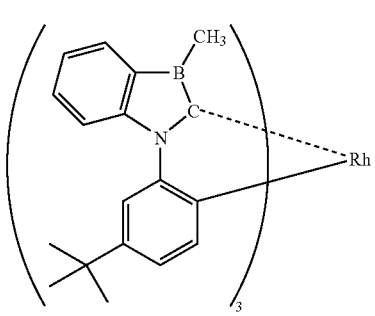

Compound (276)
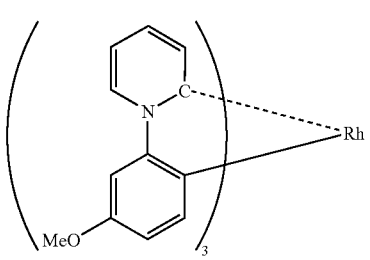

Compound (277)
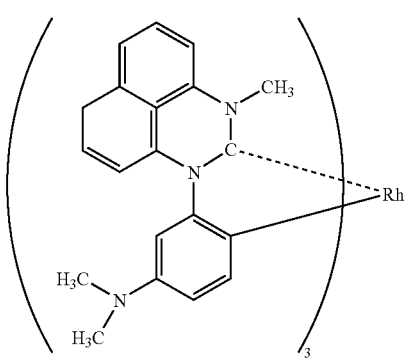

-continued

Compound (278)
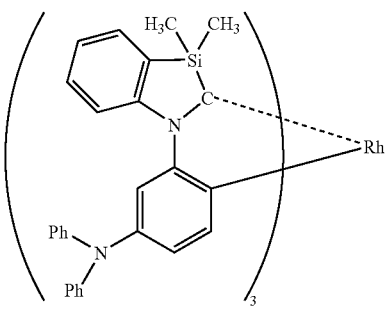

Compound (279)
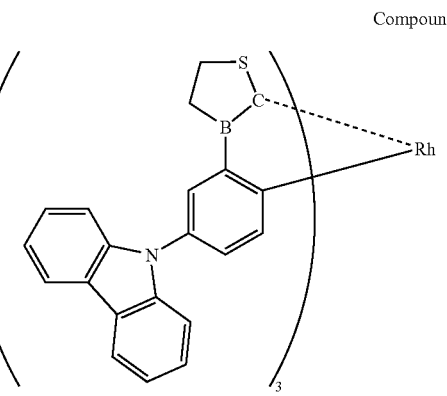

The compounds according to the present invention represented by Formulas (1) to (5) can be synthesized by the use of a variety of methods. For example, by mixing a ligand or the dissociated material with a transition metal compound at a room temperature or while heating them, the compounds can be obtained. In case of heating, a method of over-heating the materials with micro waves is effective in addition a typical heating method. Solvent (such as halogen solvent, alcohol solvent, ether solvent, and water) or base (which may be inorganic base or organic base, examples of which can include sodium methoxy, potassium t-butoxy, triethyl amine, and potassium carbonate) may be used as needed.

For example, the synthesis of Compound (1) can be performed by the use of the following method. That is, chlorine-bridged iridium complex A-1 can be synthesized by the use of the method described Document 1 (J. Am. Chem. Soc. 1984, 106, 6647) or the like. Then, by making a complex from complex A-1 and imidazolium salt A-2 which is a precursor of a carbene ligand by the use of the reaction condition described in Document 2 (Inorg. Chem. 2004, 43, 6896) or the like, Compound (1) can be synthesized.

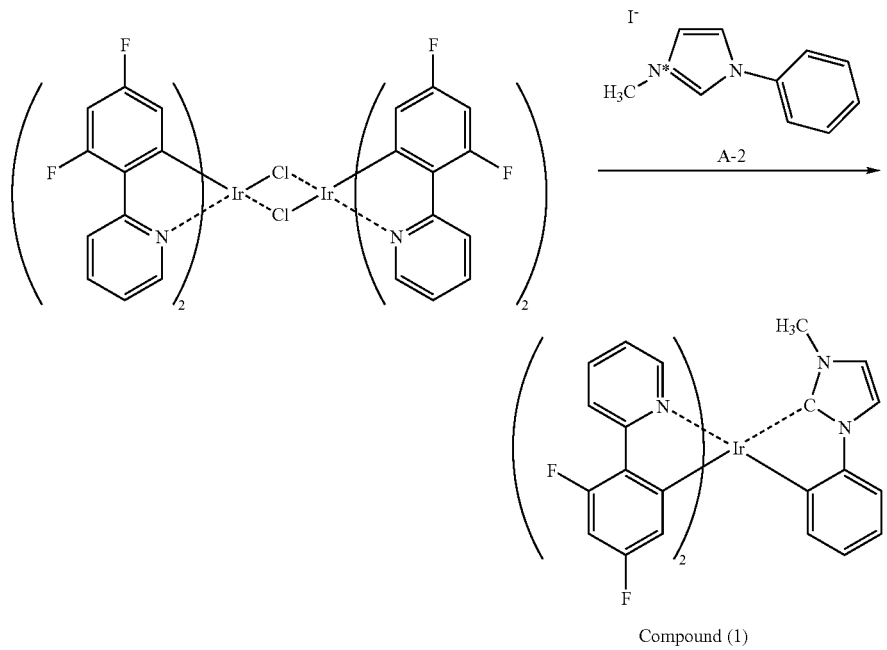

Compound (1)

The synthesis of Compound (113) which is a quadridentate platinum complex can be performed by the use of the following method. That is, imidazolium salt A-3 which is a precursor of a quadridentate carbene ligand can be synthesized by the use of the method described in Document 3 (Tetrahedron, 2004, 60, 5807). Then, by making a complex from imidazolium salt A-3 and platinum salt by the use of the reaction condition described in Document 4 (Coordination Chemistry Reviews, 2004, 248, 2247) or the like, Compound (113) can be synthesized.

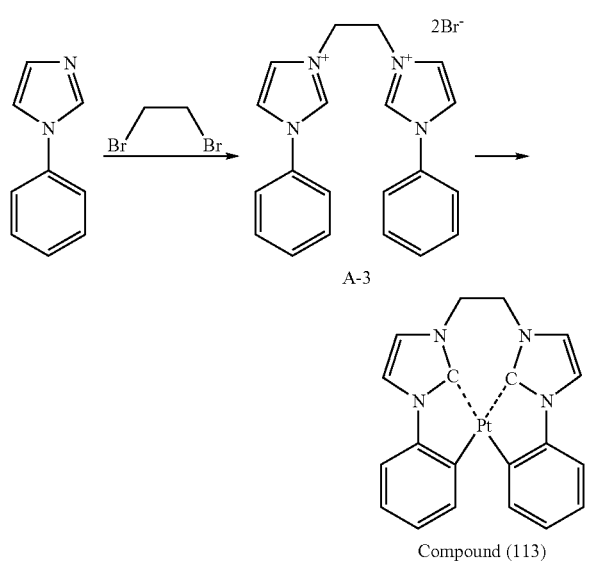

Compound (113)

The compounds according to the present invention can be also synthesized by the use of the method described in Document (Angew. Chem. Int. Ed. 2002, 41, 1290), Document 5 ("Metal Complex Chemistry," published in 1990 by Hirokawa Shoten and coauthored by Ogino Hiroshi, Matsubayasi Genetsu, and Yamamoto Yosihisa), and the like.

The compounds according to the present invention can be used as any one of a hole injecting material, a hole transporting material, a light emitting material, an electron injecting material, an electron transporting material, a hole blocking material, an electron blocking material, an exciter blocking material and a hole injection promoting material. The compounds can be used preferably as a hole injecting material, a hole transporting material, an electron blocking material, and a light emitting material, more preferably as a hole injecting material and a light emitting material, and most preferably as a light emitting material. When the compounds are used as the light emitting material, the emission of light may be any one of emission of ultraviolet rays, emission of visible rays, and emission of infrared rays, or may be any one of emission of fluorescent light and emission of phosphorescent light. The emission of phosphorescent light is most preferable.

The maximum wavelength of phosphorescent light of the compounds according to the present invention is preferably in the range of 380 nm to 490 nm, more preferably in the range of 400 nm to 480 nm, still more preferable in the range of 410 nm to 470 nm, and most preferably in the range of 420 nm to 460 nm.

The phosphorescent quantum yield of the compounds according to the present invention is preferably 20% or more, more preferably 40% or more, and most preferably 60% or more. The phosphorescent quantum yield of the phosphorescent material can be measured at 20° C. by freezing and degassing a solution containing the phosphorescent material (for examples, a toluene solution of $1 \times 10^{-5}$ mol/l).

In the organic electroluminescent device according to the present invention, the external quantum efficiency (=(the number of input electrons)/(the number of output photons)× 100(%)) is preferably 5% or more, more preferably 10% or more, and most preferably 13% or more. As the value of the external quantum efficiency, the maximum value of the external quantum efficiency when the device is driven at 20° C.

may be used or the value of the external quantum efficiency when the device is driven in the range of 100 to 300 cd/m$^2$ at 20° C. may be used.

In the organic electroluminescent device according to the present invention, the internal quantum efficiency (=(external quantum efficiency)×(light extraction efficiency)/100(%)) is preferably 30% or more, more preferably 50% or more, and most preferably 70% or more. The light extraction efficiency of a conventional organic EL device is about 20%, but the light extraction efficiency may be set to 20% or more by devising the shape of a substrate, the shape of an electrode, the thickness of an organic layer, the thickness of an inorganic layer, the refractive index of an organic layer, the refractive index of an inorganic layer, and the like.

The organic electroluminescent device according to the present invention has at least one organic layer between a pair of electrodes of a positive electrode and a negative electrode and the organic layer is a light emitting layer or a plurality of organic layers including the light emitting layer. The organic layer may include a hole injecting layer, a hole transporting layer, an electron transporting layer, an electron transporting layer, a hole injection promoting material and a protective layer, in addition to the light emitting layer. The respective layers may have different functions. A variety of materials may be used to form the respective layers.

Structural examples of the organic layer can include a single-layered structure (light emitting layer), a two-layered structure (light emitting layer and electron transporting layer, and hole transporting layer), a three-layered structure (electron transporting layer, light emitting layer, and hole transporting layer), a four-layered structure (electron injecting layer, light emitting layer, hole transporting layer, and hole injecting layer), and a five-layered structure (electron injecting layer, electron transporting layer, light emitting layer, hole transporting layer, and hole injecting layer).

The organic electroluminescent device according to the present invention has preferably at least three layers of the hole transporting layer, the light emitting layer, and the electron transporting layer. It is preferable that the light emitting layer includes at least two kinds of a host material and a fluorescent material.

The organic electroluminescent device according to the present invention contains a compound according to the present invention preferably in at least one layer of a light emitting layer, a layer between a light emitting layer and a negative electrode and a layer between a light emitting layer and a positive electrode, more preferably in at least one layer of a light emitting layer and a layer between a light emitting layer and a positive electrode, still more preferably in a light emitting layer.

When a compound according to the present invention is used in a light emitting layer, the light emitting layer preferably contains at least a compound according to the present invention and a light emitting material.

In a light emitting layer, a compound according to the present invention is preferably contained in 0.1 mass % to 99.5 mass %, more preferably 1 mass % to 98 mass %; particularly more preferably 5 mass % to 90 mass %.

Further, when a compound according to the present invention is contained in a layer between a light emitting layer and a negative electrode or a layer between a light emitting layer and a positive electrode, a compound according to the present invention is preferably contained in 10 mass % to 100 mass %, more preferably 30 mass % to 100 mass %, particularly more preferably 50 mass % to 100 mass %.

The light emitting material contained in the light emitting layer is not particularly limited and can be properly selected from the known materials. Examples of the fluorescent material can include materials described in Paragraph No. 0027 of Japanese Unexamined Patent Application Publication No. 2004-146067 and materials described in Paragraph No. 0057 of Japanese Unexamined Patent Application Publication No. 2004-103577.

Examples of the phosphorescent material can include heavy metal (such as iridium, platinum, rhenium, osmium, copper, and gold) complexes, and contains preferably the iridium complex or the platinum complex. Specific examples thereof can include those described in Paragraph Nos. 0051 to 0057 of Japanese Unexamined Patent Application Publication No. 2004-221068. Among them, a platinum complex having a quadridentate ligand is preferable, a platinum complex having a quadridentate ligand of which a nitrogen atom coordinates is more preferable, a platinum complex having a quadridentate ligand of which a nitrogen atom of a 6-membered heterocycle coordinates is still more preferable, and a platinum complex having a quadridentate ligand of a non-cyclic structure of which a nitrogen atom of a 6-membered heterocycle coordinates is most preferable. Examples of the platinum complex having a quadridentate ligand can include a platinum complex represented by Formula (P-1) described later. Platinum complexes having these quadridentate ligands can be synthesized by a method such as a method described in WO2004-108857A1.

The compounds according to the present invention may be used as a host material of the light emitting layer. When the compounds according to the present invention are used as the host material, the light emitting material contains preferably a platinum complex having a quadridentate ligand. The platinum complex having a quadridentate ligand is preferably a platinum complex having a quadridentate ligand of which a nitrogen atom coordinates, more preferably a platinum complex having a quadridentate ligand of which a nitrogen atom of a 6-membered heterocycle coordinates, and most preferably a platinum complex having a quadridentate ligand of a non-cyclic structure of which a nitrogen atom of a 6-membered heterocycle coordinates. Examples of the platinum complex having a quadridentate ligand can include a platinum complex represented by Formula (P-1) described later.

The compounds according to the present invention may be used in an adjacent layer of a light emitting layer (where the adjacent layer means a layer adjacent to the light emitting layer, such as a hole transporting layer, the hole injecting layer, an electron transporting layer, an electric charge blocking layer, and an exciter blocking layer). Particularly, the compounds according to the present invention are contained preferably in the adjacent layer between the positive electrode and the light emitting layer and more preferably in the hole transporting layer and/or a hole injection promoting layer. The hole injecting layer means a layer adjacent to a light emitting layer and promoting hole injection into a light emitting layer.

When the compounds according to the present invention are used in the adjacent layer of a light emitting layer, the light emitting layer contains preferably at least one compound according to the present invention, at least one light emitting material and at least one host material, or at least one host material and at least one light emitting material, and more preferably at least one host material and at least one light emitting material.

The light emitting material contained in the light emitting layer is preferably a phosphorescent material, more preferably a heavy metal complex, still more preferably heavy metal complexes, still more preferably an iridium complex or a platinum complex, and most preferably a platinum complex.

As a platinum complex, a platinum complex having a quadridentate ligand is preferable, the platinum complex having a quadridentate ligand of which a nitrogen atom coordinates is more preferable, the platinum complex having a quadridentate ligand of which a nitrogen atom of a 6-membered heterocycle coordinates is still more preferable, and the platinum complex having a quadridentate ligand of a non-cyclic structure of which a nitrogen atom of a 6-membered heterocycle coordinates is most preferable. Examples of the platinum complex having a quadridentate ligand can include a platinum complex represented by Formula (P-1) described later.

Examples of the host material contained in the light emitting layer can include the host material described later. The host material is preferably one of a heavy metal complex, a carbazole derivative, an aromatic three-degreed amine compound, and a thiophene derivative and has preferably a plurality of carbazole frameworks and/or aromatic three-degreed amine frameworks in a molecule.

Hereafter, Formula (P-1) is explained below.

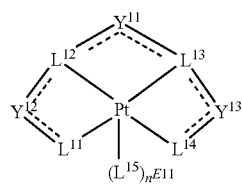

Formula (P-1)

Here, Pt represents a platinum ion, $L^{11}$, $L^{12}$, $L^{13}$, $L^{14}$, and $L^{15}$ represent a ligand coordinating with the platinum ion. A cyclic ligand is not formed by means of additional existence of an atom group between $L^{11}$ and $L^{14}$.

$L^{15}$ does not form a cyclic ligand by means of the coupling to both of $L^{11}$ and $L^{14}$. $Y^{11}$, $Y^{12}$, and $Y^{13}$ represent a connection group, a single bond, or a double bond. The bonds between $L^{11}$ and $Y^{12}$, between $L^{12}$ and $Y^{12}$, between $L^{12}$ and $Y^{11}$, between $L^{13}$ and $Y^{11}$, between $L^{13}$ and $Y^{13}$, and between $L^{14}$ and $Y^{13}$ represent a single bond or a double bond. $n^{E11}$ represents an integer of 0 to 4.

Formula (P-1) can be expressed preferably by Formula (P-2), Formula (P-9), Formula (P-10), Formula (P-5), and Formula (I) described below.

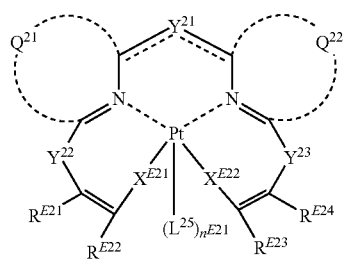

Formula (P-2)

Here, Pt represents a platinum ion and $Y^{21}$ represents a connection group, a single bond, or a double bond. $Y^{22}$ and $Y^{23}$ represent a single bond or a connection bond. $Q^{21}$ and $Q^{22}$ represent an atom group constituting a nitrogen-containing heterocycle, and the bond between a ring formed by $Q^{21}$ and $Y^{21}$ and the bond between the ring formed by $Q^{22}$ and $Y^{21}$ represent a single bond or a double bond. $X^{E21}$ and $X^{E22}$ represent an oxygen atom, a sulfur atom, or a substituted or non-substituted nitrogen atom. $R^{E21}$, $R^{E22}$, $R^{E23}$, and $R^{E24}$ represent a hydrogen atom or a substituent group, and $R^{E21}$, $R^{E22}$, $R^{E23}$, and $R^{E24}$ may form a ring by means of bonding, respectively. $L^{25}$ represents a ligand coordinating with the platinum ion. $n^{E21}$ represents an integer of 0 to 4.

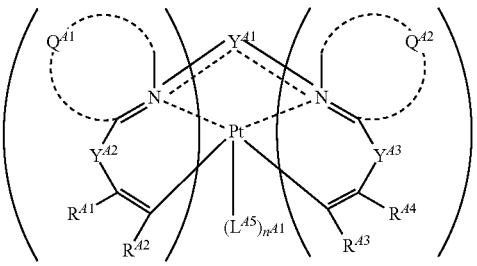

Formula (P-9)

Here, Pt represents a platinum ion, and $Q^{41}$ and $Q^{42}$ represent an atom group constituting a nitrogen-containing heterocycle. $R^{A1}$, $R^{A2}$, $R^{A3}$, and $R^{A4}$ represent a hydrogen atom or a substituent group, and $R^{A1}$ and $R^{A2}$, and $R^{A3}$ and $R^{A4}$ may form a ring by means of bonding, respectively. $Y^{A2}$ and $Y^{A3}$ represent a single bond or a connection bond. $Y^{A1}$ represent a connection bond, a single bond, or a double bond for connecting two bidentate ligands in a parenthesis. $L^{A5}$ represents a ligand coordinating with the platinum ion. $n^{A1}$ represents an integer of 0 to 4.

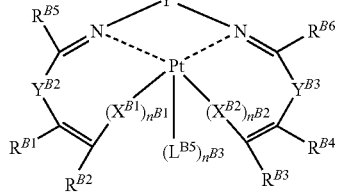

Formula (P-10)

Here, Pt represents a platinum ion, $Y^{B2}$ represents a connection group and $Y^{B2}$ and $Y^{B3}$ represent a connection group or a single bond. $X^{B1}$ and $X^{B2}$ represent an oxygen atom, a sulfur atom, or a substituted or non-substituted nitrogen atom. $n^{B1}$ and $n^{B2}$ represent an integer of 0 or 1. $R^{B1}$, $R^{B2}$, $R^{B3}$, $R^{B4}$, $R^{B5}$, and $R^{B6}$ represent a hydrogen atom or a substituent group, and $R^{B1}$ and $R^{B2}$, and $R^{B3}$ and $R^{B4}$ may form rings by means of bonding, respectively. $L^{B5}$ represents a ligand coordinating with the platinum ion. $n^{B3}$ represents an integer of 0 to 4. Here, $Y^{B1}$ is not connected to $R^{B5}$ or $R^{B6}$.

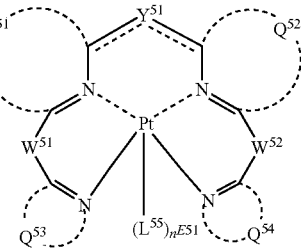

Formula (P-5)

Here, Pt represents a platinum ion, and $Q^{51}$, $Q^{52}$, $Q^{53}$, and $Q^{54}$ represent an atom group constituting a nitrogen-containing heterocycle. $Y^{51}$ represents a connection group, a single bond or a double bond. $W^{51}$ and $W^{52}$ represent a substituted or non-substituted carbon atom or nitrogen atom. $L^{55}$ represents a ligand coordinating with the platinum ion. $n^{E51}$ represents an integer of 0 to 4.

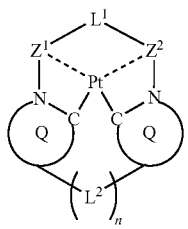

Formula (I)

In Formula (I), $Z^1$ and $Z^2$ represent a nitrogen-containing aromatic 6-membered ring of which a nitrogen atom coordinates with platinum. Q represents an aromatic 5-membered ring having one or two nitrogen atoms. $L^1$ and $L^2$ represent a single bond or a two-valence connection group. n represents 0 or 1.

Formula (P-2) described above can be expressed preferably by Formula (P-3) described below.

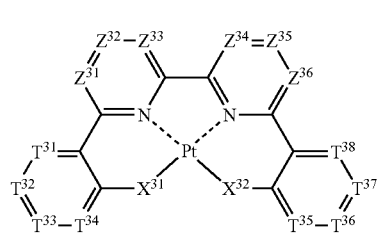

Formula (P-3)

In Formula (P-3), $Z^{31}$, $Z^{32}$, $Z^{33}$, $Z^{34}$, $Z^{35}$, $Z^{36}$, $T^{31}$, $T^{32}$, $T^{33}$, $T^{34}$, $T^{35}$, $T^{36}$, $T^{37}$ and $T^{38}$ represent a substituted or non-substituted carbon atom or nitrogen atom. $X^{31}$ and $X^{32}$ represent an oxygen atom, a sulfur atom, or a substituted or non-substituted nitrogen atom.

Formula (P-9) described above can be expressed preferably by Formulas (P-6) and (P-7) described below.

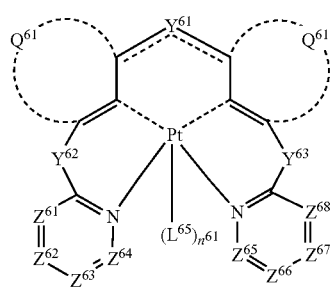

Formula (P-6)

In Formula (P-6), Pt represents a platinum ion, and $Q^{61}$ and $Q^{62}$ represent an atom group constituting a ring. $Z^{61}$, $Z^{62}$, $Z^{63}$, $Z^{64}$, $Z^{65}$, $Z^{66}$, $Z^{67}$ and $Z^{68}$ represent a substituted or non-substituted carbon atom or nitrogen atom. $Y^{61}$ represents a connection group, a single bond, or a double bond. $Y^{62}$ and $Y^{63}$ represent a connection group or a single bond. $L^{65}$ represents a ligand coordinating with the platinum ion. $n^{61}$ represents an integer of 0 to 4.

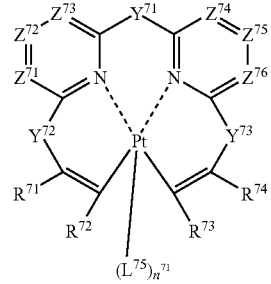

Formula (P-7)

In Formula (P-7), Pt represents a platinum ion, and $Z^{71}$, $Z^{72}$, $Z^{73}$, $Z^{74}$, $Z^{75}$, and $Z^{76}$ represent a substituted or non-substituted carbon atom or nitrogen atom. $Y^{71}$, $Y^{72}$, and $Y^{73}$ represent a connection group or a single bond. $R^{71}$, $R^{72}$, $R^{73}$, and $R^{74}$ represent a hydrogen atom or a substituent group, and $R^{71}$ and $R^{72}$, and $R^{73}$ and $R^{74}$ may form rings by means of bonding, respectively. $L^{75}$ represents a ligand coordinating with the platinum ion. $n^{71}$ represents an integer of 0 to 4.

Formula (P-7) described above can be expressed preferably by Formula (P-111) described below.

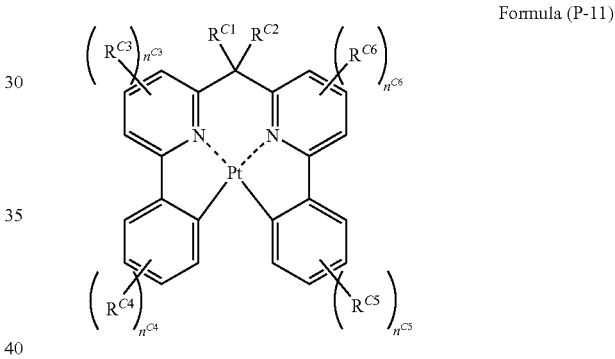

Formula (P-11)

Here, $R^{C1}$ and $R^{C2}$ represent a hydrogen atom or a substituent group, and $R^{C3}$, $R^{C4}$, $R^{C5}$, and $R^{C6}$ represent a substituent group. $n^{C3}$ and $n^{C6}$ represent an integer of 0 to 3 and $n^{C4}$ and $n^{C5}$ represent an integer of 0 to 4. When $R^{C3}$, $R^{C4}$, $R^{C5}$, and $R^{C6}$ are plural, the plural $R^{C3}$, $R^{C4}$, $R^{C5}$, and $R^{C6}$ may be equal to or different from each other, or may form a ring by means of bonding.

Formula (P-10) described above can be expressed preferably by Formula (P-12) described below.

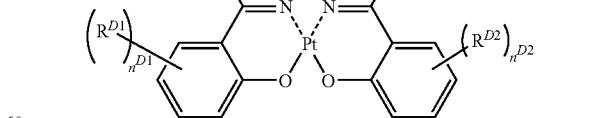

Formula (P-12)

Here, $R^{D3}$ and $R^{D4}$ represent a hydrogen atom or a substituent group, and $R^{D1}$ and $R^{D2}$ represent a substituent group. $n^{D1}$ and $n^{D2}$ represent an integer of 0 to 4. When $R^{D1}$ and $R^{D2}$ are plural, the plural $R^{D1}$ and $R^{D2}$ may be equal to or different from each other, or may form a ring by means of bonding. $Y^{D1}$ represents a vinyl group which is substituted at first and second positions, a phenylene ring, a pyridine ring, a pyrazine ring, a pyrimidine ring, or a methylene group having a carbon number of 1 to 8.

Formula (I) described above can be expressed preferably by Formulas (II), (III), and (IV) described below.

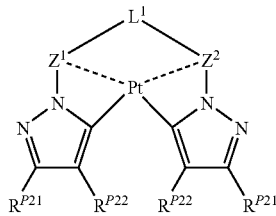

Formula (II)

In Formula (II), $Z^1$, $Z^2$, and $L^1$ are the same with those in Formula (I). $R^{P21}$ and $R^{P22}$ represent a hydrogen atom or a substituent group, independently.

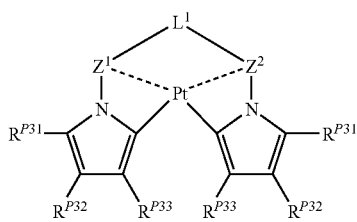

Formula (III)

In Formula (III), $Z^1$, $Z^2$, and $L^1$ are the same with those in Formula (I). $R^{P31}$, $R^{P32}$, and $R^{P33}$ represent a hydrogen atom or a substituent group, independently.

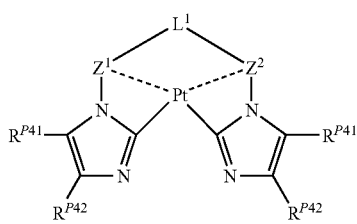

Formula (IV)

In Formula (IV), $Z^1$, $Z^2$, and $L^1$ are the same with those in Formula (I). $R^{P41}$ and $R^{P42}$ represent a hydrogen atom or a substituent group, independently.

Formula (II) described above can be expressed preferably by Formula (IIA) described below.

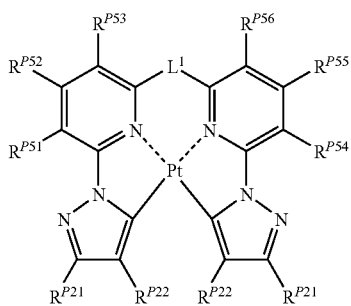

Formula (IIA)

In Formula (IIA), $L^1$ represents a single bond or a two-valence connection group. $R^{P21}$, $R^{P22}$, $R^{P51}$, $R^{P52}$, $R^{P53}$, $R^{P54}$, $R^{P55}$, and $R^{P56}$ represent a hydrogen atom or a substituent groups, independently.

Formula (IIA) described above can be expressed preferably by Formula (IIB) described below.

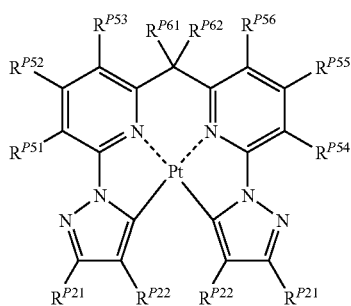

Formula (IIB)

In Formula (IIB), $R^{P21}$, $R^{P22}$, $R^{P51}$, $R^{P52}$, $R^{P53}$, $R^{P54}$, $R^{P55}$, $R^{P56}$, $R^{P61}$ and $R^{P62}$ represents hydrogen atom or a substituent group, independently.

Formula (IIB) described above can be expressed preferably by Formula (IIC) described below.

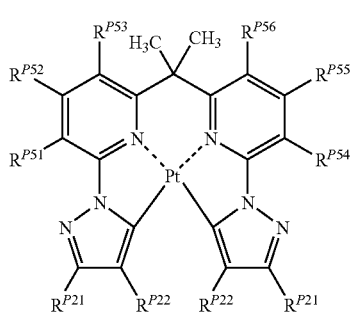

Formula (IIC)

In Formula (IIC), $R^{P21}$, $R^{P22}$, $R^{P51}$, $R^{P52}$, $R^{P53}$, $R^{P54}$, $R^{P55}$, and $R^{P56}$ represent a hydrogen atom or a substituent group, independently.

Formula (IIC) described above can be expressed preferably by Formula (IID) described below.

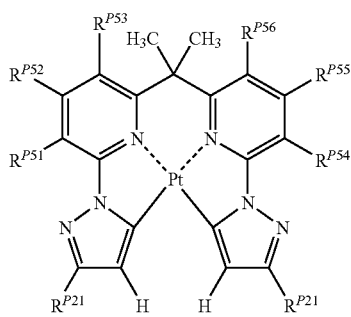

Formula (IID)

In Formula (IID), $R^{P21}$, $R^{P22}$, $R^{P53}$, $R^{P54}$, $R^{P55}$ and $R^{P56}$ represent a hydrogen atom or a substituent group, independently. $R^{P21}$ represents a substituent group.

Formula (P-1) is described. Pt represents a platinum ion.

$L^{11}$, $L^{12}$, $L^{13}$, and $L^{14}$ represent a ligand coordinating with the platinum ion. An atom included in $L^{11}$, $L^{12}$, $L^{13}$, and $L^{14}$ and coordinating with the platinum ion is preferably a nitrogen atom, an oxygen atom, a sulfur atom, or a carbon atom, and more preferably a nitrogen atom, an oxygen atom, or a carbon atom.

The bonds between the platinum ion and $L^{11}$, $L^{12}$, $L^{13}$, and $L^{14}$ may be a covalent bond, an ion bond, or a coordinate bond. The ligands including $L^{11}$, $Y^{12}$, $L^{12}$, $Y^{11}$, $L^{13}$, $Y^{13}$ and $L^{14}$, respectively, are preferably an anionic ligand (of which at least one anion is bonded to metal). The number of anions in the anionic ligand is preferably one of 1 to 3, more preferably 1 or 2, and most preferably 2.

$L^{11}$, $L^{12}$, $L^{13}$, and $L^{14}$ of which a carbon atom coordinates with the platinum ion are not particularly limited, and examples thereof can include an imino ligand, an aromatic carbon-ring ligand (such as a benzene ligand, a naphthalene ligand, an anthracene ligand, and a phenanthracene ligand), and a heterocyclic ligand (such as a thiophene ligand, a pyridine ligand, a pyrazine ligand, a pyrimidine ligand, a thiazole ligand, an oxazole ligand, a pyrrole ligand, an imidazole ligand, a pyrazole ligand, condensed rings including them (such as a quinoline ligand and a benzothiazole ligand), and tautomers thereof).

$L^{11}$, $L^{12}$, $L^{13}$, and $L^{14}$ of which a nitrogen atom coordinates with the platinum ion are not particularly limited, and examples thereof can include a nitrogen-containing heterocyclic ligand (such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, condensed rings including them (such as a quinoline ligand, a benzooxazole ligand, and a benzoimidazole ligand), tautomers thereof, and an amino ligand (such as an alkyl amino ligand (which has preferably a carbon number of 2 to 30, more preferably a carbon number of 2 to 20, and most preferably a carbon number of 2 to 10 and examples of which can include methylamino), an aryl amino ligand (such as phenylamino), an acyl amino ligand (which has preferably a carbon number of 2 to 30, more preferably a carbon number of 2 to 20, and most preferably a carbon number of 2 to 10 and examples of which can include acetylamino and benzoylamino), an alkoxycarbonyl amino ligand (which has preferably a carbon number of 2 to 30, more preferably a carbon number of 2 to 20, and most preferably a carbon number of 2 to 10 and examples of which can include methoxycarbonylamino), an aryloxycarbonyl amino ligand (which has preferably a carbon number of 7 to 30, more preferably a carbon number of 7 to 20, and most preferably a carbon number of 7 to 10 and examples of which can include phenyloxycarbonylamino), a sulfonyl amino ligand (which has preferably a carbon number of 1 to 30, more preferably a carbon number of 1 to 20, and most preferably a carbon number of 1 to 10 and examples of which can include methane sulfonylamino and benzene sulfonylamino), and an imino ligand). Such ligands may be substituted again.

$L^{11}$, $L^{12}$, $L^{13}$, and $L^{14}$ of which an oxygen atom coordinates with the platinum ion are not particularly limited, and examples thereof can include an alkoxy ligand (which has preferably a carbon number of 1 to 30, more preferably a carbon number of 1 to 20, and most preferably a carbon number of 1 to 10 and examples of which can include methoxy, ethoxy, butoxy, and 2-ethylhexyloxy), an aryloxy ligand (which has preferably a carbon number of 6 to 30, more preferably a carbon number of 6 to 20, and most preferably a carbon number of 6 to 12 and examples of which can include phenyloxy, 1-naphthyloxy, and 2-naphthyloxy), a heterocyclic oxy ligand (which has preferably a carbon number of 1 to 30, more preferably a carbon number of 1 to 20, and most preferably a carbon number of 1 to 12 and examples of which can include pyridyloxy, pyrazyloxy, pyrimidyloxy, and quinolyloxy), an acyloxy ligand (which has preferably a carbon number of 2 to 30, more preferably a carbon number of 2 to 20, and most preferably a carbon number of 2 to 10 and examples of which can include acetoxy and benzoyloxy), a silyloxy ligand (which has preferably a carbon number of 3 to 40, more preferably a carbon number of 3 to 30, and most preferably a carbon number of 3 to 24 and examples of which can include trimethyloxy and triphenylsilyloxy), a carbonyl ligand (examples of which can include a ketone ligand, an ester ligand, and an amide ligand), and an ether ligand (examples of which can include a dialkylether ligand, a diarylether ligand, and a furyl ligand).

$L^{11}$, $L^{12}$, $L^{13}$, and $L^{14}$ of which a sulfur atom coordinates with the platinum ion are not particularly limited, and examples thereof can include an alkylthio ligand (which has preferably a carbon number of 1 to 30, more preferably a carbon number of 1 to 20, and most preferably a carbon number of 1 to 12 and examples of which can include methylthio and ethylthio), an arylthio ligand (which has preferably a carbon number of 6 to 30, more preferably a carbon number of 6 to 20, and most preferably a carbon number of 6 to 12 and examples of which can include phenylthio), a heterocyclic thio ligand (which has preferably a carbon number of 1 to 30, more preferably a carbon number of 1 to 20, and most preferably a carbon number of 1 to 12 and examples of which can include pyridylthio, 2-benzimizolylthio, 2-benzoxazolylthio, and 2-benzthiazolylthio), a thiocarbonyl ligand (such as a thioketone ligand and a thioester ligand), and a thioether ligand (such as a dialkylthioether ligand, a diarylthioether ligand, and a thiofuryl ligand). The substituent ligands may be substituted again.

$L^{11}$ and $L^{14}$ are preferably one of an aromatic carbon-ring ligand, an alkyloxy ligand, an aryloxy ligand, an ether ligand, an alkylthio ligand, an arylthio ligand, an alkylamino ligand, an arylamino ligand, an acylamino ligand, and a nitrogen-containing heterocyclic ligand (such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, condensed rings including them (such as a quinoline ligand, a benzooxazole ligand, and a benzimidazole ligand), and tautomers thereof), more preferably one of an aromatic carbon-ring ligand, an aryloxy ligand, an arylthio ligand, an arylamino ligand, an acylamino ligand, a pyridine ligand, a pyrazine ligand, an imidazole ligand, condensed rings including them (such as a quinoline ligand, a quinoxaline ligand, and a benzimidazole ligand), and tautomers thereof, still more preferably one of an aromatic carbon-ring ligand, an aryloxy ligand, an arylthio ligand, and an arylamino ligand, and most preferably one of an aromatic carbon-ring ligand and an aryloxy ligand.

$L^{12}$ and $L^{13}$ are preferably a ligand forming a coordinate bond with the platinum ion. The ligand forming a coordinate bond with the platinum ion is preferably one of a pyridine ring, a pyrazine ring, a pyrimidine ring, a triazine ring, a thiazole ring, an oxazole ring, a pyrrole ring, a triazole ring, condensed rings including them (such as a quinoline ring, a benzooxazole ring, a benzimidazole ring, and an indolenine ring), and tautomers thereof, more preferably one of a pyridine ring, a pyrazine ring, a pyrimidine ring, a pyrrole ring, condensed rings including them (such as a quinoline ring and a benzopyrrole ring), and tautomers thereof, and most preferably one of a pyridine ring and condensed rings including the pyridine ring (such as a quinoline ring).

$L^{15}$ represents a ligand coordinating with the platinum ion. $L^{15}$ is preferably a ligand of monodentate to quadridentate and an anionic ligand of monodentate to quadridentate. The anionic ligand of monodentate to quadridentate is not particularly limited, but is preferably one of a halogen ligand, a 1,3-diketone ligand (such as an acetyl acetone ligand), a monoanionic bidentate ligand (such as a picoline acid ligand and a 2-(2-hydroxyphenyl)-pyridine ligand) containing a pyridine ligand, and a quadridentate ligand formed by $L^{11}$, $Y^{12}$, $L^{12}$, $Y^{11}$, $L^{13}$, $Y^{13}$, and $L^{14}$, more preferably one of a 1,3-diketone ligand (such as an acetyl acetone ligand), a monoanionic bidentate ligand (such as a picoline acid ligand and a 2-(2-hydroxyphenyl)-pyridine ligand) containing a pyridine ligand, and a quadridentate ligand formed by $L^{11}$, $Y^{12}$, $L^{12}$, $Y^{11}$, $L^{13}$, $Y^{13}$, and $L^{14}$, still more preferably one of a 1,3-diketone ligand (such as an acetylacetone ligand), and a monoanionic bidentate ligand (such as a picoline acid ligand and a 2-(2-hydroxyphenyl)-pyridine ligand) containing a pyridine ligand, and most preferably a 1,3-diketone ligand (such as an acetylacetone ligand). The number of dentates and the number of ligands are not greater than the coordination number of metal. $L^{15}$ does not form a cyclic ligand by means of the coupling to both of $L^{11}$ and $L^{14}$.

$Y^{11}$, $Y^{12}$, and $Y^{13}$ represent a connection group, a single bond, or a double bond. The connection group is not particularly limited, but is preferably a carbonyl connection group, a thiocarbonyl connection group, an alkylene group, an alkenylene group, an arylene group, a heteroarylene group, an oxygen atom connection group, a nitrogen atom connection group, a silicon atom connection group, and a group obtained by combining them. The bonds between $L^{11}$ and $Y^{12}$, between $L^{12}$ and $Y^{12}$, between $L^{12}$ and $Y^{11}$, between $L^{13}$ and $Y^{11}$, between $L^{13}$ and $Y^{13}$, and between $L^{14}$ and $Y^{13}$ represent a single bond or a double bond.

$Y^{11}$, $Y^{12}$, and $Y^{13}$ are preferably one of a single bond, a double bond, a carbonyl connection group, an alkylene connection group, and an alkenylene group. $Y^{11}$ is more preferably one of a single bond and an alkylene connection group and still more preferably an alkylene connection group. $Y^{12}$ and $Y^{13}$ are more preferably a single bond and an alkenylene group and still more preferably a single bond.

A ring formed by $Y^{12}$, $L^{11}$, $L^{12}$, and a platinum ion, a ring formed by $Y^{11}$, $L^{12}$, $L^{13}$, and a platinum ion, and a ring formed by $Y^{13}$, $L^{13}$, $L^{14}$, and a platinum ion have preferably a ring member number of 4 to 10, more preferably a ring member number of 5 to 7, and most preferably a ring member number of 5 or 6.

$n^{E11}$ represents an integer of 0 to 4. When the coordination number of the platinum ion is 4, $n^{E11}$ is preferably 0. When the coordination number of the platinum ion is 6, $n^{E11}$ is preferably 1 or 2 and more preferably 1. When the coordination number of the platinum ion is 6 and $n^{E11}$ is 1, $L^{15}$ represents a bidentate ligand. When the coordination number of the platinum ion is 6 and $n^{E11}$ is 2, $L^{15}$ represents a monodentate ligand. When $n^{E11}$ is plural, plural $L^{15}$ may be equal to or different from each other.

Formula (P-2) is now described.

$Q^{21}$ and $Q^{22}$ represent an atom group forming a nitrogen-containing heterocycle (a ring containing nitrogen coordinating with a platinum ion). The nitrogen-containing heterocycle formed by $Q^{21}$ and $Q^{22}$ is not particularly limited, and examples thereof can include a pyridine ring, a pyrazine ring, a pyrimidine ring, a triazine ring, a thiazole ring, an oxazole ring, a pyrrole ring, a triazole ring, condensed rings including them (such as a quinoline ring, a benzooxazole ring, a benzimidazole ring, and an indolenine ring), and tautomers thereof.

The nitrogen-containing heterocycle formed by $Q^{21}$ and $Q^{22}$ is preferably one of a pyridine ring, a pyrazine ring, a pyrimidine ring, a pyridazine ring, a triazine ring, a pyrazole ring, an imidazole ring, an oxazole ring, a pyrrole ring, a benzazole ring, condensed rings including them (such as a quinoline ring, a benzooxazole ring, and a benzoimidazole ring), and tautomers thereof, more preferably one of a pyridine ring, a pyrazine ring, a pyrimidine ring, an imidazole ring, a pyrrole ring, condensed rings including them (such as a quinoline ring), and tautomers thereof, still more preferably one of a pyridine ring and a condensed ring thereof (such as a quinoline ring), and most preferably a pyridine ring.

$X^{E21}$ and $X^{E22}$ are preferably one of an oxygen atom, a sulfur atom, and a substituted or non-substituted nitrogen atom, more preferably one of an oxygen atom, a sulfur atom, and a substituted nitrogen atom, still more preferably one of an oxygen atom and a sulfur atom, and most preferably an oxygen atom.

$Y^{21}$ is the same with $Y^{11}$ described above and a preferable range thereof is also the same.

$Y^{22}$ and $Y^{23}$ represent a connection group or a single bond, and are preferably a single bond. The connection group is not particularly limited, but is preferably one of a carbonyl connection group, a thiocarbonyl connection group, an alkylene group, an alkenylene group, an arylene group, a heteroarylene group, an oxygen atom connection group, a nitrogen atom connection group, and a group obtained by combining them.

The connection group is preferably one of a carbonyl connection group, an alkylene connection group, and an alkenylene connection group, more preferably one of a carbonyl connection group and an alkylene connection group, and most preferably a carbonyl connection group.

$R^{E21}$, $R^{E22}$, $R^{E23}$, and $R^{E24}$ represent a hydrogen atom or a substituent group. The substituent group is not limited, and examples thereof can include an alkyl group (which has preferably a carbon number of 1 to 30, more preferably a carbon number of 1 to 20, and most preferably a carbon number of 1 to 10, and examples of which can include methyl, ethyl, iso-propyl, tert-butyl, n-octyl, n-decyl, n-hexadecyl, cyclopropyl, cyclopentyl, and cyclohexyl), an alkenyl group (which has preferably a carbon number of 2 to 30, more preferably a carbon number of 2 to 20, and most preferably a carbon number of 2 to 10, and examples of which can include vinyl, aryl, 2-butenyl, and 3-pentenyl), an alkinyl group (which has preferably a carbon number of 2 to 30, more preferably a carbon number of 2 to 20, and most preferably a carbon number of 2 to 10, and examples of which can include propargyl and 3-pentinyl), an aryl group (which has preferably a carbon number of 6 to 30, more preferably a carbon number of 6 to 20, and most preferably a carbon number of 6 to 12, and examples of which can include phenyl, p-methylphenyl, naphthyl, and anthranil), and an amino group (which has preferably a carbon number of 0 to 30, more preferably a carbon number of 0 to 20, and most preferably a carbon number of 0 to 10, and examples of which can include amino, methyl amino, dimethyl amino, diethyl amino, dibenzyl amino, diphenyl amino, and ditolyl amino).

Other examples of the substituent group can include an alkoxy group (which has preferably a carbon number of 1 to 30, more preferably a carbon number of 1 to 20, and most preferably a carbon number of 1 to 10, and examples of which can include methoxy, ethoxy, butoxy, and 2-ethylhexyloxy), an aryloxy group (which has preferably a carbon number of 6 to 30, more preferably a carbon number of 6 to 20, and most preferably a carbon number of 6 to 12, and examples of which can include phenyloxy, 1-naphtayloxy, and 2-naphthyloxy), a heterocyclic oxy group (which has preferably a carbon number of 1 to 30, more preferably a carbon number of 1 to 20, and most preferably a carbon number of 1 to 12, and examples of which can include pyridyloxy, pyrazyloxy, pyrimidyloxy, and quinolyloxy), an acyl group (which has preferably a carbon number of 1 to 30, more preferably a carbon number of 1 to 20, and most preferably a carbon number of 1 to 12, and examples of which can include acetyl, benzoyl, formyl, and pivaloyl), an alkoxycarbonyl group (which has preferably a carbon number of 2 to 30, more preferably a carbon number of 2 to 20, and most preferably a carbon number of 2 to 12, and examples of which can include methoxycarbonyl and ethoxycarbonyl), and an aryloxycarbonyl group (which has preferably a carbon number of 7 to 30, more preferably a carbon number of 7 to 20, and most preferably a carbon number of 7 to 12, and examples of which can include phenyloxycarbonyl).

Other examples of the substituent group can include an acyloxy group (which has preferably a carbon number of 2 to 30, more preferably a carbon number of 2 to 20, and most preferably a carbon number of 2 to 10, and examples of which can include acetoxy and benzoyloxy), an acyl amino group (which has preferably a carbon number of 2 to 30, more preferably a carbon number of 2 to 20, and most preferably a carbon number of 2 to 10, and examples of which can include acetyl amino and benzoyl amino), an alkoxycarbonyl amino group (which has preferably a carbon number of 2 to 30, more preferably a carbon number of 2 to 20, and most preferably a carbon number of 2 to 12, and examples of which can include methoxycarbonyl amino), an aryloxycarbonyl amino group (which has preferably a carbon number of 7 to 30, more preferably a carbon number of 7 to 20, and most preferably a carbon number of 7 to 12, and examples of which can include phenyloxycarbonyl amino), a sulfonyl amino group (which has preferably a carbon number of 1 to 30, more preferably a carbon number of 1 to 20, and most preferably a carbon number of 1 to 12, and examples of which can include methane sulfonyl amino and benzene sulfonyl ammo), and a sulfamoyl group (which has preferably a carbon number of 0 to 30, more preferably a carbon number of 0 to 20, and most preferably a carbon number of 0 to 12, and examples of which can include sulfamoyl, methylsulfamoyl, dimethylsulfamoyl, and phenylsulfamoyl).

Other examples of the substituent group can include a carbamoyl group (which has preferably a carbon number of 1 to 30, more preferably a carbon number of 1 to 20, and most preferably a carbon number of 1 to 12, and examples of which can include carbamoyl, methylcarbamoyl, diethylcarbamoyl, and phenylcarbamoyl), an alkylthio group (which has preferably a carbon number of 1 to 30, more preferably a carbon number of 1 to 20, and most preferably a carbon number of 1 to 12, and examples of which can include methylthio and ethylthio), an arylthio group (which has preferably a carbon number of 6 to 30, more preferably a carbon number of 6 to 20, and most preferably a carbon number of 6 to 12, and examples of which can include phenylthio), a heterocyclic thio group (which has preferably a carbon number of 1 to 30, more preferably a carbon number of 1 to 20, and most preferably a carbon number of 1 to 12, and examples of which can include pyridylthio, 2-benzimizolylthio, 2-benzoxazolylthio, and 2-benzthiazolylthio), a sulfonyl group (which has preferably a carbon number of 1 to 30, more preferably a carbon number of 1 to 20, and most preferably a carbon number of 1 to 12, and examples of which can include mesyl and tosyl), a sulfinyl group (which has preferably a carbon number of 1 to 30, more preferably a carbon number of 1 to 20, and most preferably a carbon number of 1 to 12, and examples of which can include methane sulfinyl and benzene sulfinyl), and an ureido group (which has preferably a carbon number of 1 to 30, more preferably a carbon number of 1 to 20, and most preferably a carbon number of 1 to 12, and examples of which can include ureido, methylureido, and phenylureido).

Other examples of the substituent group can include an amide phosphate group (which has preferably a carbon number of 1 to 30, more preferably a carbon number of 1 to 20, and most preferably a carbon number of 1 to 12, and examples of which can include diethyl amide phosphate and phenyl amide phosphate), an hydroxyl group, a mercapto group, a halogen atom (examples of which can include a fluorine atom, a chlorine atom, a bromine atom, and an iodine atom), a cyano group, a sulfo group, a carboxyl group, a nitro group, a hydroxamic group, a sulfino group, a hydrazino group, an imino group, a heterocyclic group (which has preferably a carbon number of 1 to 30 and more preferably a carbon number of 1 to 12 and which includes, for example, a nitrogen atom, an oxygen atom, and a sulfur atom as the hetero atom, examples of which can include imidazolyl, pyridyl, quinolyl, furyl, thienyl, piperidyl, morpholino, benzoxazolyl, benzimidazolyl, benzthiazolyl, carbazolyl, and azepinyl), a silyl group (which has preferably a carbon number of 3 to 40, more preferably a carbon number of 3 to 30, and most preferably a carbon number of 3 to 24, and examples of which can include trimethylsilyl and triphenylsilyl), and a silyloxy group (which has preferably a carbon number of 3 to 40, more preferably a carbon number of 3 to 30, and most preferably a carbon number of 3 to 24, and examples of which can include methylsilyloxy and triphenylsilyloxy). These substituent groups may be substituted again.

$R^{E21}$, $R^{E22}$, $R^{E23}$, and $R^{E24}$ are preferably groups forming a ring structure (such as a benzo condensed ring and a pyridine condensed ring) in which an alkyl group, an aryl group, and $R^{E21}$ and $R^{E22}$ or $R^{E23}$ and $R^{E24}$ are bonded, and more preferably groups forming a ring structure (such as a benzo condensed ring and a pyridine condensed ring) in which $R^{E21}$ and $R^{E22}$ or $R^{E23}$ and $R^{E24}$ are bonded.

$L^{25}$ is the same with $L^{15}$ described above and a preferable range thereof is also the same.

$n^{E21}$ is the same with $n^{E11}$ described above and a preferable range thereof is also the same.

In Formula (P-2), a metal complex that the ring formed by $Q^{21}$ and $Q^{22}$ is a pyridine ring and $Y^{21}$ is a connection group, a metal complex that the ring formed by $Q^{21}$ and $Q^{22}$ is a pyridine ring, $Y^{21}$ is a single bond or a double bond, and $X^{E21}$ and $X^{E22}$ are a sulfur atom or a substituted or non-substituted nitrogen atom, or a metal complex that the ring formed by $Q^{21}$ and $Q^{22}$ is a nitrogen-containing five-membered heterocycle or a nitrogen-containing six-membered heterocycle having two nitrogen atoms is preferable.

Formula (P-3) is now described.

$Z^{31}$, $Z^{32}$, $Z^{33}$, $Z^{34}$, $Z^{35}$, and $Z^{36}$ are a substituted or non-substituted carbon atom or nitrogen atom and preferably a substituted or non-substituted carbon atom. Examples of the substituent group on a carbon atom can include the groups described with reference to $R^{E21}$. $Z^{31}$ and $Z^{32}$, $Z^{32}$ and $Z^{33}$, $Z^{33}$ and $Z^{34}$, $Z^{34}$ and $Z^{35}$, and $Z^{35}$ and $Z^{36}$ may be bonded to each other through connection groups, respectively, to form condensed rings (such as a benzo condensed ring and a pyridine condensed ring). $Z^{31}$ and $T^{31}$, and $Z^{36}$ and $T^{38}$ may be bonded to each other through connection groups, respectively, to form condensed rings (such as a benzo condensed ring and a pyridine condensed ring).

The substituent group on the carbon atom is preferably one of an alkyl group, an alkoxy group, an alkylamino group, an aryl group, a group forming a condensed ring (such as a benzo condensed ring and a pyridine condensed ring), and a halogen atom, more preferably one of an alkylamino group, an aryl group, and a group forming a condensed ring (such as a benzo condensed ring and a pyridine condensed ring), still more preferably one of an aryl group and a group forming a condensed ring (such as a benzo condensed ring and a pyridine condensed ring), and most preferably a group forming a condensed ring (such as a benzo condensed ring and a pyridine condensed ring).

$T^{31}$, $T^{32}$, $T^{33}$, $T^{34}$, $T^{35}$, $T^{36}$, $T^{37}$, and $T^{38}$ are preferably a substituted or non-substituted carbon atom or nitrogen atom, and more preferably a substituted or non-substituted carbon atom. The substituent group on a carbon atom can include the groups described with reference to $R^{E21}$. $T^{31}$ and $t^{32}$, $T^{32}$ and $t^{33}$, $T^{33}$ and $t^{34}$, $T^{35}$ and $Z^{36}$, $T^{36}$ and $Z^{37}$, and $t^{37}$ and $t^{38}$ may be bonded to each other through connection groups, respectively, to form condensed rings (such as a benzo condensed ring).

The substituent group on the carbon atom is preferably one of an alkyl group, an alkoxy group, an alkylamino group, an aryl group, a group forming a condensed ring (such as a benzo condensed ring and a pyridine condensed ring), and a halogen atom, more preferably one of an aryl group, a group forming a condensed ring (such as a benzo condensed ring and a pyridine condensed ring), and a halogen atom, still more preferably one of an aryl group and a halogen atom, and most preferably an aryl group.

$X^{31}$ and $X^{32}$ are the same with $X^{E21}$ and $X^{E22}$ described above, respectively, and preferable ranges thereof are also the same.

Formula (P-5) is now described.

$Q^{51}$ and $Q^{52}$ are the same with $Q^{21}$ and $Q^{22}$ described above, respectively, and preferable ranges thereof are also the same.

$Q^{53}$ and $Q^{54}$ represent a group forming a nitrogen-containing heterocycle (a ring containing nitrogen coordinating with the platinum ion). The nitrogen-containing heterocycle formed by $Q^{53}$ and $Q^{54}$ is not particularly limited, but preferably one of a tautomer of a pyrrole derivative, a tautomer of an imidazole derivative, a tautomer of a thiazole derivative, and a tautomer of an oxazole derivative, more preferably one of a tautomer of a pyrrole derivative, a tautomer of an imidazole derivative, and a tautomer of a thiazole derivative, still more preferably one of a tautomer of a pyrrole derivative and a tautomer of an imidazole derivative, and most preferably a tautomer of a pyrrole derivative.

$Y^{51}$ is the same with $Y^{11}$ described above and a preferable range thereof is also the same.

$L^{55}$ is the same with $L^{15}$ described above and a preferable range thereof is also the same.

$n^{E51}$ is the same with $t^{E11}$ described above and a preferable range thereof is also the same.

$W^{51}$ and $W^{52}$ are preferably a substituted or non-substituted carbon atom or nitrogen atom, more preferably a non-substituted carbon atom or nitrogen atom, and still more preferably a non-substituted carbon atom.

Formula (P-9) is now described. $Q^{41}$, $Q^{42}$, $Y^{41}$, $Y^{42}$, $Y^{43}$, $R^{41}$, $R^{42}$, $R^{43}$, $R^{44}$, $L^{45}$, and $n^{41}$ are the same with $M^{21}$, $Q^{21}$, $Q^{22}$, $Y^{21}$, $Y^{22}$, $Y^{23}$, $R^{E21}$, $R^{E22}$, $R^{E23}$, $R^{E24}$, $L^{25}$, and $n^{E21}$ in Formula (P-2) and preferable ranges thereof are also the same.

Formula (P-6) is now described.

$Q^{61}$ and $Q^{62}$ represent a group forming a ring. The ring formed by $Q^{61}$ and $Q^{62}$ is not limited, and examples thereof can include a benzene ring, a pyridine ring, a pyridazine ring, a pyrimidine ring, a thiophene ring, an isothiazole ring, a furan ring, an isooxazole ring, and condensed rings thereof.

The ring formed by $Q^{61}$ and $Q^{62}$ is preferably one of a benzene ring, a pyridine ring, a thiophene ring, a thiazole ring, and condensed rings thereof more preferably one of a benzene ring, a pyridine ring, and condensed rings thereof, and most preferably a benzene ring and a condensed ring thereof.

$Y^{61}$ is the same with $Y^{11}$ and a preferable range thereof is also the same.

$Y^{62}$ and $Y^{63}$ represent a connection group or a single bond. The connection group is not particularly limited, and examples thereof can include a carbonyl connection group, a thiocarbonyl connection group, an alkylene group, an alkenylene group, an arylene group, a heteroarylene group, an oxygen atom connection group, a nitrogen atom connection group, and a group obtained by combining them.

$Y^{62}$ and $Y^{63}$ are preferably one of a single bond, a carbonyl connection group, an alkylene connection group, and an alkenylene connection group, more preferably one of a single bond and an alkenylene connection group, and most preferably a single bond.

$L^{65}$ is the same with $L^{15}$ described above and a preferable range thereof is also the same.

$n^{61}$ is the same with $n^{E11}$ described above and a preferable range thereof is also the same.

$Z^{61}$, $Z^{62}$, $Z^{63}$, $Z^{64}$, $Z^{65}$, $Z^{66}$, $Z^{67}$, and $Z^{68}$ are a substituted or non-substituted carbon atom or nitrogen atom and preferably a substituted or non-substituted carbon atom. Examples of the substituent group on a carbon atom can include the groups described with reference to $R^{E21}$. $Z^{61}$ and $Z^{62}$, $Z^{62}$ and $Z^{63}$, $Z^{63}$ and $Z^{64}$, $Z^{65}$ and $Z^{66}$, $Z^{66}$ and $Z^{67}$, and $Z^{67}$ and $Z^{68}$ may be bonded to each other through connection groups, respectively, to form condensed rings (such as a benzo condensed ring and a pyridine condensed ring). The ring formed by $Q^{61}$ and $Q^{62}$ may be bonded to $Z^{61}$ and $Z^{68}$ through connection groups, respectively, to form rings.

The substituent group on the carbon atom is preferably one of an alkyl group, an alkoxy group, an alkylamino group, an aryl group, a group forming a condensed ring (such as a benzo condensed ring and a pyridine condensed ring), and a halogen atom, more preferably one of an alkylamino group, aryl group, and a group forming a condensed ring (such as a benzo condensed ring and a pyridine condensed ring), still more preferably one of an aryl group and a group forming a condensed ring (such as a benzo condensed ring and a pyridine condensed ring), and most preferably a group forming a condensed ring (such as a benzo condensed ring and a pyridine condensed ring).

Formula (P-7) is now described.

$Y^{71}$, $Y^{72}$, and $Y^{73}$ are the same with $Y^{62}$ and preferable ranges thereof are also the same.

$L^{75}$ is the same with $L^{15}$ described above and a preferable range thereof is also the same.

$n^{71}$ is the same with $n^{E11}$ described above and a preferable range thereof is also the same.

$Z^{71}$, $Z^{72}$, $Z^{73}$, $Z^{74}$, $Z^{75}$, and $Z^{76}$ are a substituted or non-substituted carbon atom or nitrogen atom and preferably a substituted or non-substituted carbon atom. Examples of the substituent group on a carbon atom can include the groups described with reference to $R^{E21}$. $Z^{71}$ and $Z^{72}$, and $Z^{73}$ and $Z^{74}$ may be bonded to each other through connection groups, respectively, to form condensed rings (such as a benzo condensed ring and a pyridine condensed ring).

$R^{71}$ to $R^{74}$ are the same with the substituent groups of $R^{E21}$ to $R^{E24}$ in Formula (P-2) and preferable ranges thereof are also the same.

Formula (P-11) is now described.

$R^{C1}$ and $R^{C2}$ are a hydrogen atom or a substituent group and examples of the substituent group preferably include an alkyl group and an aryl group described as the substituent groups of $R^{E21}$ to $R^{E24}$ in Formula (P-2). The substituent groups represented by $R^{C3}$, $R^{C4}$, $R^{C5}$, and $R^{C6}$ are the same with the substituent groups of $R^{E21}$ in Formula (P-2). $n^{C3}$ and $n^{C6}$ are an integer of 0 to 3 and $n^{C4}$ and $n^{C5}$ are an integer of 0 to 4. When $R^{C3}$, $R^{C4}$, $R^{C5}$, and $R^{C6}$ are plural, respectively, the plural $R^{C3}$, $R^{C4}$, $R^{C5}$, and $R^{C6}$ may be equal or different. $R^{C3}$, $R^{C4}$, $R^{C5}$, and $R^{C6}$ are preferably one of an alkyl group, an aryl group, a hetero aryl group, and a halogen atom.

Formula (P-10) is now described.

$Y^{B2}$, $Y^{B3}$, $R^{B1}$, $R^{B2}$, $R^{B3}$, $R^{B4}$, $L^{B5}$, $n^{B3}$, $X^{B1}$, and $X^{B2}$ are the same with $Y^{22}$, $Y^{23}$, $R^{E21}$, $R^{E22}$, $R^{E23}$, $R^{E24}$, $L^{25}$, $n^{E21}$, $X^{E21}$, and $X^{E22}$ in Formula (P-2). $Y^{B1}$ represents a connection group and is the same with $Y^{21}$ in Formula (P-2), which is preferably one of a vinyl group which is substituted at first and second positions, a phenylene ring, a pyridine ring, a pyrazine ring, a pyrimidine ring, and a methylene group having a carbon number of 1 to 8. $R^{B5}$ and $R^{B6}$ are a hydrogen atom or a substituent group, and examples of the substituent group can include an alkyl group, an aryl group, and a heterocyclic group described as the substituent groups of $R^{E21}$, in Formula (P-2). However, $Y^{B1}$ is not connected to $R^{B5}$ or $R^{B6}$. $n^{B1}$ and $n^{B2}$ are an integer of 0 or 1.

Formula (P-12) is now described.

The substituent groups represented by $R^{D1}$, $R^{D2}$, $R^{D3}$, and $R^{D4}$ are the same with the substituent groups represented by $R^{B5}$ or $R^{B6}$ in Formula (P-10) and preferable ranges thereof are also the same. $n^{D1}$ and $n^{D2}$ are an integer of 0 to 4. $Y^{D1}$ is a vinyl group which is substituted at first and second positions, a phenylene ring, a pyridine ring, a pyrazine ring, a pyrimidine ring, or a methylene group having a carbon number of 1 to 8.

Substituent group A in the present specification can be defined as follows in the following explanation of the compounds group.

(Substituent Group A) an alkyl group (which has preferably a carbon number of 1 to 30, more preferably a carbon number of 1 to 20, and most preferably a carbon number of 1 to 10, and examples of which can include methyl, ethyl, iso-propyl, tert-butyl, n-octyl, n-decyl, n-hexadecyl, cyclopropyl, cyclopentyl, and cyclohexyl), an alkenyl group (which has preferably a carbon number of 2 to 30, more preferably a carbon number of 2 to 20, and most preferably a carbon number of 2 to 10, and examples of which can include vinyl, aryl, 2-butenyl, and 3-pentenyl), and alkinyl group (which has preferably a carbon number of 2 to 30, more preferably a carbon number of 2 to 20, and most preferably a carbon number of 2 to 10, and examples of which can include propargyl and 3-pentinyl), an aryl group (which has preferably a carbon number of 6 to 30, more preferably a carbon number of 6 to 20, and most preferably a carbon number of 6 to 12, and examples of which can include phenyl, p-methylphenyl, naphthyl, and anthranil), an amino group (which has preferably a carbon number of 0 to 30, more preferably a carbon number of 0 to 20, and most preferably a carbon number of 0 to 10, and examples of which can include amino, methyl amino, dimethyl amino, diethyl amino, dibenzyl amino, diphenyl amino, and ditolyl amino), an alkoxy group (which has preferably a carbon number of 1 to 30, more preferably a carbon number of 1 to 20, and most preferably a carbon number of 1 to 10, and examples of which can include methoxy, ethoxy, butoxy, and 2-ethylhexyloxy), an aryloxy group (which has preferably a carbon number of 6 to 30, more preferably a carbon number of 6 to 20, and most preferably a carbon number of 6 to 12, and examples of which can include phenyloxy, 1-naphtayloxy, and 2-naphthyloxy), and a heterocyclic oxy group (which has preferably a carbon number of 1 to 30, more preferably a carbon number of 1 to 20, and most preferably a carbon number of 1 to 12, and examples of which can include pyridyloxy, pyrazyloxy, pyrimidyloxy, and quinolyloxy).

An acyl group (which has preferably a carbon number of 1 to 30, more preferably a carbon number of 1 to 20, and most preferably a carbon number of 1 to 12, and examples of which can include acetyl, benzoyl, formyl, and pivaloyl), an alkoxycarbonyl group (which has preferably a carbon number of 2 to 30, more preferably a carbon number of 2 to 20, and most preferably a carbon number of 2 to 12, and examples of which can include methoxycarbonyl and ethoxycarbonyl), an aryloxycarbonyl group (which has preferably a carbon number of 7 to 30, more preferably a carbon number of 7 to 20, and most preferably a carbon number of 7 to 12, and examples of which can include phenyloxycarbonyl), an acyloxy group (which has preferably a carbon number of 2 to 30, more preferably a carbon number of 2 to 20, and most preferably a carbon number of 2 to 10, and examples of which can include acetoxy and benzoyloxy), an acyl amino group (which has preferably a carbon number of 2 to 30, more preferably a carbon number of 2 to 20, and most preferably a carbon number of 2 to 10, and examples of which can include acetyl amino and benzoyl amino), an alkoxycarbonyl amino group (which has preferably a carbon number of 2 to 30, more preferably a carbon number of 2 to 20, and most preferably a carbon number of 2 to 12, and examples of which can include methoxycarbonyl amino), and an aryloxycarbonyl amino group (which has preferably a carbon number of 7 to 30, more preferably a carbon number of 7 to 20, and most preferably a carbon number of 7 to 12, and examples of which can include phenyloxycarbonyl amino).

A sulfonyl amino group (which has preferably a carbon number of 1 to 30, more preferably a carbon number of 1 to 20, and most preferably a carbon number of 1 to 12, and examples of which can include methane sulfonyl amino and benzene sulfonyl amino), a sulfamoyl group (which has preferably a carbon number of 0 to 30, more preferably a carbon number of 0 to 20, and most preferably a carbon number of 0 to 12, and examples of which can include sulfamoyl, methylsulfamoyl, dimethylsulfamoyl, and phenylsulfamoyl), a carbamoyl group which has preferably a carbon number of 1 to 30, more preferably a carbon number of 1 to 20, and most preferably a carbon number of 1 to 12, and examples of which can include carbamoyl, methylcarbamoyl, diethylcarbamoyl, and phenylcarbamoyl), an alkylthio group (which has preferably a carbon number of 1 to 30, more preferably a carbon number of 1 to 20, and most preferably a carbon number of 1 to 12, and examples of which can include methylthio and ethylthio), an arylthio group (which has preferably a carbon number of 6 to 30, more preferably a carbon number of 6 to 20, and most preferably a carbon number of 6 to 12, and examples of which can include phenylthio), a heterocyclic thio group (which has preferably a carbon number of 1 to 30, more preferably a carbon number of 1 to 20, and most preferably a carbon number of 1 to 12, and examples of which can include pyridylthio, 2-benzimizolylthio, 2-benzoxazolylthio, and 2-benzthiazolylthio), and a sulfonyl group (which has preferably a carbon number of 1 to 30, more preferably a carbon number of 1 to 20, and most preferably a carbon number of 1 to 12, a examples of which can include mesyl and tosyl).

A sulfinyl group (which has preferably a carbon number of 1 to 30, more preferably a carbon number of 1 to 20, and most preferably a carbon number of 1 to 12, and examples of which can include methane sulfinyl and benzene sulfinyl), an ureido group (which has preferably a carbon number of 1 to 30, more preferably a carbon number of 1 to 20, and most preferably a carbon number of 1 to 12, and examples of which can include ureido, methylureido, and phenylureido), an amide phosphate group (which has preferably a carbon number of 1 to 30, more preferably a carbon number of 1 to 20, and most preferably a carbon number of 1 to 12, and examples of which can include diethyl amide phosphate and phenyl amide phosphate), an hydroxyl group, a mercapto group, a halogen atom (examples of which can include a fluorine atom, a chlorine atom, a bromine atom, and an iodine atom), a cyano group, a sulfo group, a carboxyl group, a nitro group, a hydroxamic group, a sulfino group, a hydrazino group, an imino group, a heterocyclic group (which has preferably a carbon number of 1 to 30 and more preferably a carbon number of 1 to 12 and which includes, for example, a nitrogen atom, an oxygen atom, and a sulfur atom as the hetero atom, examples of which can include imidazolyl, pyridyl, quinolyl, furyl, thienyl, piperidyl, morpholino, benzoxazolyl, benzimidazolyl, benzthiazolyl, carbazolyl, and azepinyl), a silyl group (which has preferably a carbon number of 3 to 40, more preferably a carbon number of 3 to 30, and most preferably a carbon number of 3 to 24, and examples of which can include trimethylsilyl and triphenylsilyl), and a silyloxy group (which has preferably a carbon number of 3 to 40, more preferably a carbon number of 3 to 30, and most preferably a carbon number of 3 to 24, and examples of which can include methylsilyloxy and triphenylsilyloxy). These substituent groups may be substituted again.

The groups of Substituent group A or the groups in Formulas (I), (II), (III), (IV), (IIA), (IIB), (IIC) and (IID) described below ($R^{P21}$, $R^{P22}$, $R^{P31}$, $R^{P32}$, $R^{P33}$, $R^{P41}$, $R^{P42}$, $R^{P51}$, $R^{P52}$, $R^{P53}$, $R^{P54}$, $R^{P55}$, $R^{P56}$, $R^{P61}$, and $R^{P62}$ are preferably selected from the following group: an alkyl group having a carbon number of 1 to 20, an alkenyl group having a carbon number of 2 to 10, an aryl group having a carbon number of 6 to 20, an amino group having a carbon number of 2 to 20, an alkoxy group having a carbon number of 1 to 20, an aryloxy group having a carbon number of 6 to 20, an acyl group having a carbon number of 2 to 20, an alkoxycarbonyl group having a carbon number of 2 to 20, an alkylthio group having a carbon number of 1 to 20, an arylthio group having a carbon number of 6 to 20, a sulfonyl group having a carbon number of 1 to 20, a hydroxyl group, a halogen atom, a cyano group, a nitro group, and a heterocyclic group having a ring member number of 5 to 7.

The complex represented by Formula (I) is now described. In Formula (I), $Z^1$ and $Z^2$ represent a nitrogen-containing 6-membered aromatic ring of which a nitrogen atom coordinates with platinum. Q represents a 5-membered aromatic ring containing one or two nitrogen atom. $L^1$ and $L^2$ represent a single bond or a connection group. n represents 0 or 1.

$Z^1$ and $Z^2$ represent a nitrogen-containing 6-membered aromatic ring of which a nitrogen atom coordinates with platinum. $Z^1$ and $Z^2$ are preferably one of pyridine, pyrazine, pyrimidine, pyridazine, and triazine, more preferably pyridine, pyrazine, and pyridine, still more preferably pyridine and pyrazine, and most preferably a pyridine. $Z^1$ and $Z^2$ may be equal to or different from each other. $Z^1$ and $Z^2$ may have a substituent group selected from the groups of Substituent group A.

The substituent group which $Z^1$ and $Z^2$ may have is preferably an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, and a heterocyclic group.

$Z^1$ and $Z^2$ may form a condensed ring with another ring. Examples of the ring to be condensed can include a benzene ring, a pyridine ring, a pyrazine ring, a pyrimidine ring, a pyridazine ring, a thiophene ring, a furan ring, a pyrrole ring, an imidazole ring, a pyrazole ring, a triazole ring, an oxazole ring, a thiazole ring, an oxadiazole ring, and a thiadiazole ring.

$Z^1$ and $Z^2$ are preferably one of a substituted or non-substituted pyridine ring, a pyrazine ring, and a pyrimidine ring, more preferably one of a non-substituted pyridine ring and a pyrazine ring, and still more preferably a non-substituted pyridine ring.

Q represents a nitrogen-containing 5-membered aromatic ring having one or two nitrogen atoms. That is, Q represents a group forming the nitrogen-containing 5-membered aromatic ring having one or two nitrogen atoms along with a carbon atom and a nitrogen atom expressed in $Z^1$-N—C—Pt (or $Z^2$-N—C—Pt). Examples of Q can include (non-)substituted pyrrole, pyrazole, and imidazole. Q is preferably one of (non-)substituted pyrrole and pyrazole, more preferably (non-)substituted pyrazole, still more preferably pyrazole having a substituent group at the third position, still more preferably pyrazole having an alkyl group or a cyano group at the third position, and most preferably pyrazole having a trifluoromethyl group, a t-butyl group, or a cyano group.

Q may have a substituent group and the substituent group is the same with those of Substituent group A. The substituent group of Q is preferably one of an alkyl group, an aryl group, a heterocyclic group, and a cyano group, more preferably one of an alkyl group and a cyano group, and still more preferably one of a trifluoromethyl group, a t-butyl group, and a cyano group.

Q may form a condensed ring with another ring. Examples of the ring to be condensed can include a benzene ring, a pyridine ring, a pyrazine ring, a pyrimidine ring, a pyridazine ring, a thiophene ring, a furan ring, a pyrrole ring, an imidazole ring, a pyrazole ring, a triazole ring, an oxazole ring, a thiazole ring, an oxadiazole ring, and a thiadiazole ring.

$L^1$ and $L^2$ represent a single bond or a 2-valence connection group. n represents 0 or 1. n is preferably 0. That is, when n is 0, two Q's do not form a ring by means of bonding. The 2-valence connection group is not particularly limited, but preferably a connection group including a carbon atom, a nitrogen atom, an oxygen atom, a sulfur atom or a silicon atom. Specific examples of the 2-valence connection group are described below, but the present invention is not limited to the examples.

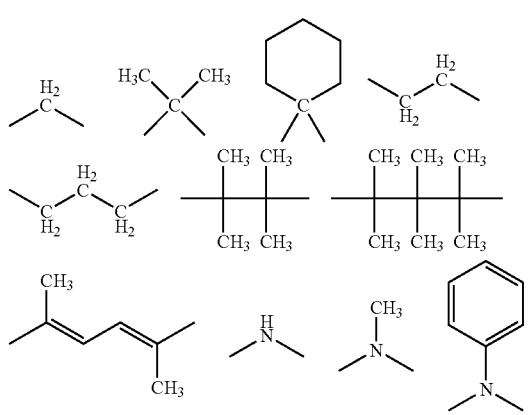

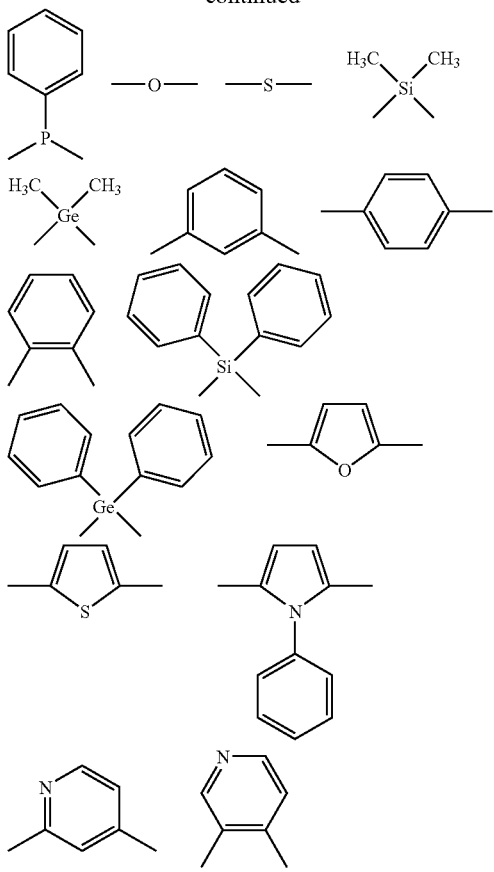

These connection groups may further have a substituent group and the substituent groups of $Z^1$ and $Z^2$ can be used as the substituent group to be introduced $L^1$ is preferably one of a dialkyl methylene group, a diaryl methylene group, and diheteroaryl methylene group, more preferably one of a dimethyl methylene group and a diphenyl methylene group, and most preferably a dimethyl methylene group. $L^2$ is preferably one of a dialkyl methylene group, a diaryl methylene group, an ethylene group, a dialkyl ethylene group, a trialkyl ethylene group, a tetraalkyl ethylene group and a tetraaryl ethylene group, more preferably one of a dialkyl methylene group, a diaryl methylene group, an ethylene group and a tetraalkyl ethylene group, more preferably one of a dialkyl methylene group, an ethylene group and a tetraalkyl ethylene group.

The complex represented by Formula (I) is preferably a complex represented by Formula (II). In Formula (II), $Z^1$ and $Z^2$ represent a nitrogen-containing 6-membered aromatic ring of which a nitrogen atom coordinates with platinum. $L^1$ represents a single bond or a 2-valence connection group. $L^1$ is the same with that of Formula (I), and a preferable range thereof is also the same. $R^{P21}$ and $R^{P22}$ represent a hydrogen atom or a substituent group, independently, and the substituent group is the same with those of Substituent group A. $R^{P21}$ and $R^{P22}$ substituted with the same pyrazole ring may form a condensed ring by means of connection. $R^{P22}$ may form a ring by bonding to $R^{P22}$ substituted with another pyrazole.

$R^{P21}$ is preferably one of a hydrogen atom, a methyl group, a trifluoromethyl group, a t-butyl group, and a cyano group, more preferably one of a methyl group, a trifluoromethyl group, a t-butyl group, and a cyano group, and still more preferably one of a trifluoromethyl group, a t-butyl group, and cyano group.

$R^{P22}$ is preferably one of a hydrogen atom, a methyl group, a trifluoromethyl group, a t-butyl group, a cyano group, and groups forming substituted or non-substituted methylene or ethylene by means of connection between $R^{P22}$, more preferably one of a hydrogen atom, a cyano group, and groups forming substituted or non-substituted methylene or ethylene by means of connection between $R^{P22}$, still more preferably one of a hydrogen atom and groups forming substituted or non-substituted methylene or ethylene by means of connection between $R^{P22}$, and most preferably a hydrogen atom.

The complex represented by Formula (I) is preferably a complex represented by Formula (III). In Formula (III), $Z^1$ and $Z^2$ represent a nitrogen-containing 6-membered aromatic ring of which a nitrogen atom coordinates with platinum. $L^1$ represents a single bond or a 2-valence connection group. $L^1$ is the same with that of Formula (I), and a preferable range thereof is also the same. $R^{P31}$, $R^{P32}$, and $R^{P33}$ represent a hydrogen atom or a substituent group, independently, and the substituent group is the same with those of Substituent group A. $R^{P31}$ and $R^{P32}$, and $R^{P32}$ and $R^{P33}$ may form a condensed ring by means of connection therebetween.

Examples of the condensed ring formed by connection between $R^{P31}$ and $R^{P32}$ and between $R^{P32}$ and $R^{P33}$ can include a benzene ring, a pyridine ring, a pyrazine ring, a pyrimidine ring, a pyridazine ring, a pyrrole ring, a pyrazole ring, an imidazole ring, an oxazole ring, a thiazole ring, an isothiazole ring, and an isooxazole ring. Among them, a benzene ring, a pyridine ring, a pyrimidine ring, and a pyrazine ring are preferable. The rings may be condensed with another ring.

$R^{P13}$ is preferably one of a hydrogen atom, an alkyl group, an aryl group, a cyano group, and a group forming a condensed ring with $R^{P32}$, more preferably one of a hydrogen atom, a methyl group, a t-butyl group, a phenyl group, a cyano group, a trifluoromethyl group, and a group forming a condensed ring with $R^{P32}$, and still more preferably one of a methyl group, a t-butyl group, and a group forming a condensed ring with $R^{P32}$.

$R^{P32}$ is preferably one of a hydrogen atom, an alkyl group, an aryl group, a cyano group, a group forming a condensed ring with $R^{P31}$, and a group forming a condensed ring with $R^{P33}$, more preferably one of a hydrogen atom, a methyl group, a t-butyl group, a phenyl group, a cyano group, a trifluoromethyl group, a group forming a condensed ring with $R^{P31}$, and a group forming a condensed ring with $R^{P33}$, and still more preferably one of a t-butyl group, a cyano group, a trifluoromethyl group, and a group forming a condensed ring with $R^{P31}$.

$R^{P33}$ is preferably one of a hydrogen atom, an alkyl group, an aryl group, a cyano group, and a group forming a condensed ring with $R^{P32}$, more preferably one of a hydrogen atom, a methyl group, and a group forming a condensed ring with $R^{P32}$, and still more preferably one of a hydrogen atom and a group forming a condensed ring with $R^{P32}$.

The complex represented by Formula (I) is preferably a complex represented by Formula (IV). Formula (IV) is described. In Formula (IV), $Z^1$ and $Z^2$ represent a nitrogen-containing 6-membered aromatic ring of which a nitrogen atom coordinates with platinum. $L^1$ represents a single bond or a 2-valence connection group. $L^1$ is the same with that of Formula (I), and a preferable range thereof is also the same. $R^{P41}$ and $R^{P42}$ represent a hydrogen atom or a substituent group, independently, and as the substituent group is used the substituent groups selected from the groups of Substituent group A. $R^{P41}$ and $R^{P42}$ may form a condensed ring by means of connection therebetween. Examples of the condensed ring formed by connection between $R^{P41}$ and $R^{P42}$ can include a benzene ring, a pyridine ring, a pyrazine ring, a pyrimidine ring, a pyridazine ring, a pyrrole ring, a pyrazole ring, an imidazole ring, an oxazole ring, a thiazole ring, an isothiazole ring, and an isooxazole ring. Among them, a benzene ring, a pyridine ring, a pyrimidine ring, and a pyrazine ring are preferable. The rings may be condensed with another ring.

$R^{P41}$ is preferably one of a hydrogen atom, an alkyl group, an aryl group, a cyano group, and a group forming a condensed ring with $R^{P42}$, more preferably one of a hydrogen atom, a methyl group, a t-butyl group, a phenyl group, a cyano group, a trifluoromethyl group, and a group forming a condensed ring with $R^{P42}$, and still more preferably one of a methyl group, a cyano group, and a group forming a condensed ring with $R^{P42}$.

$R^{P42}$ is preferably one of a hydrogen atom, an alkyl group, an aryl group, a cyano group, and a group forming a condensed ring with $R^{P41}$, more preferably one of a hydrogen atom, a methyl group, a t-butyl group, a phenyl group, a cyano group, a trifluoromethyl group, and a group forming a condensed ring with $R^{P41}$, and still more preferably one of a methyl group, a cyano group, and a group forming a condensed ring with $R^{P41}$.

The complex represented by Formula (II) is preferably a complex represented by Formula (IIA). Formula (IIA) is described. In Formula (IIA), $L^1$ represents a single bond or a 2-valence connection group. $L^1$ is the same with that of Formula (I), and a preferable range thereof is also the same. $R^{P21}$, $R^{P22}$, $R^{P51}$, $R^{P52}$, $R^{P53}$, $R^{P54}$, $R^{P55}$, and $R^{P56}$ represent a hydrogen atom or a substituent group. $R^{P21}$ and $R^{P22}$ are the same with those of Formula (II) and preferable ranges thereof are also the same. $R^{P51}$ to $R^{P56}$ represent a hydrogen atom or a substituent group. The substituent groups represented by $R^{P51}$ to $R^{P56}$ are the same with those of Substituent group A. $R^{P51}$ to $R^{P56}$ may form a condensed ring by means of connection therebetween.

$R^{P51}$ and $R^{P54}$ are preferably one of a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, and a heterocyclic group, more preferably one of a hydrogen atom, an alkyl group, an aryl group, a halogen atom, a cyano group, a nitro group, and a heterocyclic group, still more preferably one of a hydrogen atom, a methyl group, a t-butyl group, a trifluoromethyl group, a phenyl group, a fluorine atom, a cyano group, and a pyridyl group, still more preferably one of a hydrogen atom, a methyl group, and a fluorine atom, and most preferably a hydrogen atom.

$R^{P53}$ and $R^{P56}$ have the same preferable ranges as those of $R^{P51}$ and $R^{P54}$.

$R^{P52}$ and $R^{P55}$ are preferably one of a hydrogen atom, an alkyl group, an aryl group, an amino group, an alkoxy group, an aryloxy group, an alkylthio group, an arylthio group, a halogen atom, a cyano group, and a heterocyclic group, more preferably one of a hydrogen atom, an alkyl group, an aryl group, an amino group, an alkoxy group, an aryloxy group, and a heterocyclic group, still more preferably one of a hydrogen atom, a methyl group, a t-butyl group, a dimethyl amino group, a diphenyl amino group, a methoxy group, and a carbazolyl group, and most preferably a hydrogen atom.

The complex represented by Formula (IIA) is preferably a complex represented by Formula (IIB). Formula (IIB) is described. In Formula (IIB), $R^{P21}$, $R^{P22}$, $R^{P51}$, $R^{P52}$, $R^{P53}$, $R^{P54}$, $R^{P55}$, $R^{P56}$, $R^{P61}$, and $R^{P62}$ represent a hydrogen atom or a substituent group. $R^{P21}$ and $R^{P22}$ are the same with those of Formula (II) and preferable ranges thereof are also the same. $R^{P51}$ to $R^{P56}$ are the same with those of Formula (IIA) and preferable ranges thereof are also the same. $R^{P61}$ and $R^{P62}$ represent a hydrogen atom or a substituent group. The substituent groups represented by $R^{P61}$ and $R^{P62}$ are the same with those of Substituent group A. $R^{P61}$ and $R^{P62}$ are preferably one of a hydrogen atom, an alkyl group, an aryl group, a halogen atom, a cyano group, and a heterocyclic group, more preferably one of a hydrogen atom, a methyl group, a trifluoromethyl group, a phenyl group, a fluorine atom, a cyano group, and a pyridyl group, still more preferably one of a methyl group, a phenyl group, and a pyridyl group, and most preferably a methyl group.

The complex represented by Formula (IIB) is preferably a complex represented by Formula (IIC). Formula (IIC) is described. In Formula (IIC), $R^{P21}$, $R^{P22}$, $R^{P51}$, $R^{P52}$, $R^{P53}$, $R^{P54}$, $R^{P55}$, and $R^{P56}$ represent a hydrogen atom or a substituent group. $R^{P21}$ and $R^{P22}$ are the same with those of Formula (II) and preferable ranges thereof are also the same. $R^{P51}$ to $R^{P56}$ are the same with those of Formula (IIA) and preferable ranges thereof are also the same.

The complex represented by Formula (IIC) is preferably a complex represented by Formula (IID). Formula (IID) is described. In Formula (IID), $R^{P51}$, $R^{P52}$, $R^{P53}$, $R^{P54}$, $R^{P55}$, and $R^{P56}$ represent a hydrogen atom or a substituent group. $R^{P21}$ is a substituent group. $R^{P51}$ to $R^{P56}$ are the same with those of Formula (IIA) and preferable ranges thereof are also the same. $R^{P23}$ are the same with those of Substituent group A. $R^{P21}$ is preferably one of an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, and a heterocyclic group, more preferably one of an alkyl group, an aryl group, a sulfonyl group, a halogen atom, a cyano group and a heterocyclic group, still more preferably one of a alkyl group, a perfluoroalkyl group, an aryl group, a perfluoroaryl group, a sulfonyl group, a halogen atom, a cyano group, and a heterocyclic group, still more preferably one of a methyl group, a t-butyl group, a trifluoromethyl group, a phenyl group, a tolyl group, a pentafluorophenyl group, a mesyl group, a tosyl group, a fluorine atom, a cyano group, and a pyridyl group, still more preferably one of a methyl group, a t-butyl group, a trifluoromethyl group, and a cyano group, and still more preferably one of a t-butyl group, a trifluoromethyl group, and a cyano group.

In Formula (IID), $R^{P51}$, $R^{P53}$, $R^{P54}$ and $R^{P56}$ are all preferably a hydrogen atom.

Examples of the platinum complex which can be used for the electroluminescent device according to the present invention can include Compounds (1) to (6), Compounds (12) to (97), Compounds (138) to (140), Compounds (144) to (152), and Compounds (178) to (242) described in International Publication No. WO 2004/108859. Examples of compounds are further described below, but the present invention is not limited to the examples.

P-1

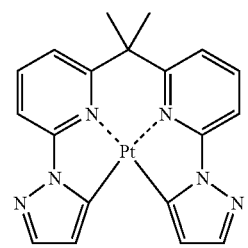

-continued
P-2
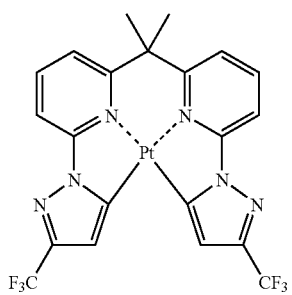
P-3
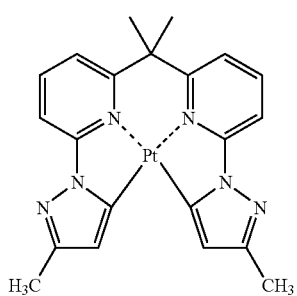
P-4
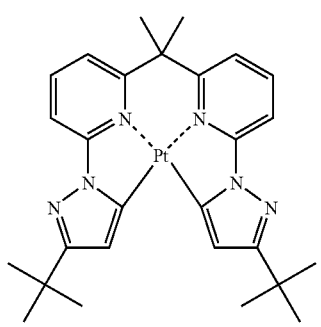
P-5
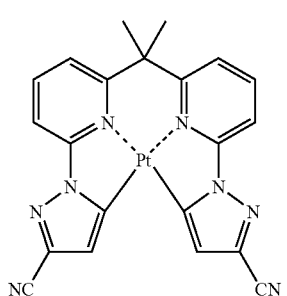
P-6
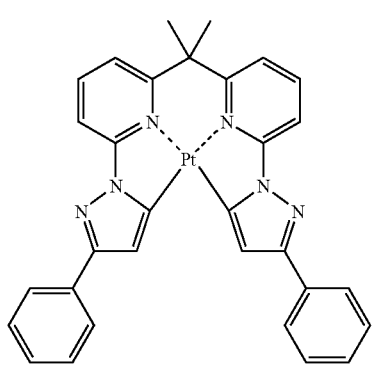
-continued
P-7
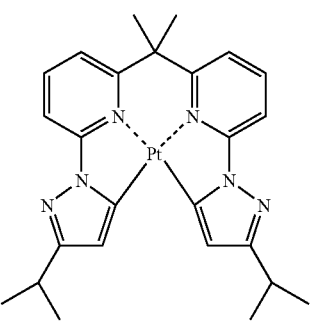
P-8
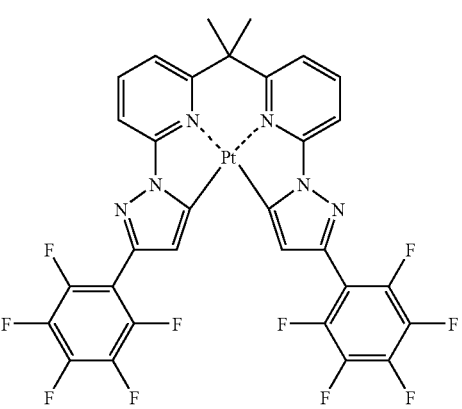
P-9
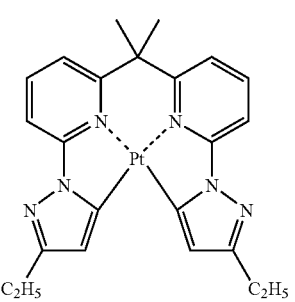
P-10
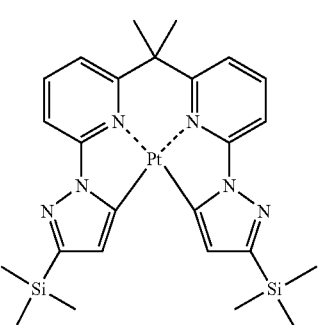

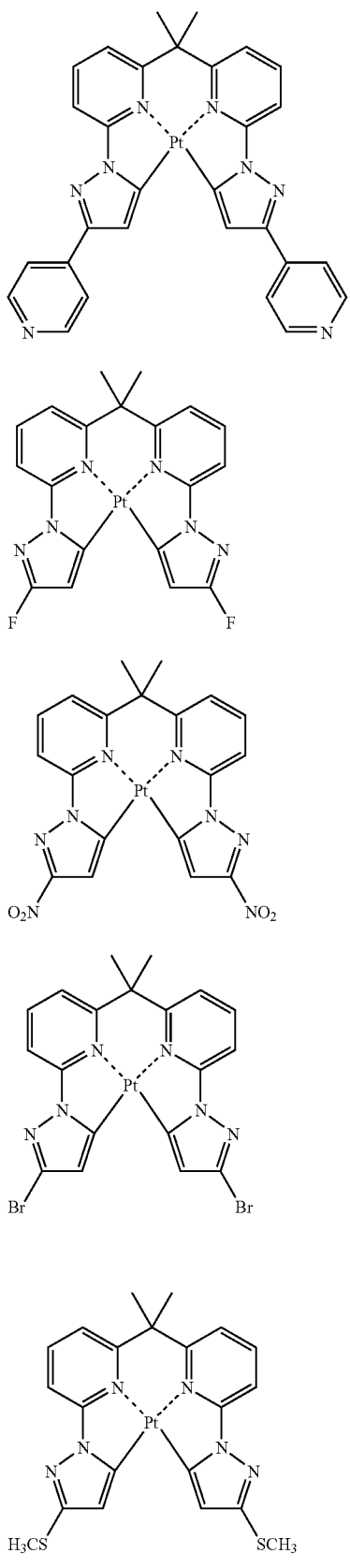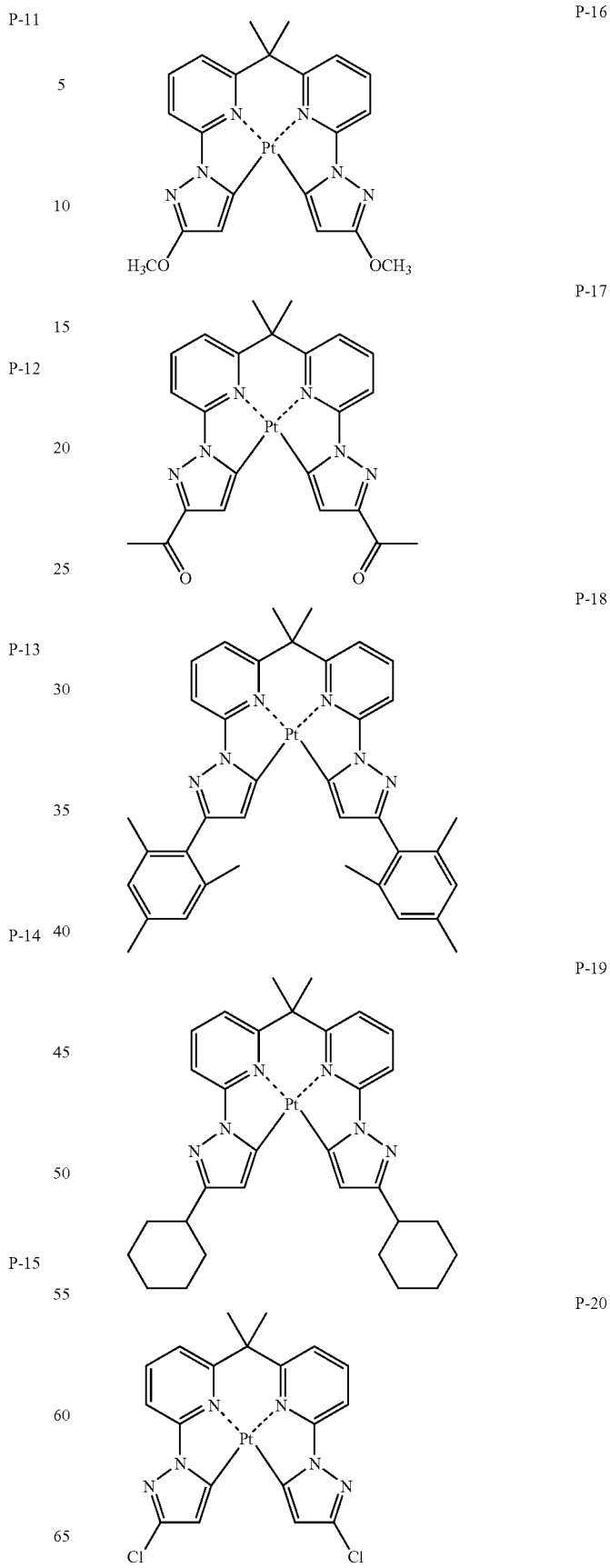

P-21 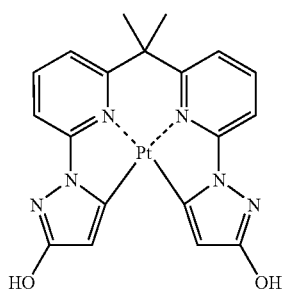
P-22 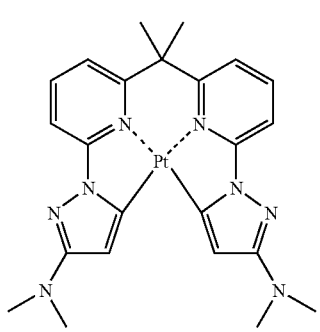
P-23 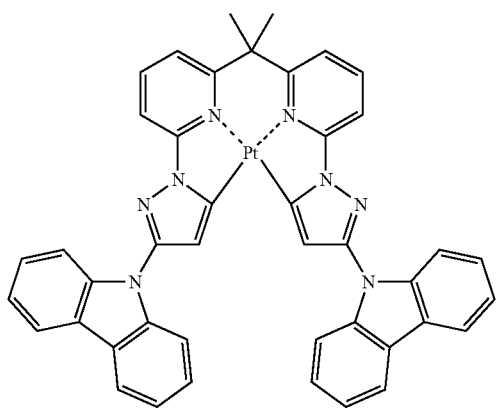
P-24 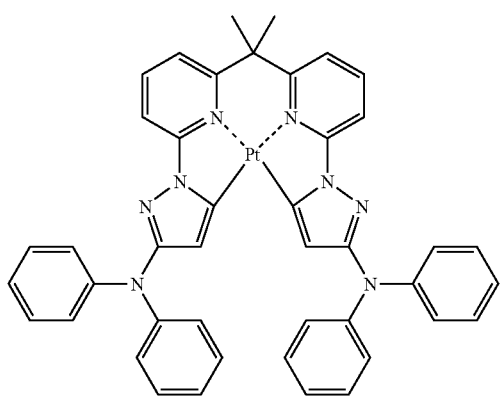
P-25 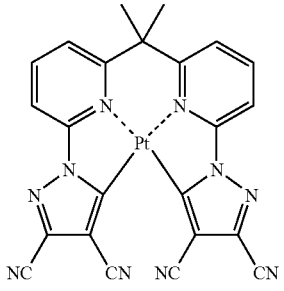
P-26 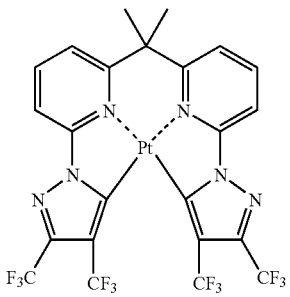
P-27 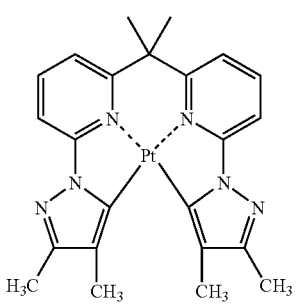
P-28 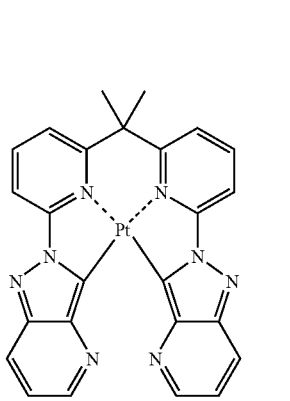
P-29 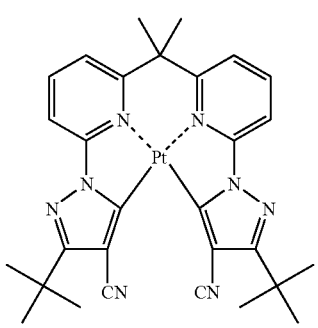

-continued
P-30
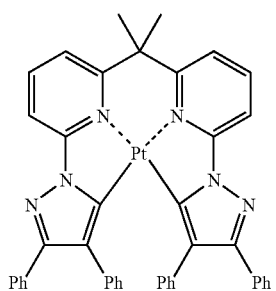
P-31
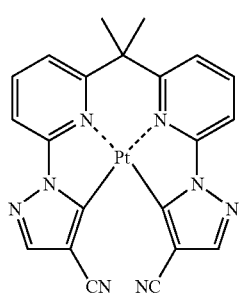
P-32
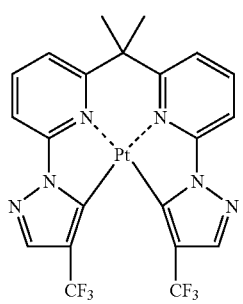
P-33
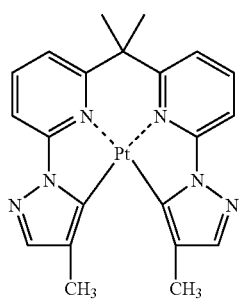
P-34
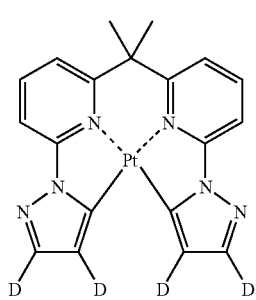
-continued
P-35
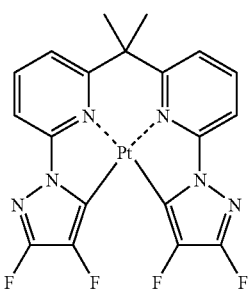
P-36
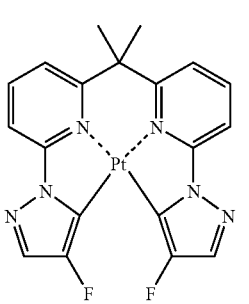
P-37
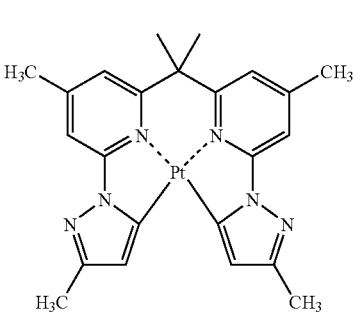
P-38
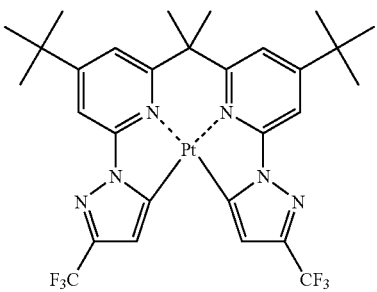
P-39
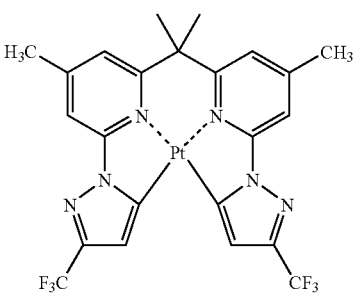

-continued
P-40
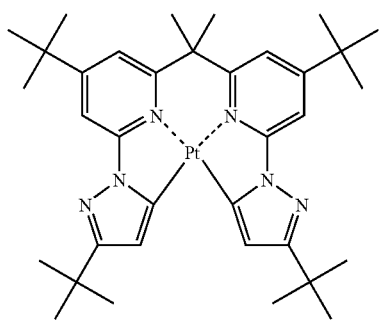
P-41
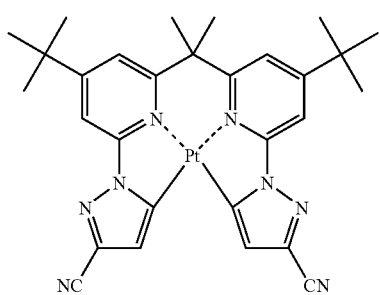
P-42
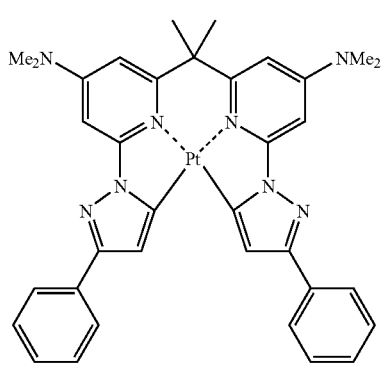
P-43
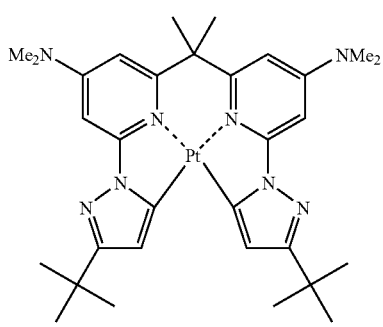
P-44
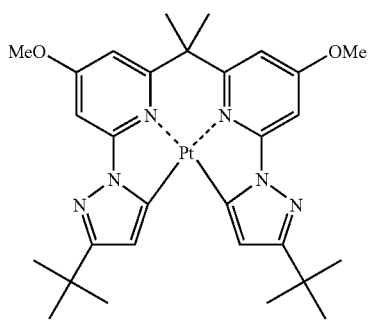
-continued
P-45
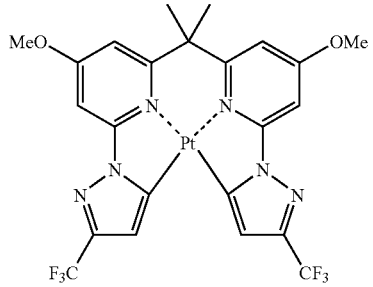
P-46
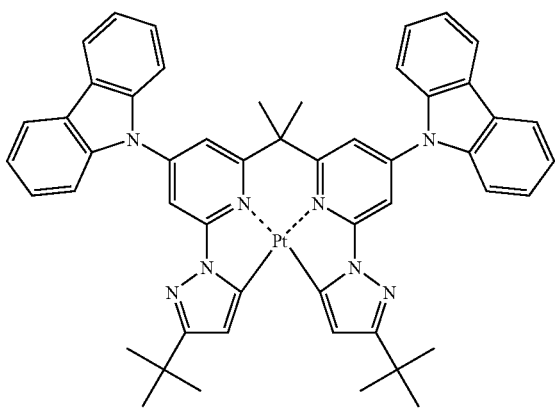
P-47
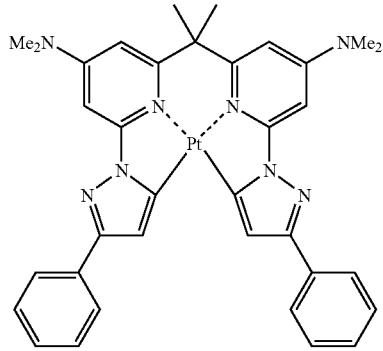
P-48
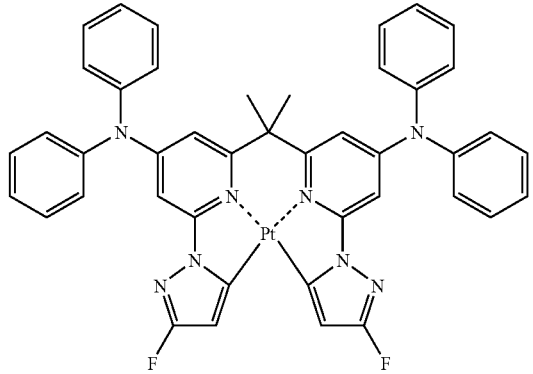

P-49
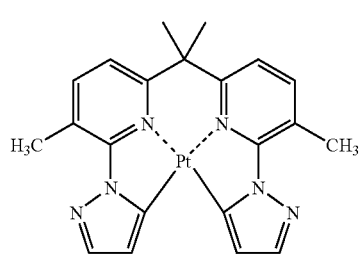
P-50
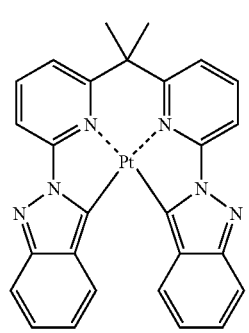
P-51
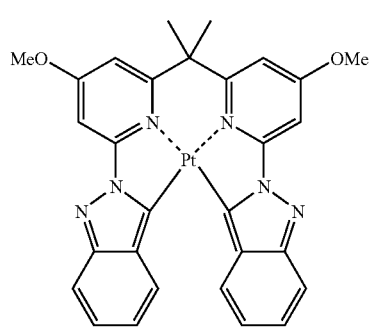
P-52
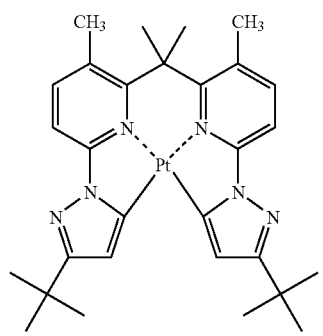
P-53
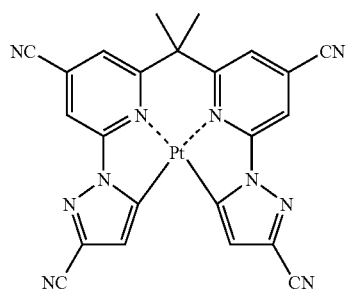
P-54
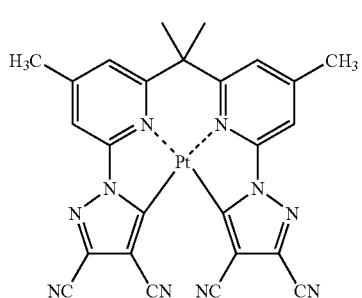
P-55
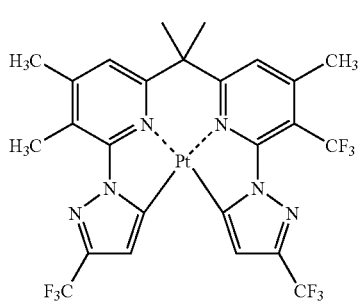
P-56
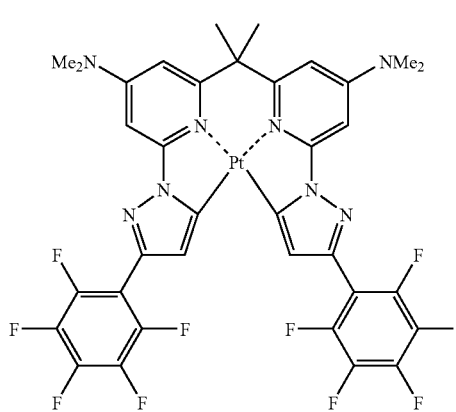
P-57
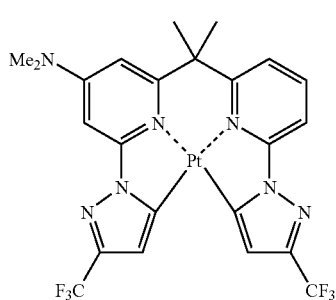
P-58
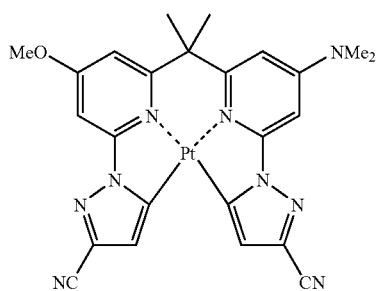

P-59 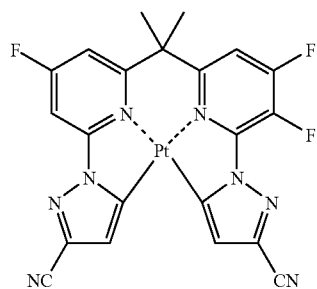
P-60 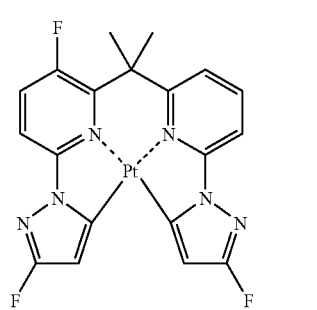
P-61 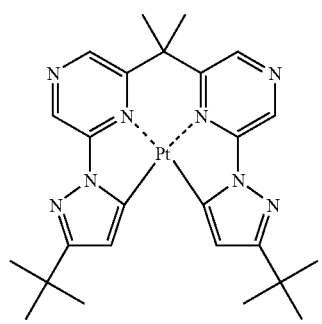
P-62 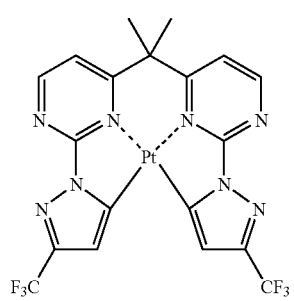
P-63 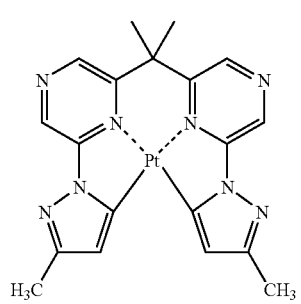
P-64 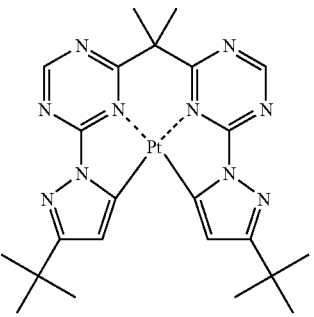
P-65 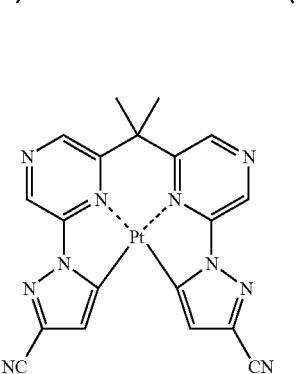
P-66 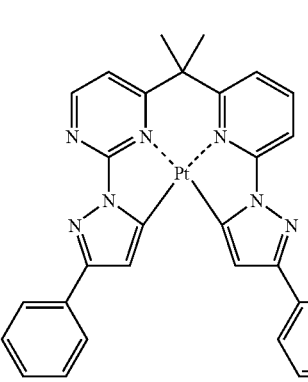
P-67 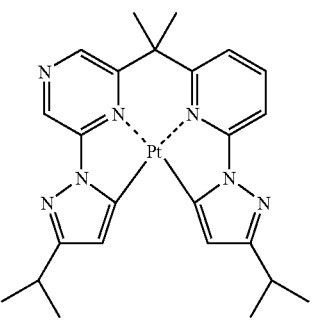
P-68 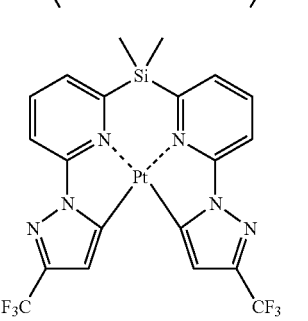

107
-continued
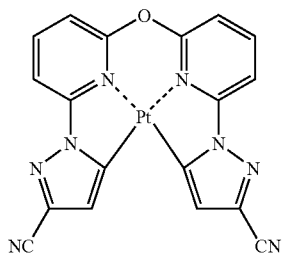
P-69
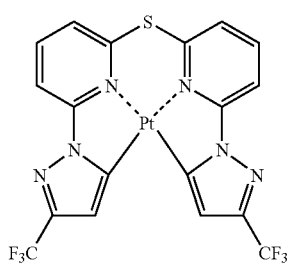
P-70
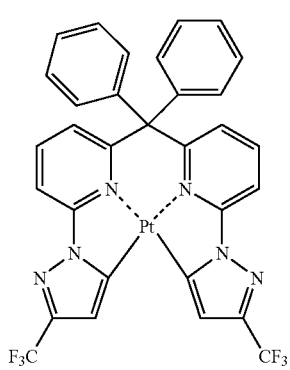
P-71
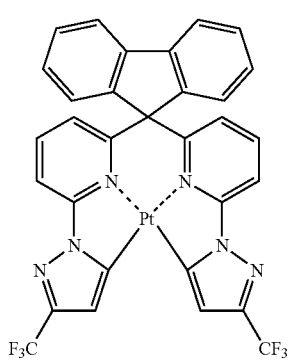
P-72
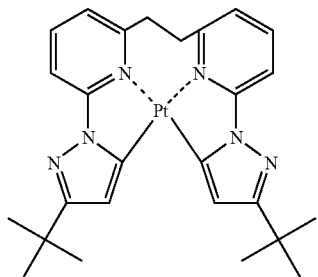
P-73
108
-continued
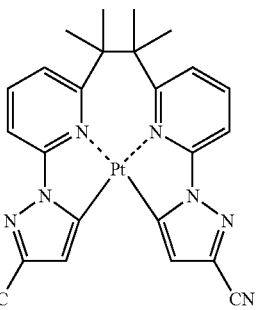
P-74
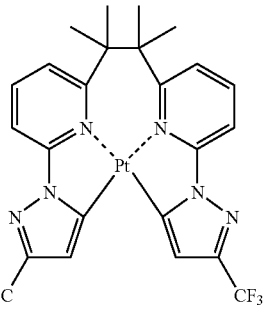
P-75
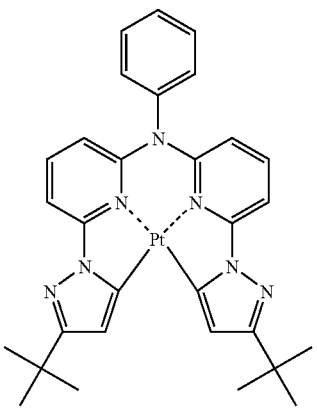
P-76
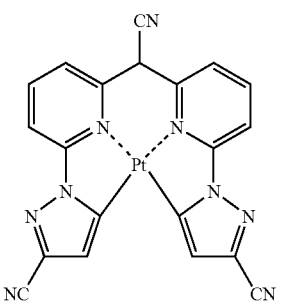
P-77

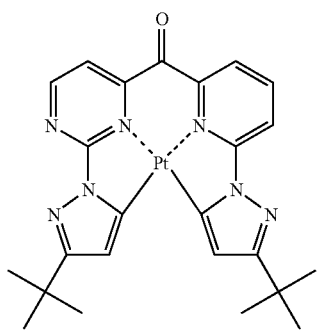
P-78
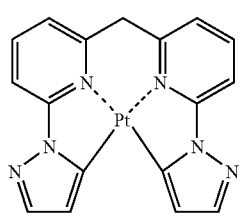
P-79
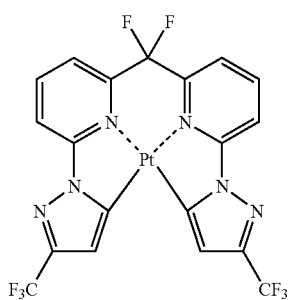
P-80
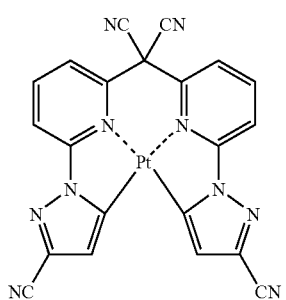
P-81
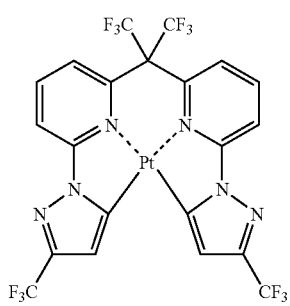
P-82
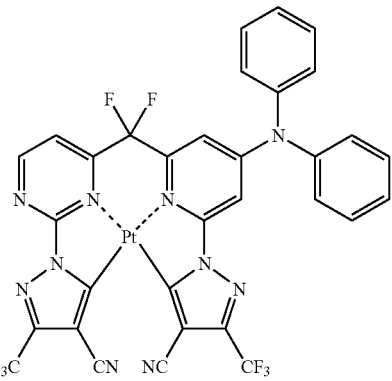
P-83
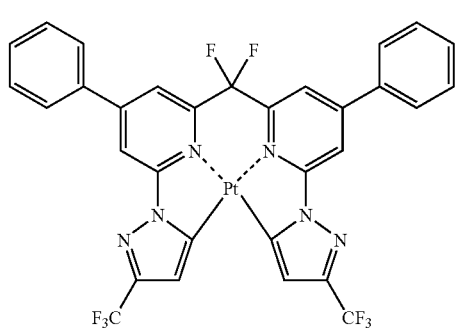
P-84
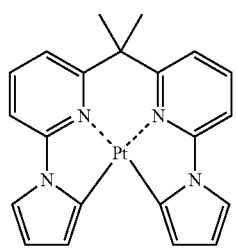
P-85
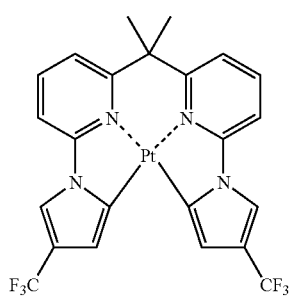
P-86
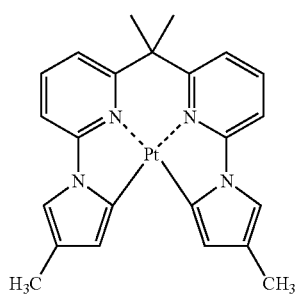
P-87

P-88
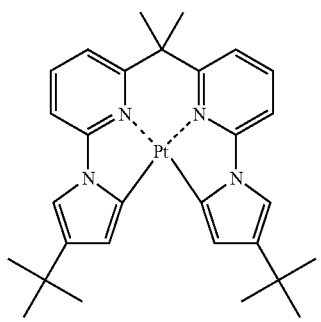
P-89
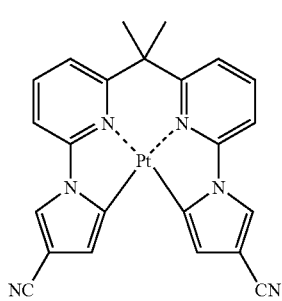
P-90
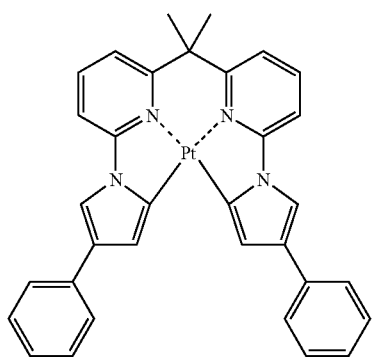
P-91
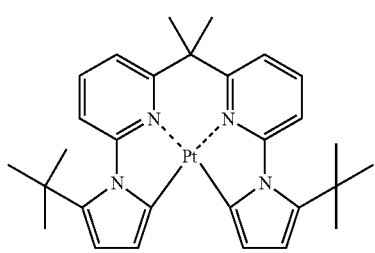
P-92
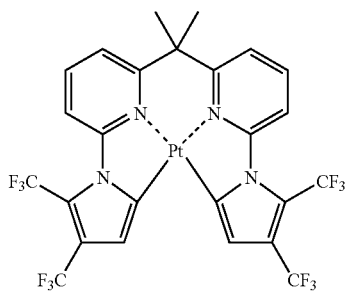
P-93
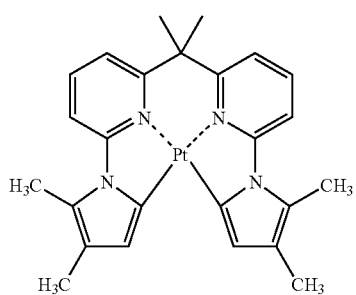
P-94
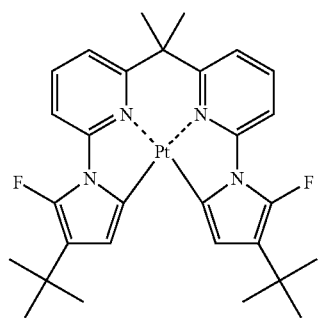
P-95
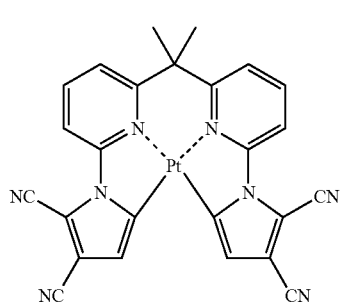
P-96
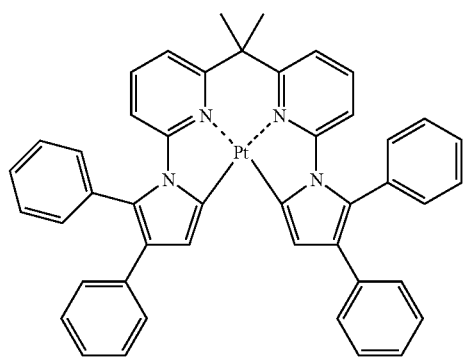
P-97
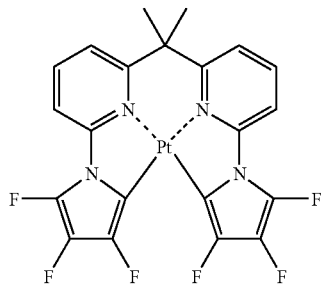

P-98
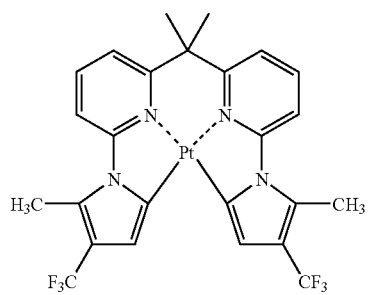
P-99
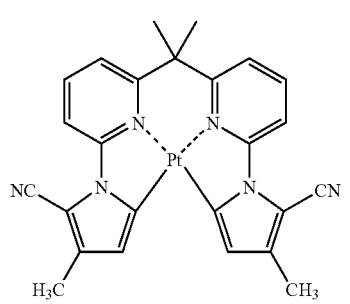
P-100
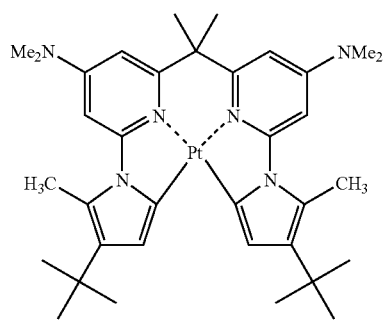
P-101
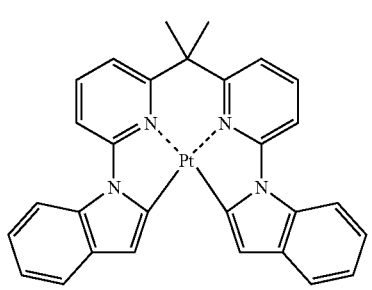
P-102
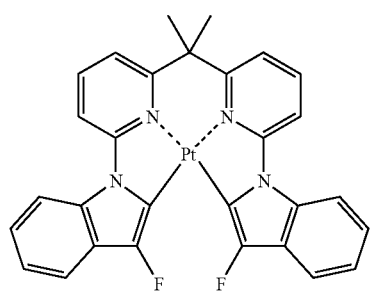
P-103
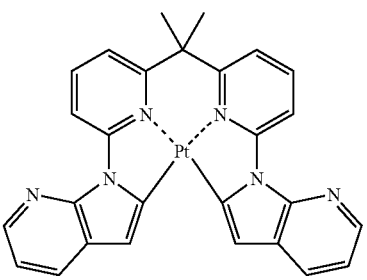
P-104
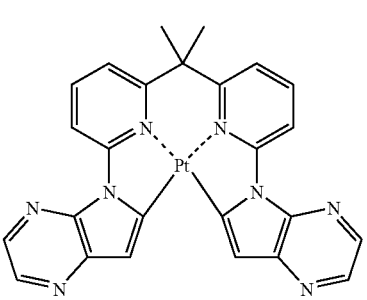
P-105
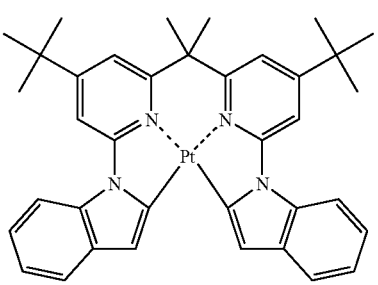
P-106
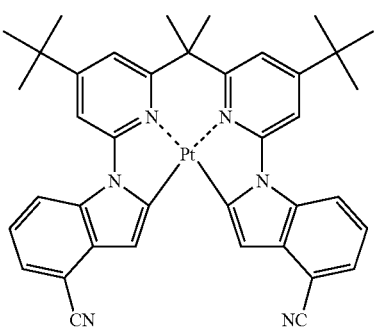
P-107
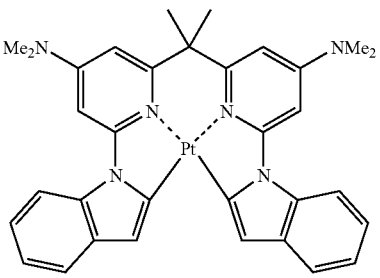

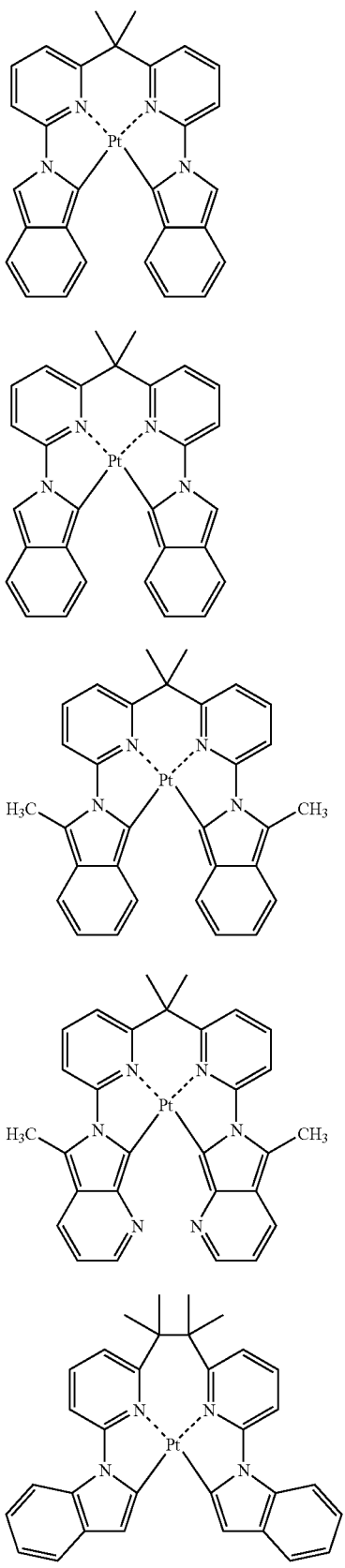
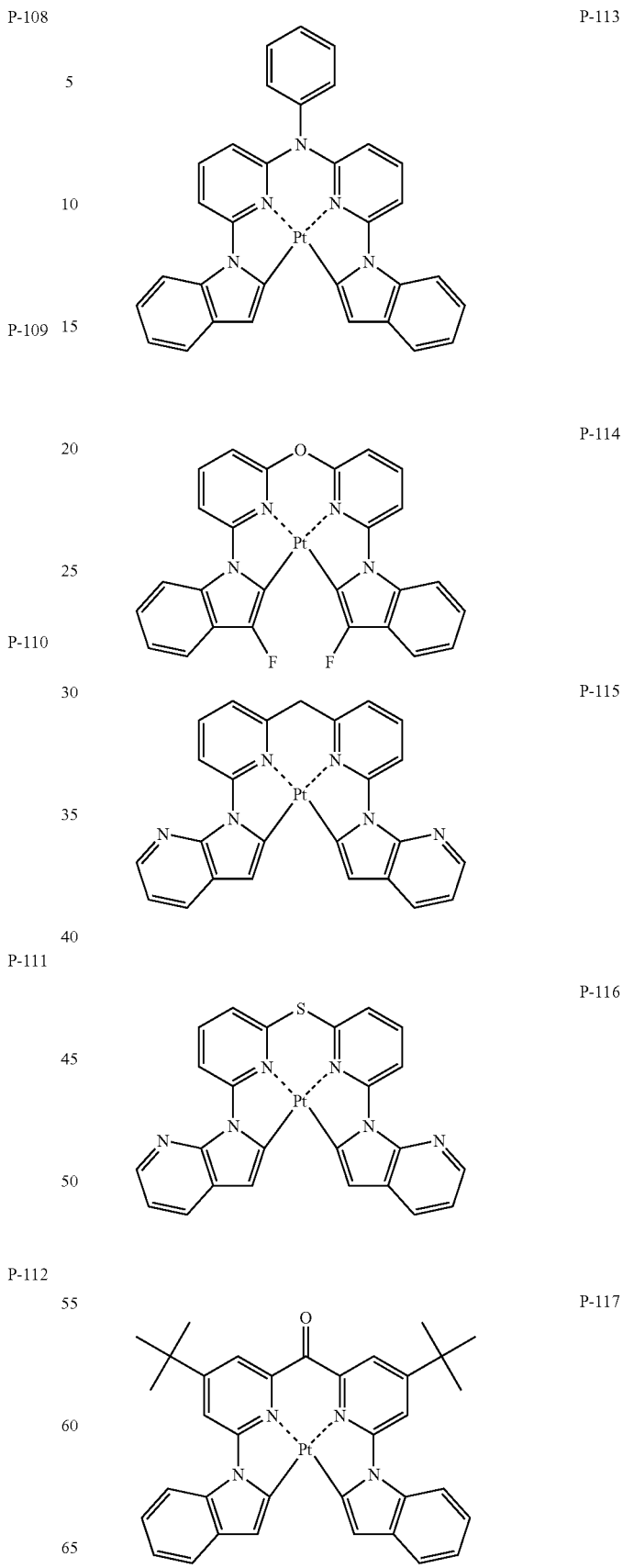

P-118 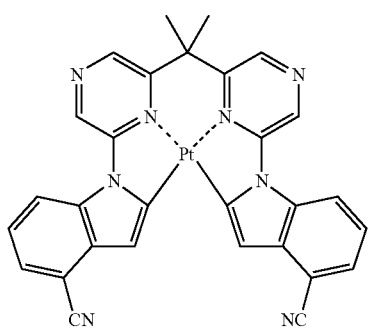
P-119 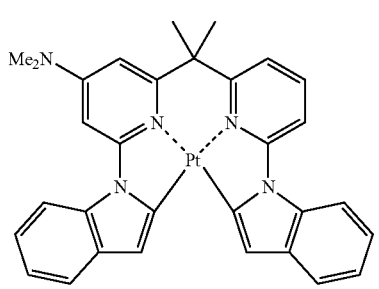
P-120 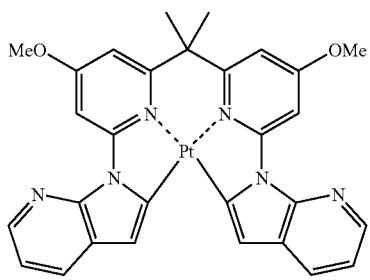
P-121 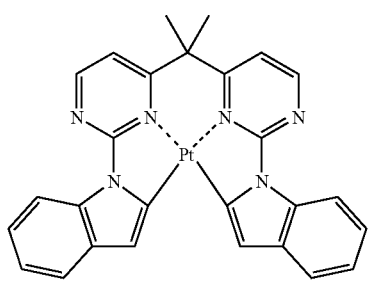
P-122 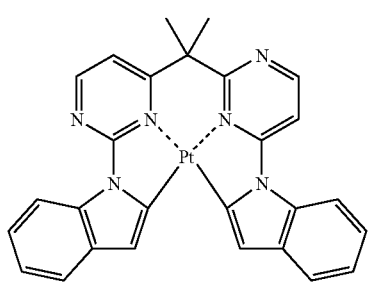
P-123 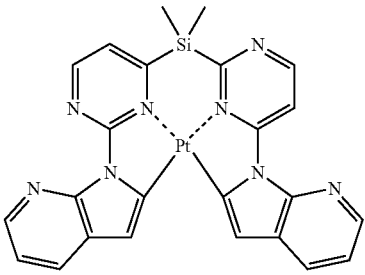
P-124 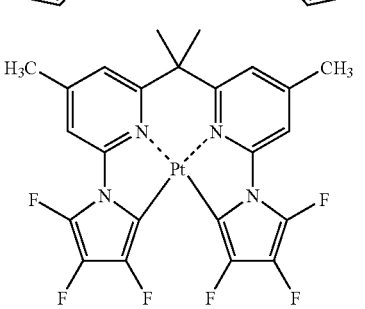
P-125 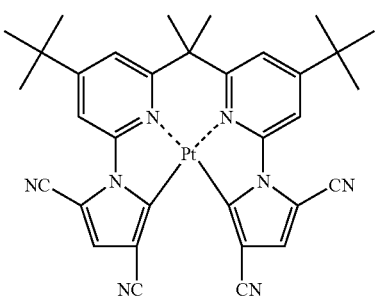
P-126 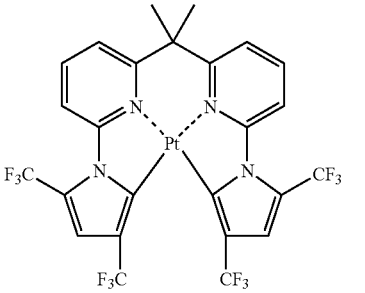
P-127 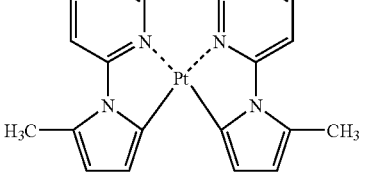
P-128 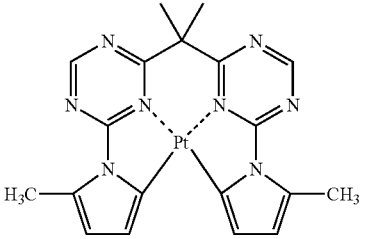

P-129 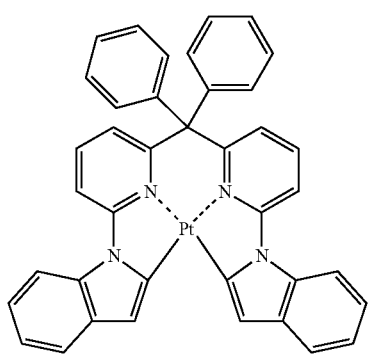
P-130 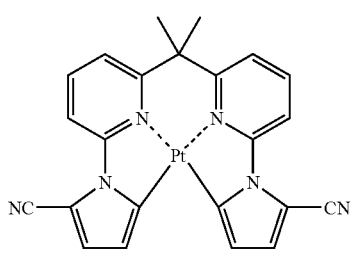
P-131 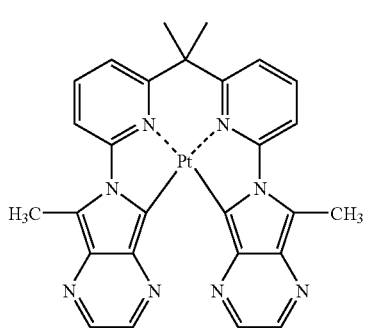
P-132 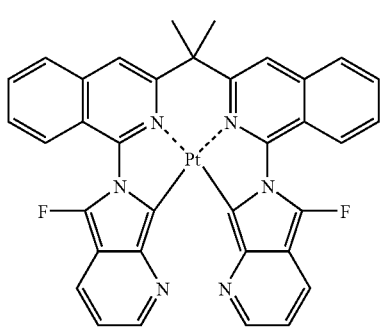
P-133 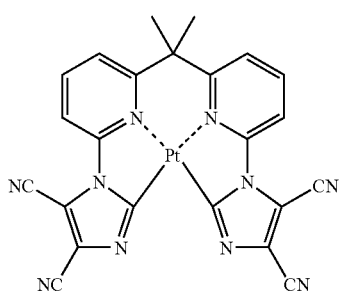
P-134 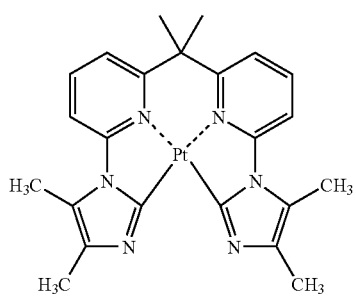
P-135 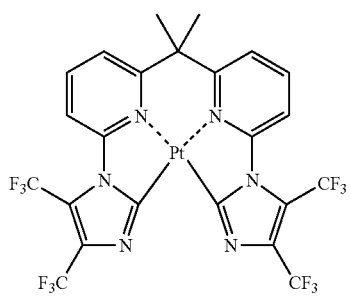
P-136 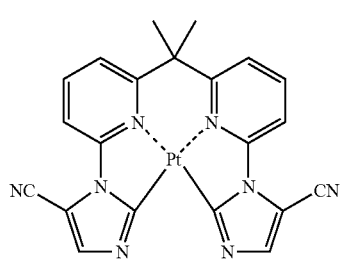
P-137 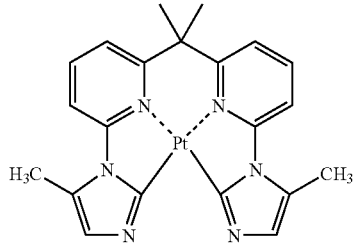
P-138 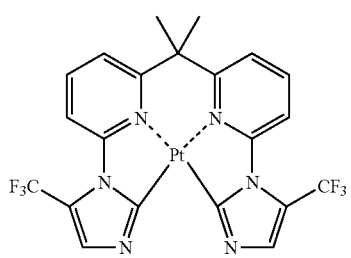
P-139 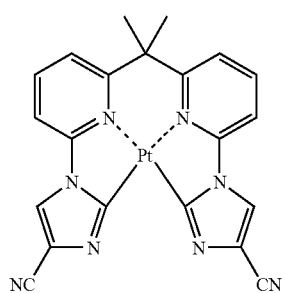

P-140 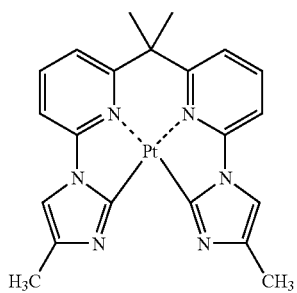
P-141 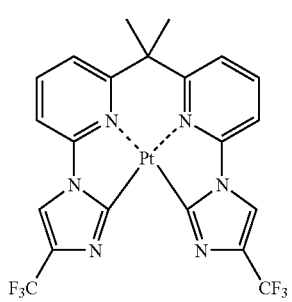
P-142 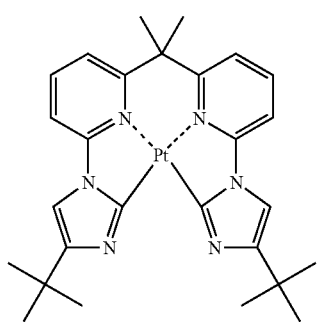
P-143 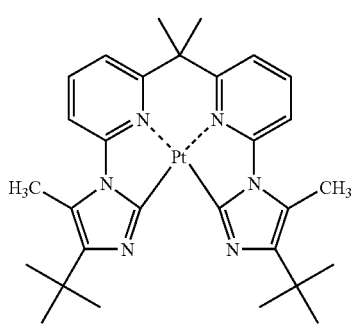
P-144 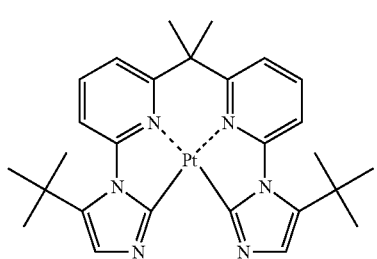
P-145 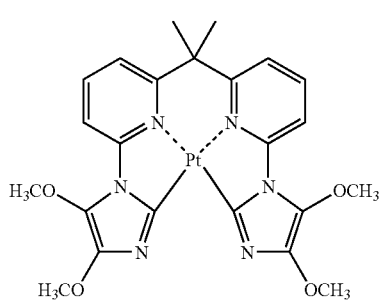
P-146 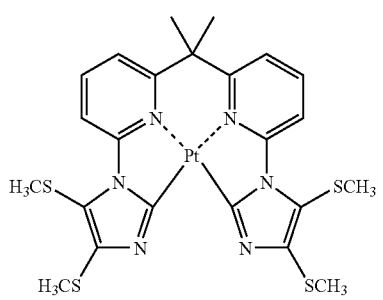
P-147 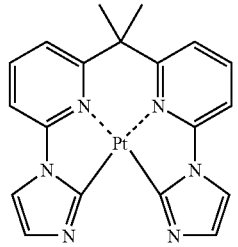
P-148 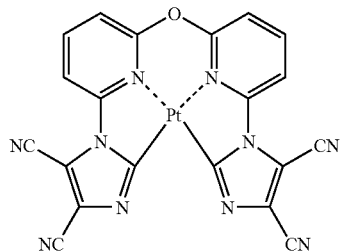
P-149 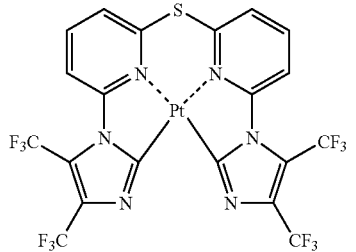
P-150 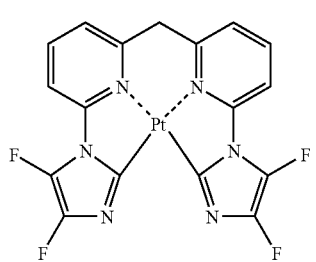

123
-continued
P-151
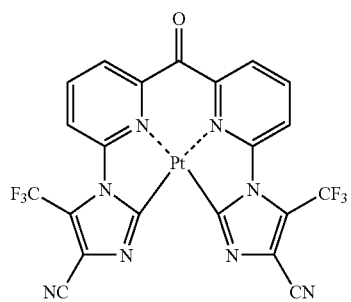
P-152
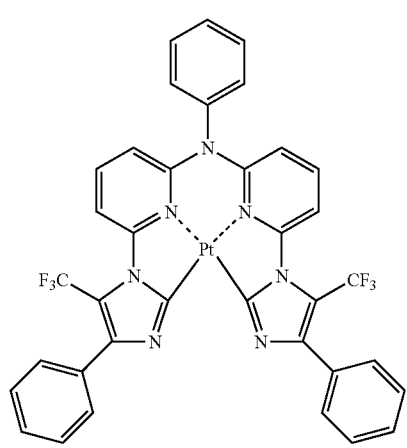
P-153
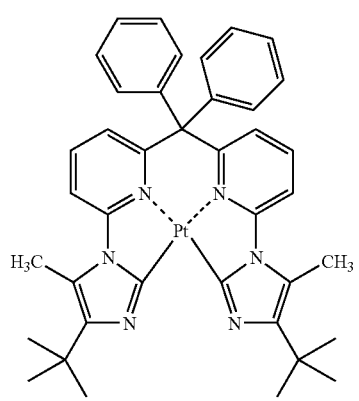
P-154
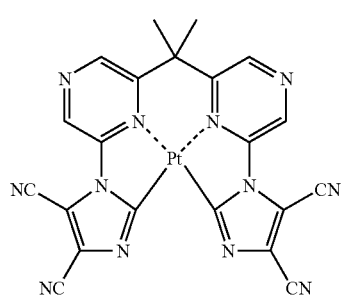
124
-continued
P-155
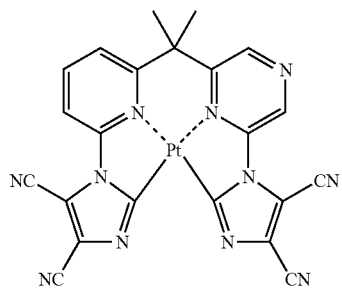
P-156
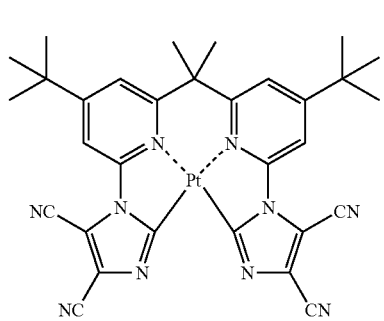
P-157
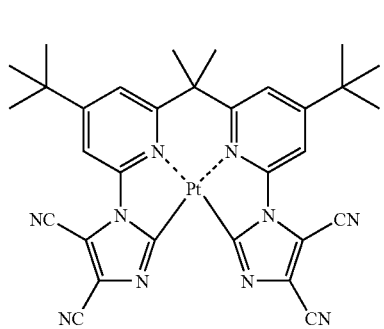
P-158
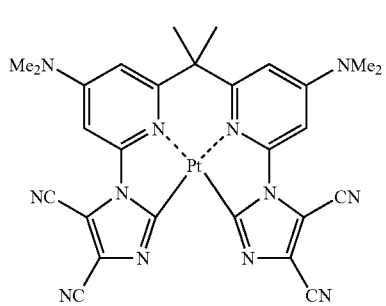
P-159
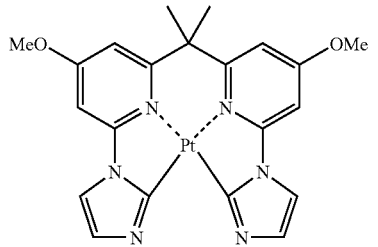

P-160 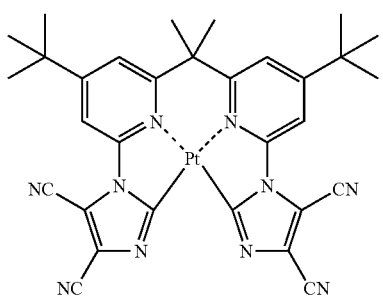
P-161 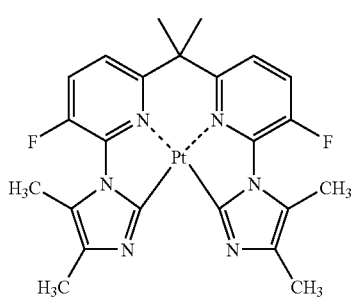
P-162 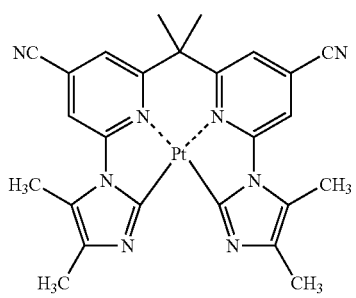
P-163 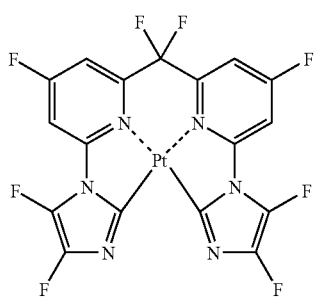
P-164 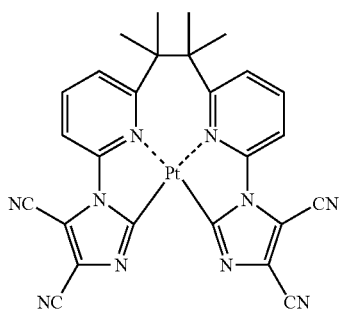
P-165 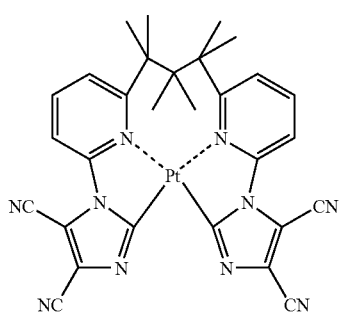
P-166 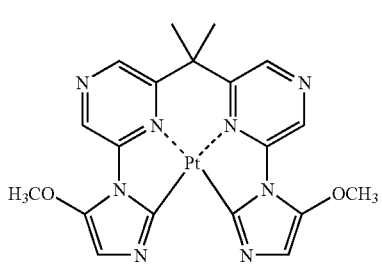
P-167 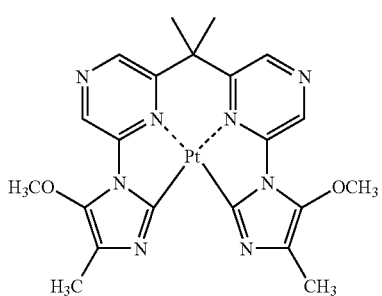
P-168 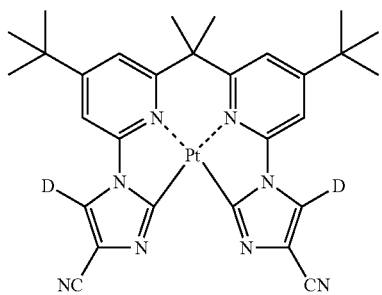
P-169 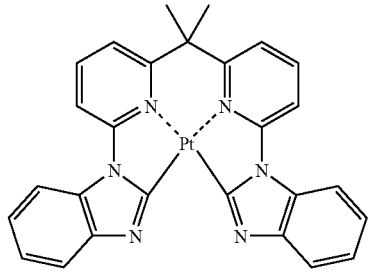

P-170 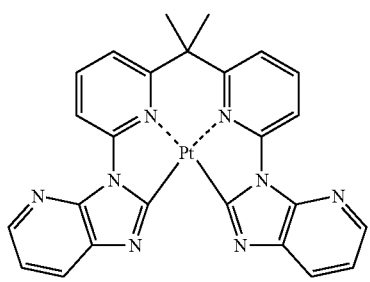
P-171 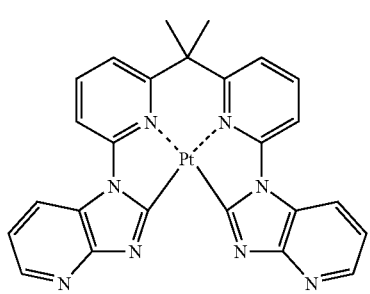
P-172 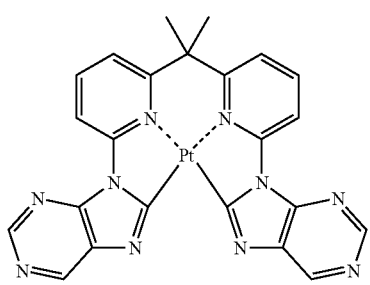
P-173 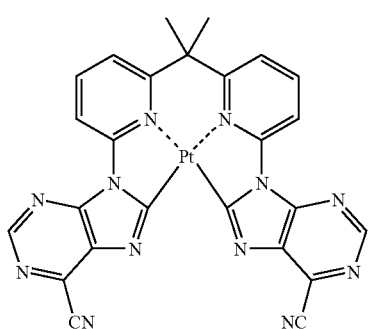
P-174 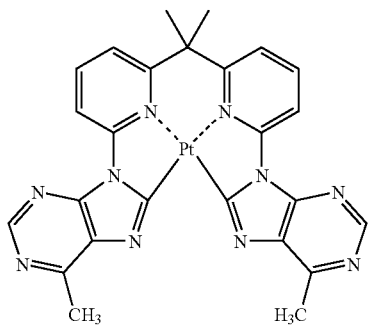
P-175 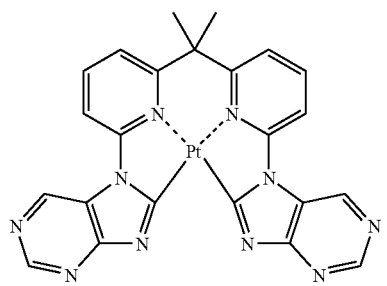
P-176 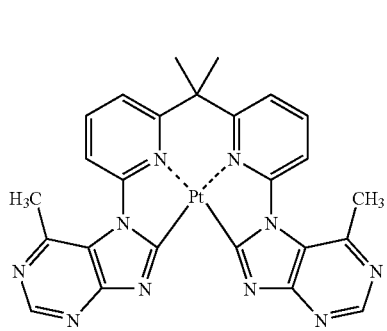
P-177 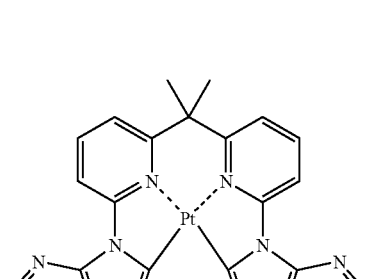
P-178 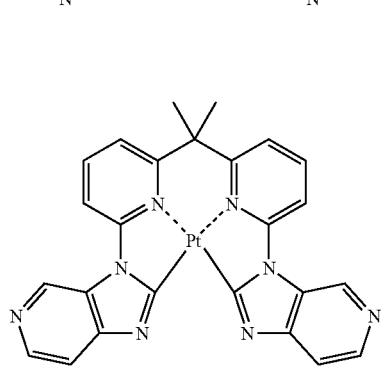
P-179 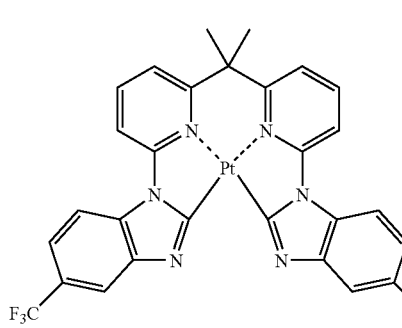

P-180 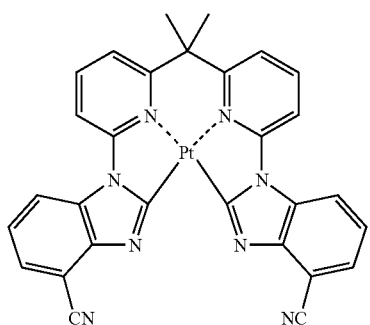
P-181 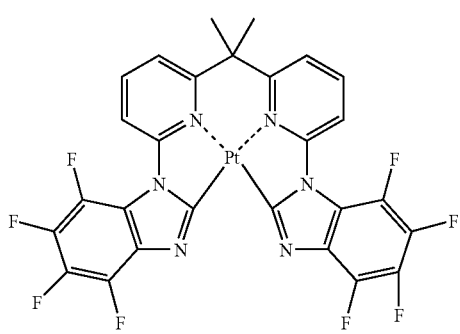
P-182 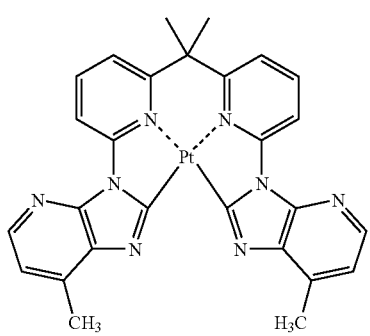
P-183 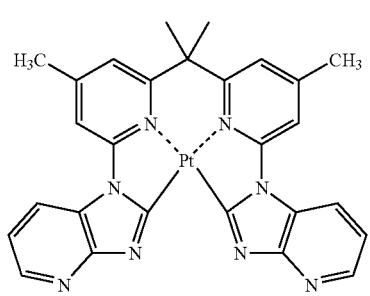
P-184 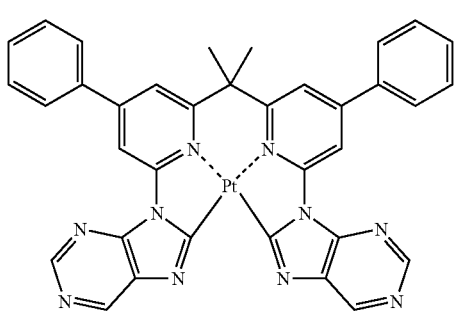
P-185 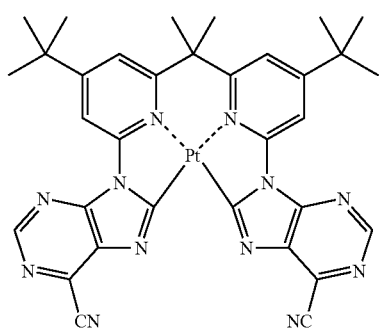
P-186 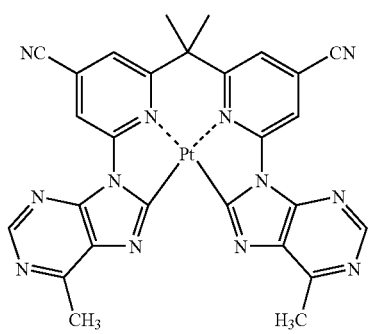
P-187 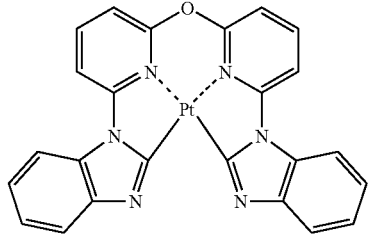
P-188 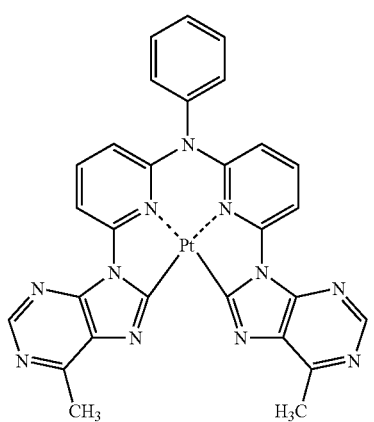
P-189 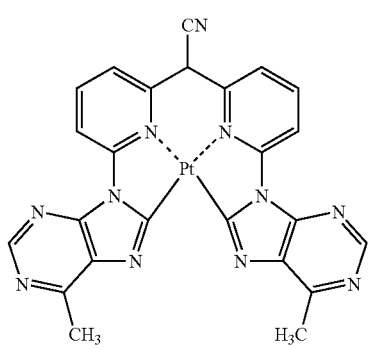

P-190 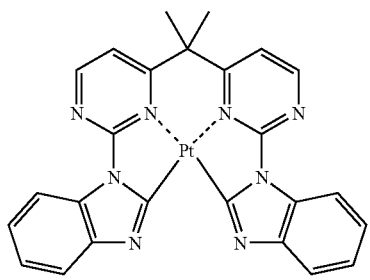
P-191 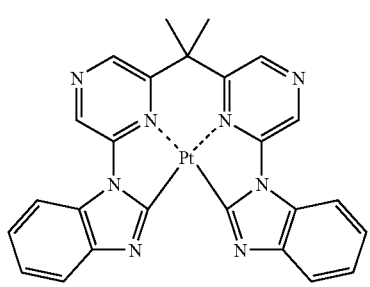
P-192 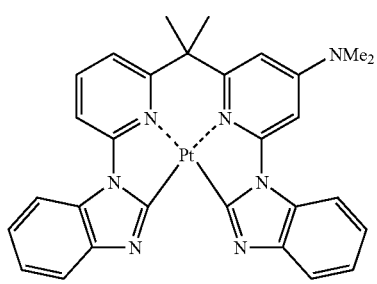
P-193 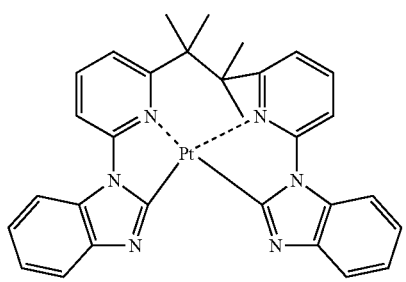
P-194 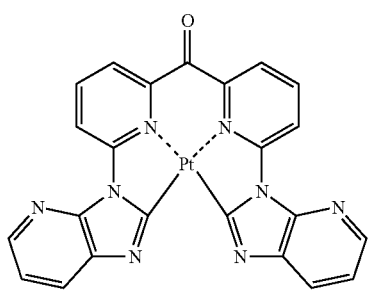
P-195 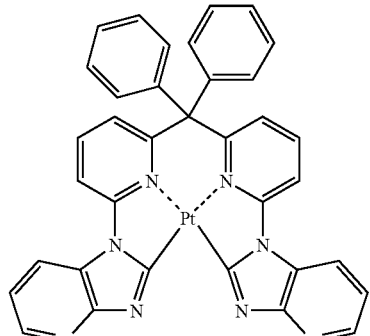
P-196 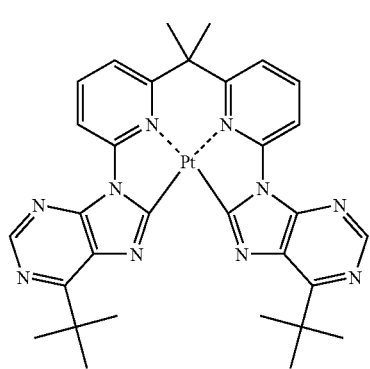
P-197 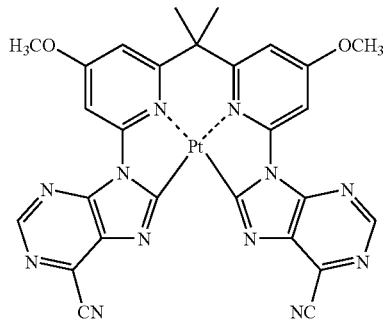
P-198 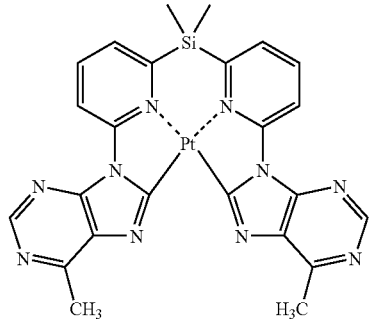

P-199 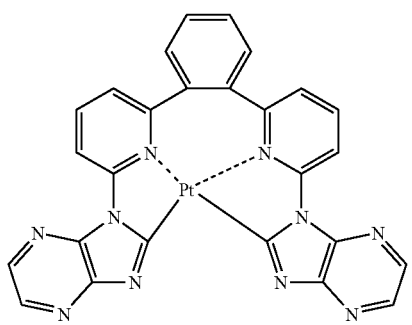
P-200 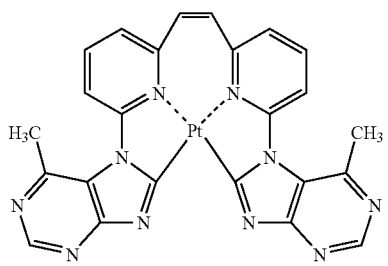
P-201 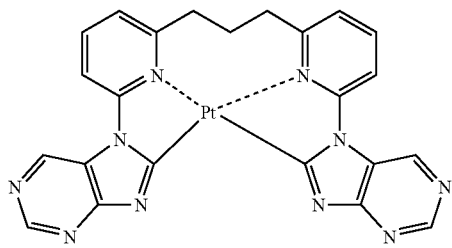
P-202 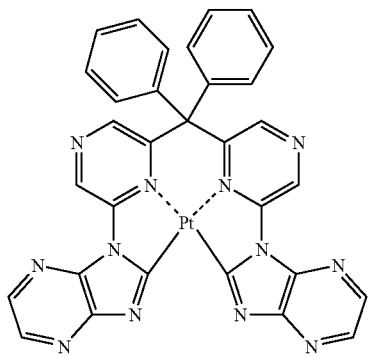
P-203 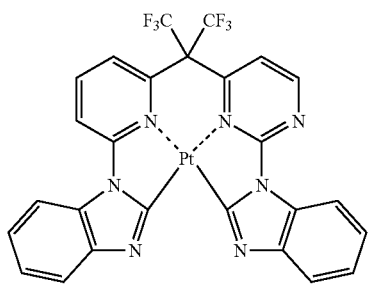
P-204 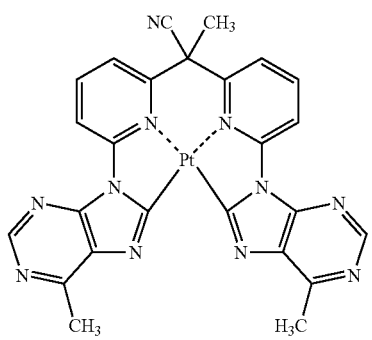
P-205 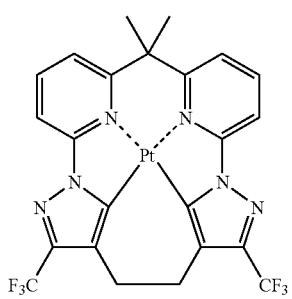
P-206 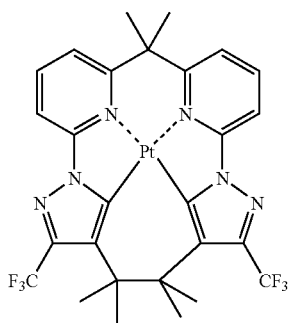
P-207 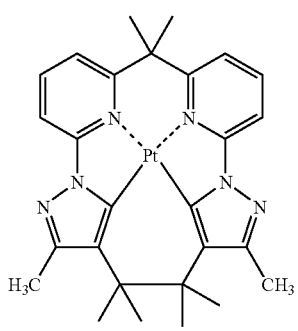
P-208 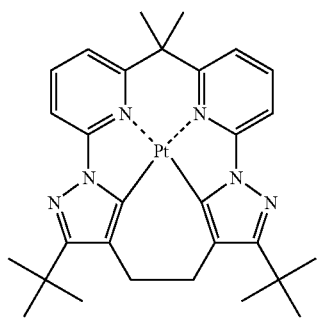

-continued
P-209 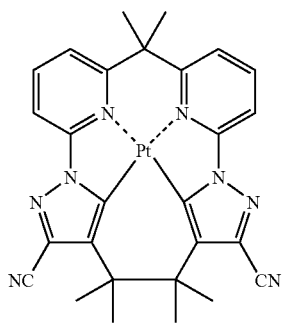
P-210 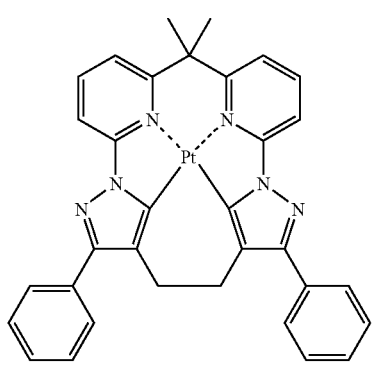
P-211 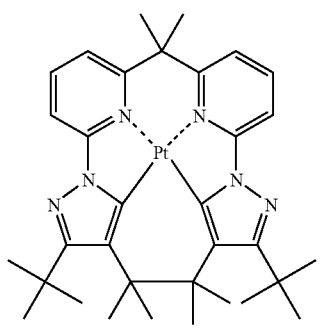
P-212 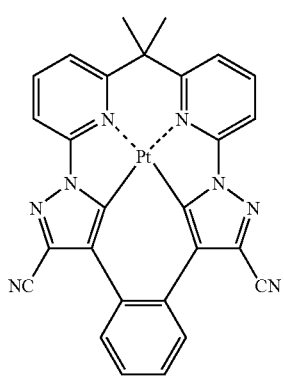
-continued
P-213 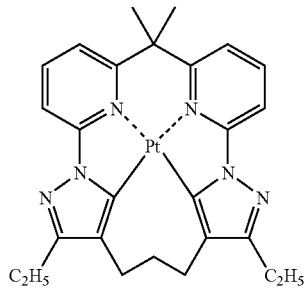
P-214 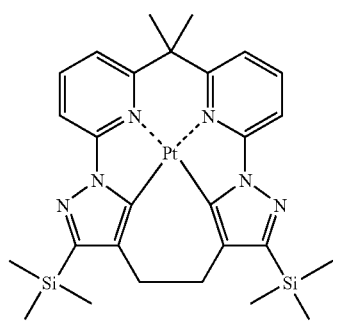
P-215 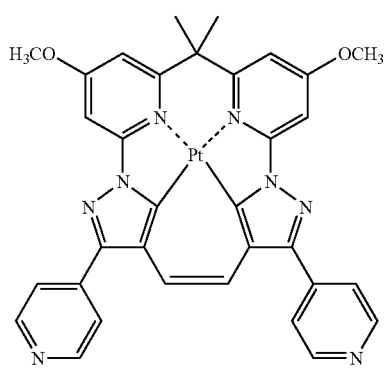
P-216 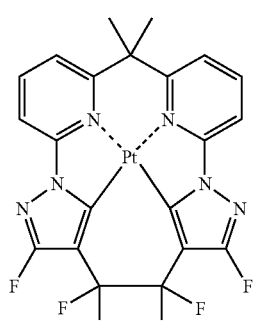
P-217 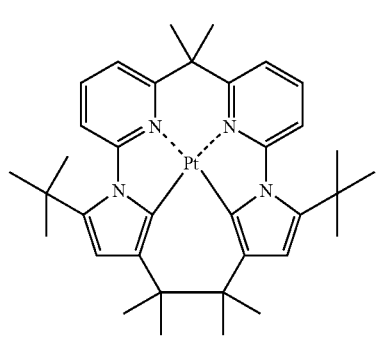

P-218 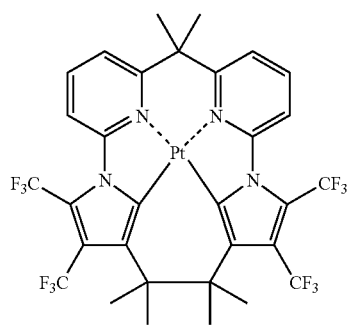
P-219 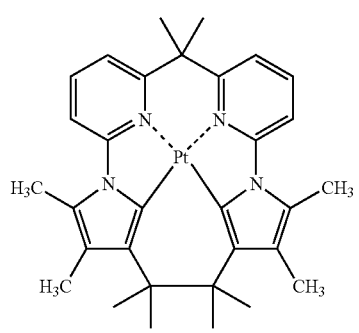
P-220 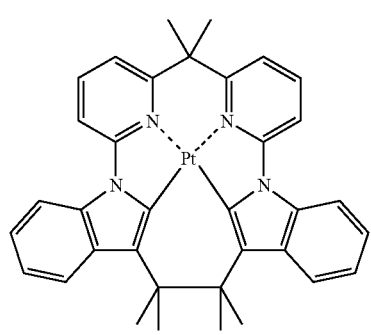
P-221 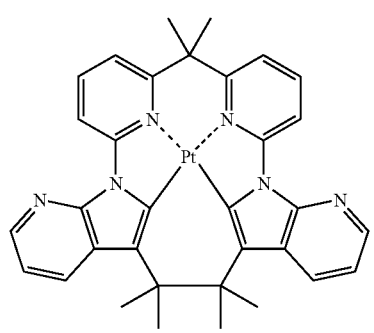
P-222 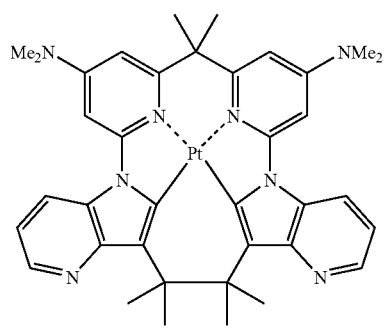
P-223 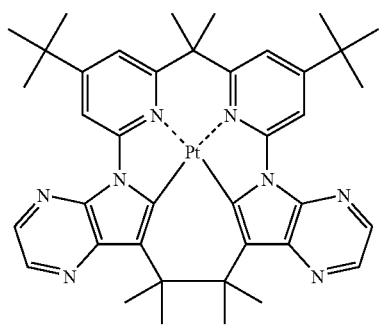
P-224 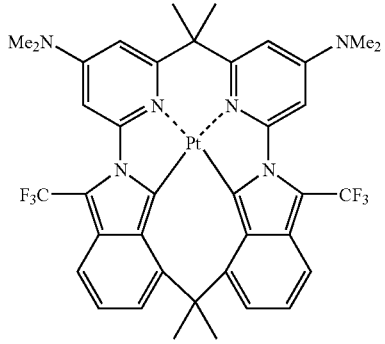
P-225 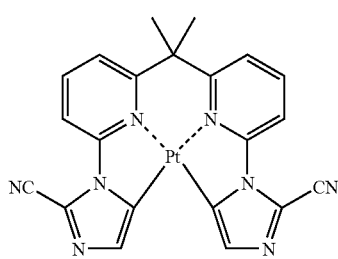
P-226 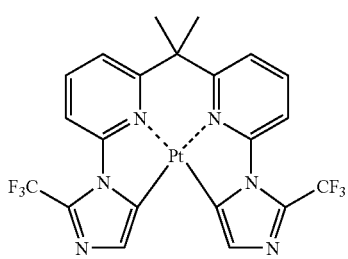
P-227 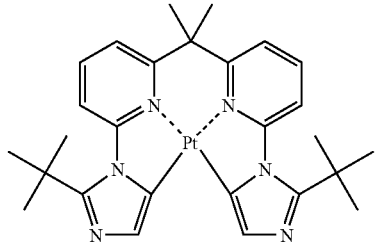

P-228 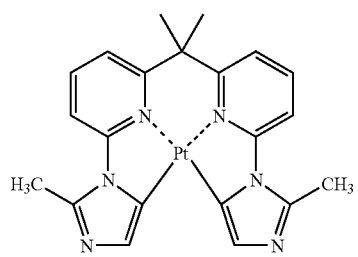
P-229 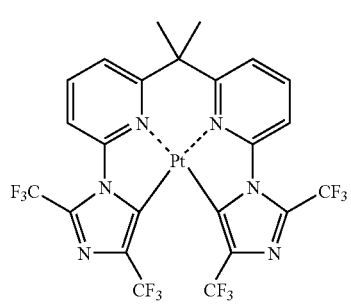
P-230 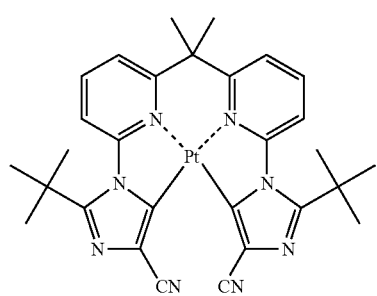
P-231 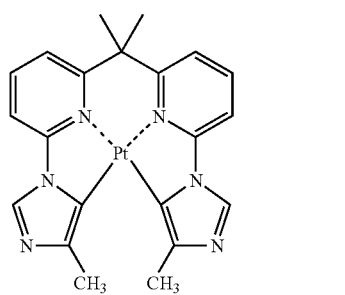
P-232 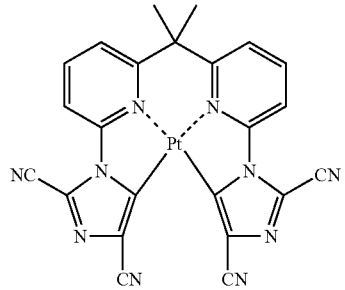
P-233 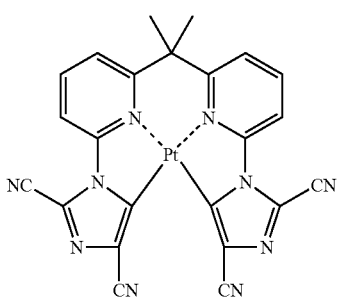
P-234 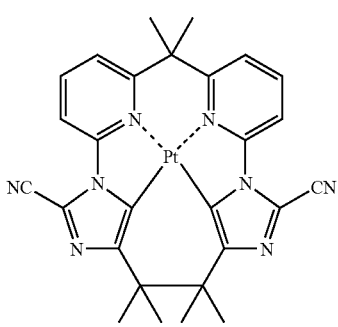
P-235 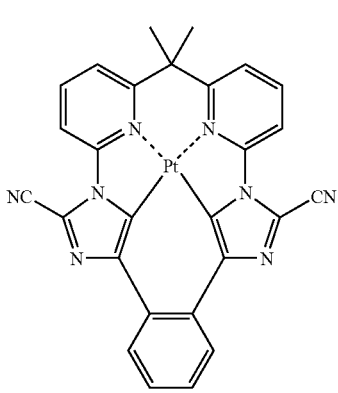
P-236 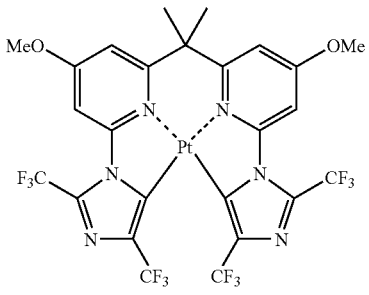
P-237 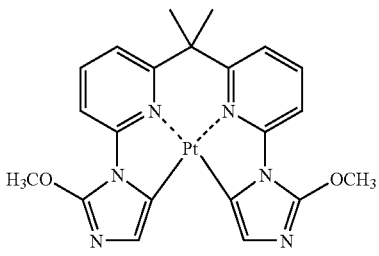

P-238
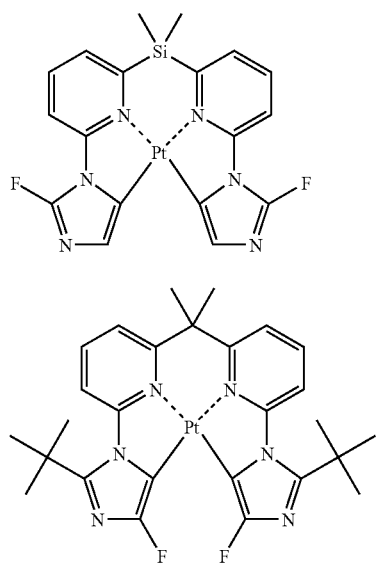
P-239
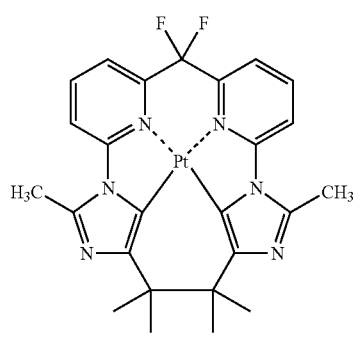
P-240
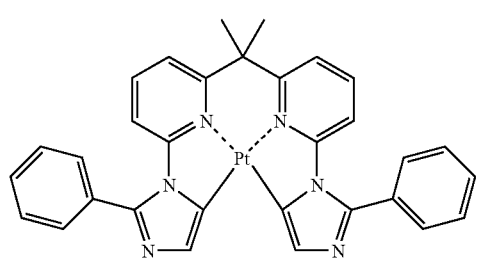
P-241
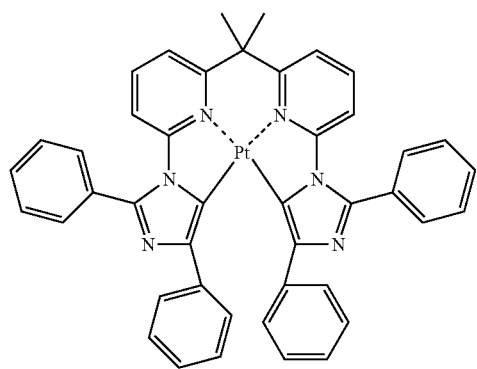
P-243
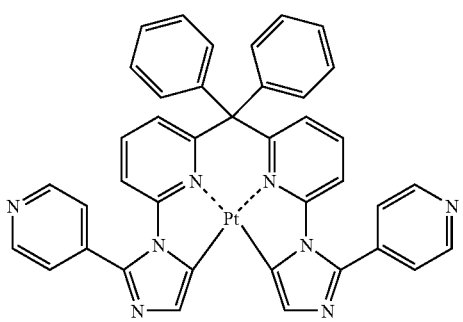
P-244
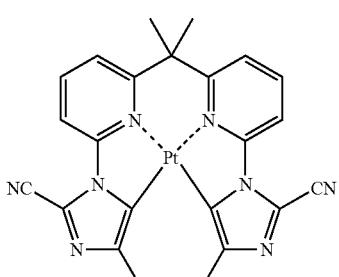
P-245
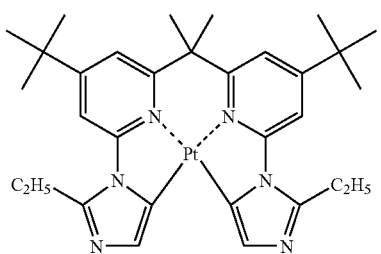
P-246
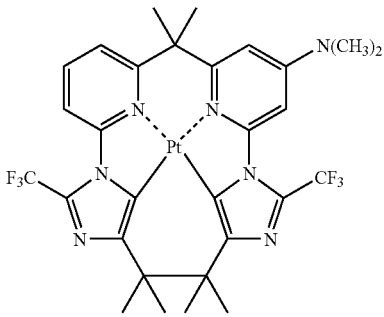
P-247
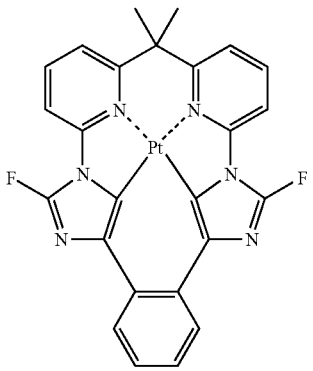

P-248
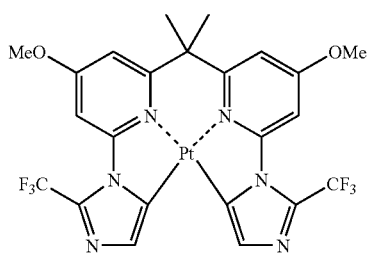
P-249
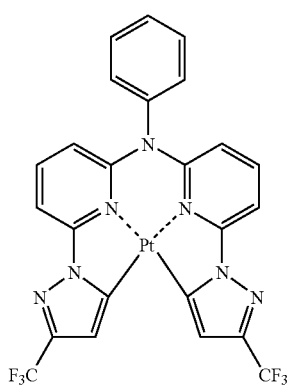
P-250
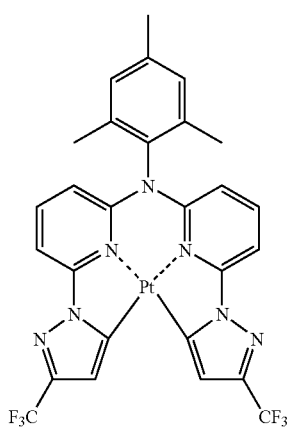
P-251
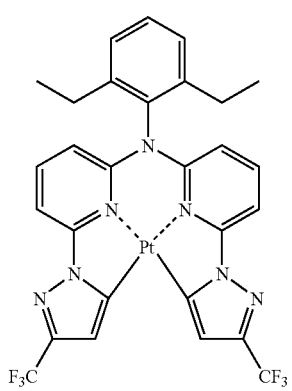
P-252
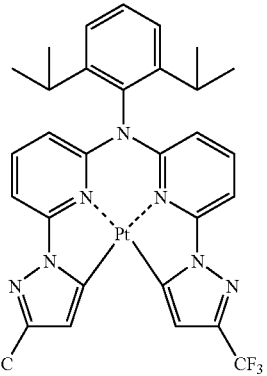
P-253
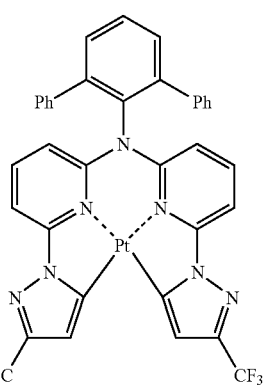
P-254
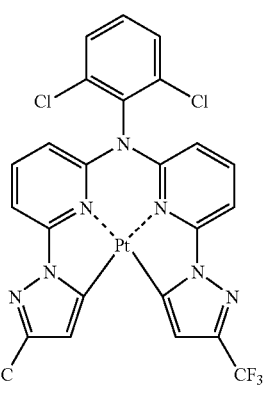
P-255
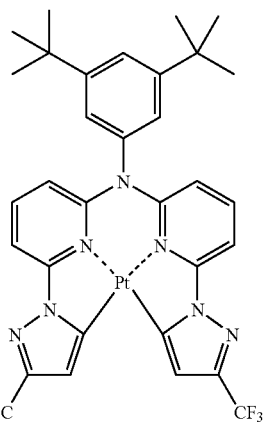

P-256 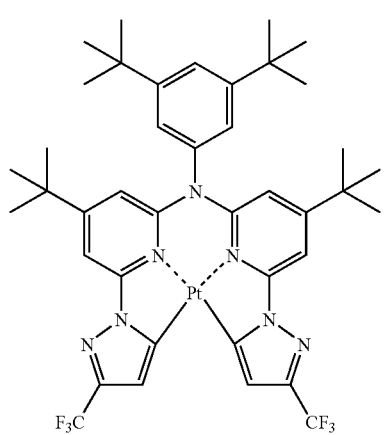
P-257 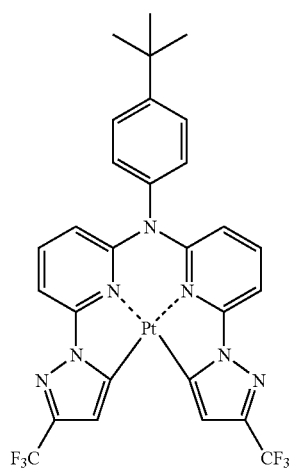
P-258 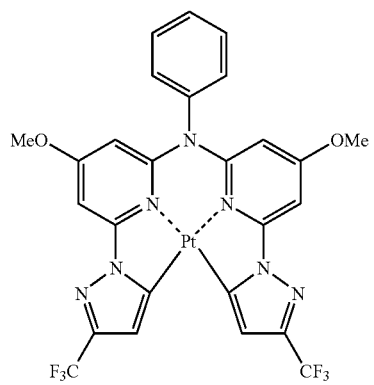
P-259 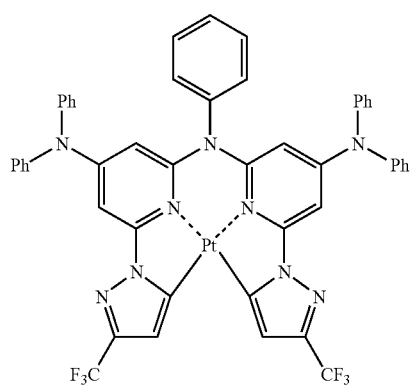
P-260 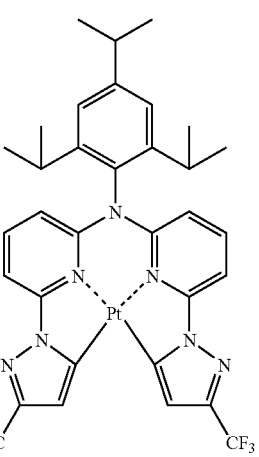
261 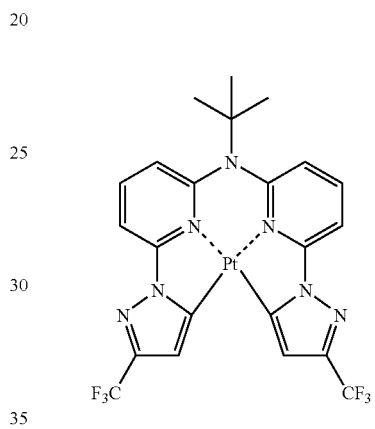
262 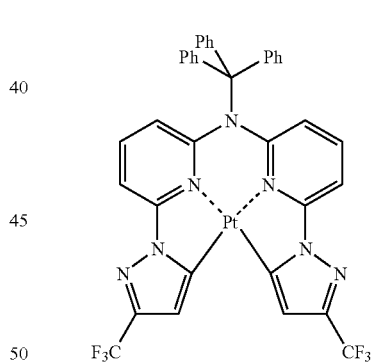
263 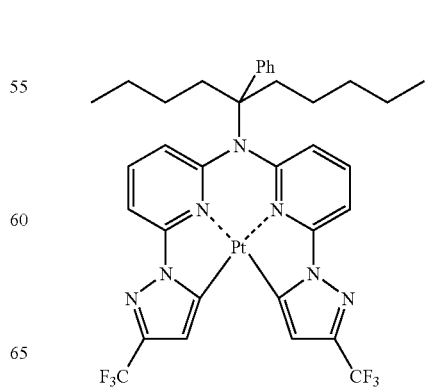

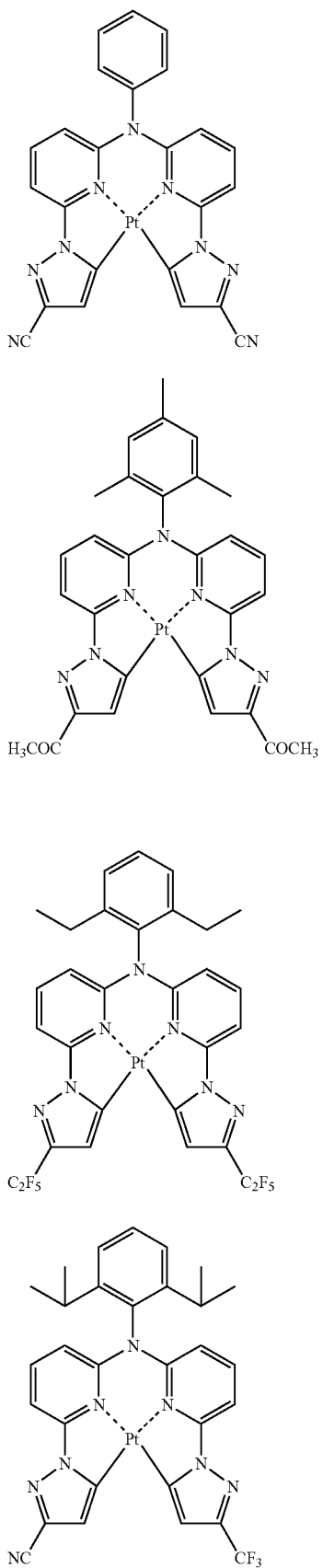
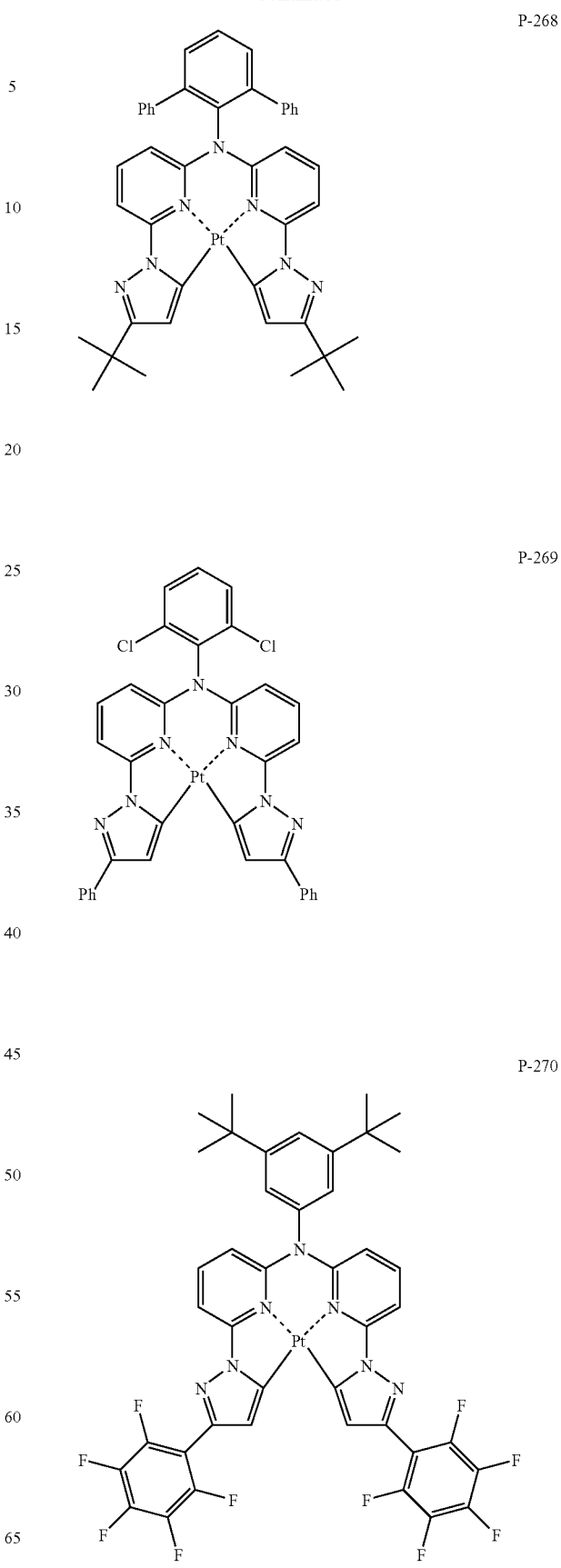

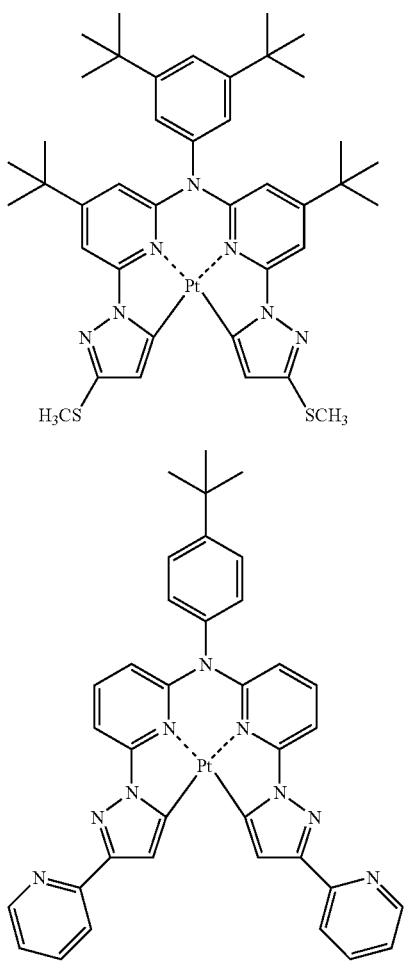

The ionization potential of the host material contained in the light emitting layer is preferably in the range of 5.8 eV to 6.3 eV, more preferably in the range of 5.95 eV to 6.25 eV, and most preferably in the range of 6.0 eV to 6.2 eV.

The electron mobility of the host material contained in the light emitting layer is preferably in the range of $1\times10^{-6}$ cm$^2$/Vs to $1\times10^{-1}$ cm$^2$/Vs, more preferably in the range of $5\times10^{-6}$ cm$^2$/Vs to $1\times10^{-2}$ cm$^2$/Vs, still more preferably in the range of $1\times10^{-5}$ cm$^2$/Vs to $1\times10^{-2}$ cm$^2$/Vs, and most preferably in the range of $5\times10^{-5}$ cm$^2$/Vs to $1\times10^{-2}$ cm$^2$/Vs.

The hole mobility of the host material contained in the light emitting layer is preferably in the range of $1\times10^{-6}$ cm$^2$/Vs to $1\times10^{-1}$ cm$^2$/Vs, more preferably in the range of $5\times10^{-6}$ cm$^2$/Vs to $1\times10^{-2}$ cm$^2$/Vs, still more preferably in the range of $1\times10^{-5}$ cm$^2$/Vs to $1\times10^{-2}$ cm$^2$/Vs, and most preferably in the range of $5\times10^{-5}$ cm$^2$/Vs to $1\times10^{-2}$ cm$^2$/Vs.

The glass transition point of the host material, the electron transporting material and the hole transporting material contained in the light emitting layer is preferably in the range of 90° C. to 400° C., more preferably in the range of 100° C. to 380° C., still more preferably in the range of 120° C. to 370° C., and most preferably in the range of 140° C. to 360° C.

In the organic electroluminescent device according to the present invention, the maximum wavelength of the emitted light is preferably in the range of 390 nm to 495 nm in view of blue color purity and more preferably in the range of 400 nm to 490 nm. The light emitting device according to the present invention may have the maximum wavelength of the emitted light in the range of 500 nm and more and may be a white light emitting device.

In the organic electroluminescent device according to the present invention, the x value of CIE chromaticity of the emitted light is preferably 0.22 or less in view of the blue color purity and more preferably 0.20 or less.

In the organic electroluminescent device according to the present invention, the y value of CIE chromaticity of the emitted light is preferably in the range of 0.25 or less, more preferably 0.20 or less, and most preferably 0.15 or less.

In the organic electroluminescent device according to the present invention, the half width of an emission spectrum is preferably 100 nm or less, more preferably is 90 nm or less, still more preferably 80 nm or less, and most preferably 70 nm or less.

The $T_1$ level (energy level of the least triplet excited state) of the phosphorescent material (the compounds according to the present invention and/or phosphorescent material used therewith) which can be used in the present invention is preferably in the range of 60 Kcal/mol (251.4 KJ/mol) to 90 Kcal/mol (377.1 KJ/mol), more preferably in the range of 62 Kcal/mol (259.78 KJ/mol) to 85 Kcal/mol (356.15 KJ/mol), and most preferably in the range of 65 Kcal/mol (272.35 KJ/mol) to 80 Kcal/mol (335.2 KJ/mol).

The $T_1$ level (energy level of the least triplet excited state) of the host material contained in the light emitting layer is preferably in the range of 60 Kcal/mol (251.4 KJ/mol) to 90 Kcal/mol (377.1 KJ/mol), more preferably in the range of 62 Kcal/mol (259.78 KJ/mol) to 85 Kcal/mol (356.15 KJ/mol), and most preferably in the range of 65 Kcal/mol (272.35 KJ/mol) to 80 Kcal/mol (335.2 KJ/mol).

The $T_1$ level (energy level of the least triplet excited state) of the layer (such as the hole transporting layer, the electron transporting layer, the charge blocking layer, and the exciter blocking layer) adjacent to the light emitting layer is preferably in the range of 60 Kcal/mol (251.4 KJ/mol) to 90 Kcal/mol (377.1 KJ/mol), more preferably in the range of 62 Kcal/mol (259.78 KJ/mol) to 85 Kcal/mol (356.15 KJ/mol), and most preferably in the range of 65 Kcal/mol (272.35 KJ/mol) to 80 Kcal/mol (335.2 KJ/mol).

In the organic electroluminescent device according to the present invention, the light extraction efficiency can be improved by a variety of known techniques. For example, by processing the surface shape of a substrate (for example, forming a micro uneven pattern), or controlling the refractive indexes of the substrate, the ITO layer, and the organic layer, or controlling the thickness of the substrate, the ITO layer, and the organic layer, the light extraction efficiency can be improved, thereby enhancing the external quantum efficiency.

The organic electroluminescent device according to the present invention may be of a so-called top emission type which extracts the light from the positive electrode (see Japanese Unexamined Patent Application Publication Nos. 2003-208109, 2003-248441, 2003-257651, and 2003-282261).

The material of the substrate used in the organic electroluminescent device according to the present invention is not particularly limited, and examples thereof can include an inorganic material such as zirconia-stabilized yttrium and glass, poly ester such as poly ethyleneterephthalate, poly butylene terephthalate, and poly ethylene naphthalate, a high-molecular material such as poly ethylene, poly carbonate, poly ethersulfone, poly arylate, aryldiglycolcarbonate, poly imide, poly cycloolefin, norbornene resin, poly (chlorotrifluoro ethylene), Teflon (registered trademark), and poly tetrafluoro ethylene-poly ethylene copolymer.

The organic electroluminescent device according to the present invention may contain a blue fluorescent compound. Alternatively, a multi-color light emitting device and a full color light emitting device may be manufactured by using a blue light emitting device containing a blue fluorescent compound and the light emitting device according to the present invention together.

In the organic electroluminescent device according to the present invention, the host material contained in the light emitting layer may be a kind or two kinds or more.

The organic electroluminescent device according to the present invention includes preferably a plurality of host materials in the light emitting layer in order to control the transport property of the hole and electron in the light emitting layer. As a plurality of host materials, a hole transporting host material excel in the hole transport property (hole transporting host) and an electron transporting host material excel in the electron transport property (electron transporting host) can be used in combination. Here, "excel in the hole transport property" or "excel in the electron transport property" indicates the relative relationship of a plurality of the host materials used in combination, and indicates that one of the plurality of the host materials is superior to another in the hole transport property or the electron transport property.

When a compound according to the present invention is used as the host material in a light emitting layer, and when a compound according to the present invention is superior in the electron transport property, the compound can be used in combination with a host material excel in the hole transport property. And when a compound according to the present invention is superior in the hole transport property, the compound can be used in combination with a host material excel in the electron transport property.

—Hole Transporting Host—

As a hole transporting host used in a light emitting layer according to the present invention, publicly known hole transporting materials can be used. For example, the following materials can be exemplified; pyrrole, carbazole, triazole, oxazole, oxadiazole, imidazole, polyarylalkane, pyrazoline, pyrazolone, phenylenediamine, arylamine, amino substituted chalkone, styryl anthracene, fluorenone, hydrazine, stilbene, silazane, aromatic tertiary amine compound, styryl amine compound, aromatic dimethylidene compound, porphyrin compound, polysilane compound, poly(N-vinylcarbazole), aniline copolymer, thiophene oligomer, conductive polymer oligomer such as polythiophene, organic silane, carbon film, and their derivatives. Among them, carbazole derivative, aromatic tertialy amine compound, thiophene derivative are preferred, particularly, those having a plurality of carbazole skeletons and/or aromatic tertiary amine akeltones in their molecules are preferred.

—Electron Transporting Host—

As an electron transporting host used in a light emitting layer according to the present invention, publicly known electron transporting materials can be used. For example, the following materials can be exemplified; pyridine, pyrimidine, triazine, imidazole, triazole, oxazole, oxadiazole, fluoreneone, anthraquinodimethane, anthrone, diphenylquinone, thiopyrandioxide, carbodiimide, fluorenylidene methane, distyryl pyradine, fluorine substituted aromatic compound, heterocyclic tetracarboxylic acid anhydride such as naphthaleneperylene, phthalocyanine, and their derivatives (which may form a condensed ring with other ring) and a variety of metal complexes represented by a metal complex of 8-quinolinol derivative, metal phthalocyanine or a metal salt which has benzoxazole or benzothiazole as ligand.

An electron transporting host is preferably metal complex, azole derivative (benzimidazole derivative, imidazopyridine derivative), azine derivative (pyridine derivative, pyrimidine derivative, triazine derivative). Among them, with respect to the durability, metal complex is preferred in the present invention. A metal complex has a ligand containing at least one of nitrogen atom, oxygen atom and sulfur atom coordinating with a metal. A metal ion in a metal complex is not especially limited, but preferably beryllium ion, magnesium ion, aluminium ion, gallium ion, zinc ion, indium ion or tin ion, more preferably beryllium ion, aluminium ion, gallium ion or zinc ion, still more preferably aluminium ion or zinc ion.

The organic electroluminescent device according to the present invention has preferably a layer containing a compound with an ionization potential of 5.9 eV or more (more preferably 6.0 eV or more) between the negative electrode and the light emitting layer, and more preferably the electron transporting layer with an ionization potential of 5.9 eV or more.

The method of forming the organic layer containing the compounds according to the present invention is not particularly limited, and examples thereof can include a resistance heating deposition method, an electron beam method, a sputtering method, a molecule deposition method, a coating method (such as a spray coating method, a dip coating method, an impregnation method, a roll coating method, a gravure coating method, a reverse coating method, a roll brush method, an air knife coating method, a curtain coating method, a spin coating method, a flow coating method, a bar coating method, a micro gravure coating method, an air doctor coating method, a blade coating method, a squeeze coating method, a transfer roll coating method, a kiss coating method, a cast coating method, an extrusion coating method, a wire-bar coating method, and a screen coating method), an inkjet method, a printing method, an LB method, and a transfer method. Among them, the resistance heating deposition method, the coating method, and the transfer method are more preferable in view of characteristics and manufacturing thereof. The layer containing the compounds according to the present invention is formed on a substrate by the use of any one method described above, but the thickness thereof is not particularly limited. The thickness is preferably 10 nm or more and more preferably in the range of 50 nm to 5 μm.

The concentration of the transition metal complex contained in the light emitting layer is not particularly limited, but is preferably equal to or less than that of the host material which is a main component thereof, more preferably in the range of 0.1 mass % to 50 mass/, still more preferably in the range of 0.2 mass % to 30 mass %, still more preferably in the range of 0.3 mass % to 20 mass %, and most preferably in the range of 0.5 mass % to 10 mass %. (In this specification, mass ratio is equal to weight ratio.)

The positive electrodes serves to supply holes to the hole injecting layer, the hole transporting layer, and the light emitting layer, and may be made of metal, alloy, metal oxide, electrical conductive compound, or mixtures thereof. Among them, the material having a work function of 4 eV or more is preferable. Specific examples of the material can include conductive metal oxide such as tin oxide, zinc oxide, indium oxide, and indium-tin oxide (ITO), metal such as gold, silver, chromium, and nickel, a mixture or stacked material of the metal and the conductive metal oxide, an inorganic conductive material such as copper iodide and copper sulfide, an organic conductive material such as poly aniline, poly thiophene, and poly pyrrole, and a stacked material of the materials and ITO. The conductive metal oxide is preferable and ITO is more preferable in view of productivity, high conductivity, and transparency. The thickness of the positive electrode can be properly selected depending upon the materials, but is preferably in the range of 10 nm to 5 µm, more preferably in the range of 50 nm to 1 µm, and most preferably in the range of 100 nm to 500 nm.

The positive electrode is generally used in the state that it is formed on a soda lime glass substrate, an alkali-free glass substrate, a transparent resin substrate, or the like. When a glass substrate is used, the material thereof is preferably the alkali-free glass so as to reduce the ions eluted from the glass. When the soda lime glass substrate is used, it is preferable that a barrier coating process with silica is performed thereto. The thickness of the substrate is not particularly limited so long as it is enough to maintain the mechanical strength thereof, but when the glass substrate is used, the thickness of the substrate is preferably 0.2 mm or more and more preferably 0.7 mm or more.

A variety of methods can be used to manufacture the positive electrode. For example, when the positive electrode is made of ITO, the positive electrode is formed as a film by the use of an electron beam method, a sputtering method, a resistance heating deposition method, a chemical reaction method (a sol-gel method), or a method of coating a material in which indium-tin oxide is dispersed.

By performing a cleaning process or other processes to the positive electrode, the driving voltage of the device can be decreased or the light emission efficiency thereof can be increased. For example, when the positive electrode is made of ITO, UV-ozone processing or plasma processing is advantageous.

The negative electrode serves to supply electrons to the electron injecting layer, the electron transporting layer, and the light emitting layer, and the material of the negative electrode is selected in consideration of the adhesion to a layer contacting the negative electrode, such as the electron injecting layer, the electron transporting layer, and the light emitting layer, the ionization potential, and the stability. Examples of the material of the negative electrode can include metal, alloy, metal halide, metal oxide, conductive compounds, and mixtures thereof. The specific examples of the material can include alkali metal (such as Li, Na, and K) and fluoride or oxide thereof, alkali earth metal (such as Mg and Ca) and fluoride or oxide thereof, gold, silver, plumbum, aluminum, sodium-potassium alloy or mixture, lithium-aluminum alloy or mixture, magnesium-silver alloy or mixture, and rare earth metal such as indium and yttrium. Among them, the materials having a work function of 4 eV or less are preferable, and aluminum, lithium-aluminum alloy or mixture, and magnesium-silver alloy or mixture are more preferable. The negative electrode may have a single-layered structure of the compound and the mixture described above, or may have a multi-layered structure including the compounds and the mixtures described above. A multi-layered structure such as aluminum/lithium fluoride and aluminum/lithium oxide is preferable. The thickness of the negative electrode can be properly selected depending upon the materials, but is preferably in the range of 10 nm to 5 µm, more preferably in the range of 50 nm to 1 µm, and most preferably in the range of 100 µnm to 1 µm.

The electron beam method, the sputtering method, the resistance heating deposition method, the coating method, the transfer method, or the like can be used to manufacture the negative electrode. Two or more metals can be simultaneously deposited as simplexes. In addition, an alloy electrode may be formed by simultaneously depositing a plurality of metals and an alloy adjusted in advance may be deposited.

The sheet resistances of the positive electrode and the negative electrode are preferably low and more preferably several hundreds or less $\Omega/\square$.

The light emitting layer may be made of any material as long as it has a function of injecting holes from the positive electrode, the hole injecting layer, or the hole transporting layer at the time of application of a voltage and injecting electrons from the negative electrode, the electron injecting layer, or the electron transporting layer, a function of moving the injected charge carriers, or a function of providing a place for re-coupling the holes and the electrons to emit light. Examples of the material for the light emitting layer can include a variety of metal complexes such as a rare earth complex or a metal complex of benzooxazole, benzoimidazole, benzothiazole, styrylbenzene, polyphenyl, diphenyl butadiene, tetraphenyl butadiene, naphthalimide, coumarin, perylene, perignon, oxadiazole, aldazine, pyrazine, cyclopentadiene, bisstyrylanthracene, quinacridone, pyrrolopyridine, thiadiazoropyridine, styrylamine, aromatic dimethylidine compound, and 8-quinolinol, polymer compounds such as poly thiophene, poly phenylene, and poly phenylene vinylene, transition metal complexes such as organic silane, iridium trisphenylpyridine complexes, and platinum forpyrine complexes, and derivatives thereof.

The light emitting material contained in a light emitting layer may be a single or two or more kinds different from each other.

The thickness of the light emitting layer is not particularly limited, but is preferably in the range of 1 nm to 5 µm, more preferably in the range of 5 nm to 1 µm, and most preferably in the range of 10 nm to 500 nm.

The method of forming the light emitting layer is not particularly limited, but is preferably one of the resistance heating deposition method, the electron beam method, the sputtering method, the molecule deposition method, the coating method, the inkjet method, the printing method, the LB method, and the transfer method, and more preferably one of the resistance heating deposition method and the coating method.

The light emitting layer may be made of a single compound, or may be made of a plurality of compounds. The light emitting layer may have a single layer or a plurality of layers. In this case, the respective layers may emit light of different colors to emit, for example, white light. The single-layered light emitting layer may emit the white light. When the light emitting layer includes a plurality of layers, the respective layers may be made of a single compound or may be made of a plurality of compounds.

Further, in order to enhance the light emitting efficiency and improve the durability, the same light emitting materials as contained in a light emitting material can be preferably contained in a layer adjacent to the positive electrode side of the light emitting layer or a layer adjacent to the negative electrode side of the light emitting layer. Thereby, it is assumed that the charges retained in the positive electrode side's interface or the negative electrode side's interface of a light emitting layer can be effectively used for light emitting.

In addition, the present invention can employ a constitution where an energy transfer from triplet exciton to singlet exciton is used. For example, as described in JPA-2005-190949, a light emitting layer may contain a compound that emits fluorescence when a voltage is applied and a compound that has a function of amplifying a light emitting intensity during the application of a voltage by increasing the number of singlet exciton generated during the application of a voltage.

The materials of the hole injecting layer and the hole transporting layer may have any one of a function of injecting holes from the positive electrode, a function of transporting holes, and a function of blocking electrons injected from the negative electrode. Specific examples thereof can include a conductive high-molecular oligomer such as carbazole, triazole, oxazole, oxadiazole, imidazole, poly arylalkane, pyrazoline, pyrazolone, phenylenediamine, arylamine, amino-substituted chalcone, styrylanthracene, fluorenone, hydrazone, stilbene, silazane, aromatic third-degree amine compound, styryl amine compound, aromatic JIMECHIRIDIN compound, porphyrin compound, poly silane compound, poly(N-vinylcarbazole), aniline copolymer, thiophene oligomer, and poly thiophene, an organic silane, a carbon film, the compounds according to the present invention, and derivatives thereof. The thickness of the hole injecting layer is not particularly limited, but is preferably in the range of 1 nm to 5 μm, more preferably in the range of 1 nm to 100 nm, and most preferably in the range of 1 nm to 10 nm. The thickness of the hole transporting layer is not particularly limited, but is preferably in the range of 1 nm to 5 μm, more preferably in the range of 5 nm to 1 μm, and most preferably in the range of 10 nm to 500 nm. The hole injecting layer and the hole transporting layer may have a single-layered structure including one or two or more kinds of the above-mentioned materials, or may have a multi-layered structure including a plurality of layers with a composition of like or different kinds.

When the hole injecting layer and the hole transporting layer are multi-layered structures, assuming that an ionization potential of a light emitting layer is Ip0, of the hole injecting layer and the hole transporting layer, an ionization potential of a layer adjacent to a light emitting layer is Ip1, an ionization potential of a layer located in n-th position from a light emitting layer side is Ipn, the relation represented by the following numeral formula (1) is preferably satisfied with respect to the low-voltage driving.

$Ip0>Ip1>Ip2> \ldots >Ipn-1>Ipn$ (n represents an integer of 2 or more.)   Numeral formula (1):

In the hole injecting layer and the hole transporting layer of an organic EL device according to the present invention, an electron receptive dopant can be contained. As an electron receptive dopant introduced into the hole injecting layer or the hole transporting layer, inorganic compounds or organic compounds may be used as long as they are electron receptive and have a property of oxidizing an organic compound.

In particular, inorganic compounds include metal halide, such as ferric chloride, aluminum chloride, gallium chloride, indium chloride and antimony pentachloride, and metal oxide, such as vanadium pentoxide, molybdic anhydride.

When the electron receptive dopant is an organic compound, compound having nitro group, halogen, cyano group or trifluoromethyl group etc. as substituent, quinone compound, acid anhydride compound and fullerene can be preferably used.

In addition to the above, compounds described in JPA-06-212153, JPA-11-111463, JPA-11-251067, JPA-2000-196140, JPA-2000-286054, JPA-2000-315580, JPA-2001-102175, JPA-2001-160493, JPA-2002-252085, JPA-2002-56985, JPA-2003-157981, JPA-2003-217862, JPA-2003-229278, JPA-2004-342614, JPA-2005-72012, JPA-2005-166637, JPA-2005-029643 can be preferably used.

These electron receptive dopants can be used solely or in two or more kinds. Amount of the electron receptive dopant varies with the type of materials, however it is preferably 0.01 mass % to 50 mass %, more preferably 0.05 mass % to 20 mass %, particularly more preferably 0.1 mass % to 10 mass % with respect to the hole transporting layer materials. The vacuum deposition method, the LB method, the coating method using the material of the hole injecting layer and the hole transporting layer dissolved or dispersed in a solvent, the inkjet method, the printing method, or the transfer method can be used to form the hole injecting layer and the hole transporting layer. When the coating method is used, the material can be dissolved or dispersed along with a resin component. Examples of the resin component can include poly vinyl chloride, poly carbonate, poly styrene, poly methylmethacrylate, poly butylmethacrylate, poly ester, poly sulfon, poly phenyleneoxide, poly butadiene, poly (N-vinylcarbazole), hydrocarbon resin, ketone resin, phenoxy resin, poly amide, ethyl cellulose, vinyl acetate, ABS resin, poly urethane, melamine resin, unsaturated polyester resin, alkyd resin, epoxy resin, and silicon resin.

The materials for the electron injecting layer and the electron transporting layer may have any one of a function of injecting electrons from the negative electrode, a function of transporting electrons, and a function of blocking holes injected from the positive electrode. Specific examples thereof can include a variety of metal complexes such as metal complexes of aromatic tetracarbonic acid anhydride such as triazole, oxazole, oxadiazole, imidazole, fluorenone, anthraquinodimethane, anthrone, diphenyl quinone, thiopyrandioxide, carbodimide, fluorenylidene methane, distyrylpyrazine, naphthalene, and perylene, metal complexes of phthalocyanine and 8-quinolinol, and metal complexes having metal phthalocyanine, benzooxazole, or benzothiazole as a ligand, organic silane, and derivatives thereof. The thickness of the electron injecting layer and the electron transporting layer are not particularly limited, but are preferably in the range of 1 nm to 5 μm, more preferably in the range of 5 nm to 1 μm, and most preferably in the range of 10 nm to 500 nm. The electron injecting layer and the electron transporting layer may have a single-layered structure including one or two or more kinds of the above-mentioned materials, or may have a multi-layered structure including a plurality of layers with a composition of Like or different kinds.

When the electron injecting layer and the electron transporting layer are multi-layered structures, assuming that an electron affinity of a light emitting layer is Ea0, an electron affinity of the electron transporting layer adjacent to a light emitting layer is Ea1, an electron affinity of the electron transporting layer located in n-th position from a light emitting layer side is Earn, the relation represented by the following numeral formula (2) is preferably satisfied with respect to the low-voltage driving.

$Ea0<Ea1<Ea2< \ldots <Eam-1<Eam$ (m represents as integer of 2 or more.)   Numeral formula (2):

The electron injecting layer or the electron transporting layer of an organic EL device according to the present invention, an electron donating dopant can be contained. As an electron donating dopant introduced into the electron injecting layer or the electron transporting layer, those having properties of electron donating ability and reducing organic compounds can be used. For example, alkaline metals such as Li, alkali earth metals such as Mg, transition metals including rare earth metals, and reductive organic compounds, etc are preferably used. As the metals, metals which have work function of 4.2 eV or below are preferable, in particular Li, Na, K, Be, Mg, Ca, Sr, Ba, Y, Cs, La, Sm, Gd and Yb, etc are exemplified. As the reductive organic compounds, nitrogen-containing compound, sulfur-containing compound and phosphor-containing compound are exemplified.

In addition to the above, materials described in JPA-06-212153, JPA-2000-196140, JPA-2003-68468, JPA-2003-229278, JPA-2004-342614, etc. can be preferably used.

These electron donating dopants can be used solely or in two or more kinds.

Amount of the electron donating dopant varies with the type of materials, however it is preferably 0.01 mass % to 99 mass %, more preferably 1.0 mass % to 80 mass, particularly more preferably 2.0 mass % to 70 mass % with respect to the electron transporting layer materials.

The vacuum deposition method, the LB method, the coating method using the material of the electron injecting layer and the electron transporting layer dissolved or dispersed in a solvent, the inkjet method, the printing method, or the transfer method can be used to form the electron injecting layer and the electron transporting layer. When the coating method is used, the material can be dissolved or dispersed along with a resin component. Examples of the resin component can include the materials exemplified for the hole injecting layer and the hole transporting layer.

A material of the protective layer may have a function of preventing a material of promoting device deterioration such as moisture and oxygen from entering the device. Specific examples thereof can include metal such as In, Sn, Pb, Au, Cu, Ag, Al, Ti, and Ni, metal oxide such as MgO, SiO, $SiO_2$, $Al_2O_3$, GeO, NiO, CaO, BaO, $Fe_2O_3$, $Y_2O_3$, and $TiO_2$, metal fluoride such as $MgF_2$, LiF, $AlF_3$, and $CaF_2$, nitride such as $SiN_x$ and $SiO_xN_y$, poly ethylene, poly propylene, poly methylmethacrylate, poly imide, poly urea, poly tetrafluoroethylene, poly chlorotrifluoroethylene, poly dichlorodifluoroethylene, a copolymer of chlorotrifluoroethylene and dichlorodifluoroethylene, a copolymer obtained by copolymerizing tetrafluoroethylene and monomer mixture including at least one kind of co-monomer, fluorine-containing copolymer having a cyclic structure in a copolymer main chain, a water absorbing material having a water absorption rate of 1% or more, and a moisture-resistant material having a water absorption rate of 0.1% or less. The method of forming the protective layer is not particularly limited, and examples thereof can include the vacuum deposition method, the sputtering method, the reactive spattering method, an MBE (molecular beam epitaxy) method, a cluster ion beam method, an ion plating method, a plasma polymerization method (high-frequency excited ion plating method), a plasma CVD method, a laser CVD method, a thermal CVD method, a gas source CVD method, the coating method, the printing method, and the transfer method.

In an organic EL device according to the present invention, a charge generating layer may be provided between a plurality of light emitting layers in order to enhance the light emitting efficiency.

The charge generating layer has a function of generating charges (hole and electron) during the application of a voltage, in addition, it has a function of injecting the generated charges into a layer adjacent to the charge generating layer.

Any materials can be used for the material which forms the charge generating layer as long as they have above mentioned functions. The material may be formed by single compound or a plurality of compounds. In particular, those having conductive property, those having semi-conductive property as a doped organic layer or those having electrical insulating property may be used. Materials described in JPA-11-329748, JPA-2003-272860 or JPA-2004-39617 are exemplified.

In more particular, transparent conductive material such as ITO or IZO (indium zin oxide), organic conductive material such as fullerene, for example C60, or oligo thiophene, organic conductive material such as metal phthalocyanin, non-metal phthalocyanin, metal porphyrin or non-metal porphyrin, metal material such as Ca, Ag, Al, alloy of Mg:Ag, alloy of Al:Li or alloy of Mg:Li, hole conductive material, electron conductive material and mixture thereof can be used.

As the hole conductive material, for example, hole transporting organic material such as 2-TNATA or NPD in which oxidizing agent having electron extracting property such as F4-TCNQ, TCNQ, $FeCL_3$ is doped, P-type conductive polymer or P-type semiconductor are exemplified. As the electron conductive material, electron transporting organic material in which metal or metal compound having a work function of less than 4.0 eV is doped, N-type conductive polymer or N-type semiconductor are exemplified. N-type semiconductor includes N-type Si, N-type Cds and N-type Zns etc. and P-type semiconductor includes P-type Si, P-type CdTe and P-type Cuo etc. Electrical insulating materials such as $V_2O_5$ can be used as the charge generating layer.

The charge generating layer may be single layer or a plurality of laminated layers. As constitutions of a plurality of laminated layers, a constitution in which a material having conductive property such as transparent conductive material and metal material, and a hole conductive material or a electron conductive material are laminated, and a constitution in which the hole conductive material and the electron conductive material are laminated are exemplified.

The thickness and materials of the charge generating layer are preferably selected whereby the charge generating layer has 50% or more transmittance of visible light in general. The thickness thereof is not especially limited, but it is preferably 0.5 to 200 nm, more preferably 1 to 100 nm, still more preferably 3 to 50 nm and particularly more preferably 5 to 30 µm.

The method for forming a charge generating layer is not especially limited. The above mentioned method for forming an organic compound layer can be employed.

Although the charge generating layer is constituted between the two or more layers of light emitting layers, a cathode and an anode side of the charge generating layer may include materials which have a function of injecting charges into layers adjacent to the charge generating layer.

In order to enhance the injection property of electrons into the layer adjacent to the cathode side, it is preferred that electron injecting compounds, such as BaO, SrO, $Li_2O$, LiCl, LiF, $MgF_2$, MgO and $CaF_2$ are laminated on the cathode side of the charge generating layer.

In addition to the content described above, it is possible to select materials for the charge generating layer, based on the descriptions of JPA-2003-45676, U.S. Pat. No. 6,337,492, U.S. Pat. No. 6,107,734 and U.S. Pat. No. 6,872,472 etc.

The applications of the organic electroluminescent device according to the present invention are not particularly limited, but it may be used very suitably in the fields such as display devices, displays, backlights, electronic photographs, lighting light sources, recording light sources, exposing light sources, reading light sources, signboards, interiors, optimal communications. The compounds according to the present invention represented by Formulas (1) to (5) can be used for medical applications, fluorescent brightening agents, photograph materials, UV absorbing materials, laser pigments, recording medium materials, inkjet pigments, color filter pigments, color-changing filters, and the like.

EXAMPLE

Hereinafter, embodiments of the present invention will be described, but the present invention is not limited to the embodiments described below.

Synthesis of Compound (184)

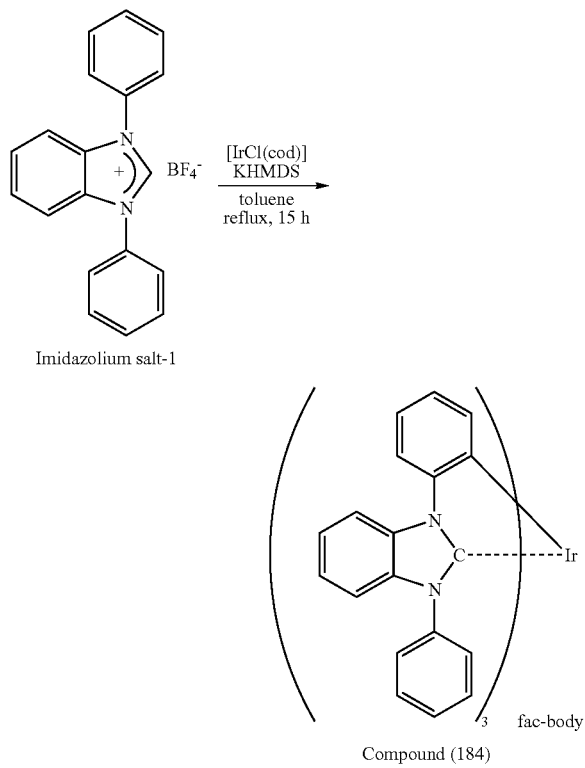

Compound (184)

Synthesis of Compound (185)

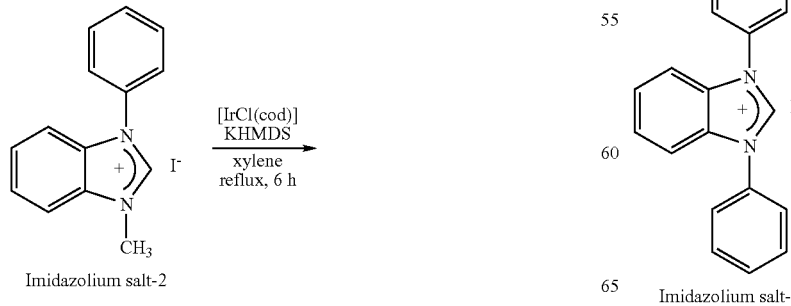

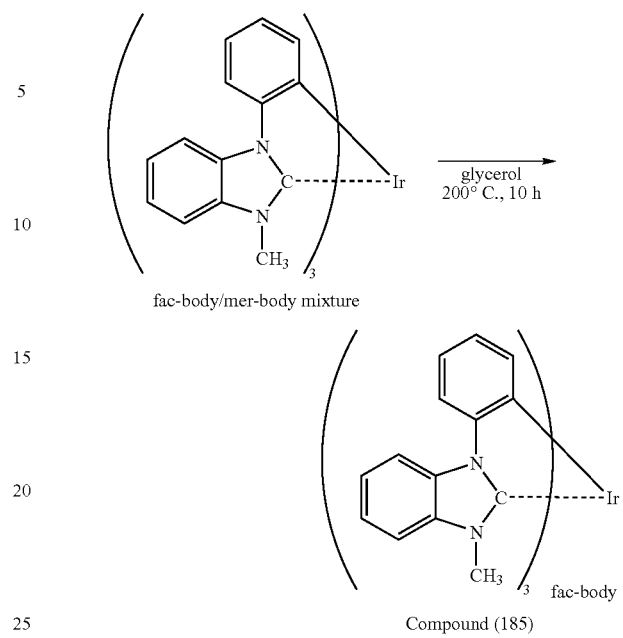

Compound (185)

In the flow of nitrogen, potassium hexamethyldisilazide (1.55 g; 7.4 mmol) was added to a toluene (200 ml) suspended liquid of imidazolium salt-1 (2.64 g; 7.4 mmol), iridium (I) chloride 1, and 5-cyclooctadiene complex dimer (0.62 g; 0.92 mmol) at a room temperature, and the mixture solution was heated and stirred in reflux for 15 hours. Then, the mixture solution was cooled to the room temperature. Thereafter, the solvent was removed by evaporation and the residue was refined by the use of silica gel column chromatography (hexane/chloroform=1/1), obtaining powders. The obtained powders were melted in chloroform and hexane was added thereto for crystallization, thereby obtaining Compound (184) of 1.17 g. The yield was 64%. Here, $^1$H-NMR (CDCl$_3$) 300 MHz: δ 8.11 (d, 3H), 7.92 (d, 3H), 7.20-7.30 (m, 6H), 7.09 (dd, 3H), 6.98 (dd, 3H), 6.66-6.78 (m, 9H), 6.53 (d, 3H), 6.40 (d, 3H), 6.20-6.30 (m, 6H).

In the flow of nitrogen, potassium hexamethyldisilazide (2.50 g; 11.9 mmol) was added to a xylene (300 ml) suspended liquid of imidazolium salt-2 (4.00 g; 11.9 mmol), iridium (I) chloride 1, and 5-cyclooctadiene complex dimer (1.11 g; 1.65 mmol) at a room temperature, and the mixture solution was heated and stirred in reflux for 6 hours. Then, the mixture solution was cooled to the room temperature. Thereafter, the solvent was removed by evaporation, and the residue was refined by the use of silica gel column chromatography (hexane/chloroform=1/1), obtaining powders of 1.16 g. The obtained powders of 0.84 g were added to glycerol (10 ml) and were stirred in the reflux of nitrogen for 10 hours. After cooling to the room temperature, methanol (30 ml) was added to the reaction solution and powders were extracted therefrom and filtered. The powders were melted in chloroform and hexane was added thereto for crystallization, thereby obtaining Compound (185) of 0.77 g. The yield was 29%. Here, $^1$H-NMR (CDCl$_3$) 300 MHz: δ 8.13 (Ca, 3H), 7.86 (d, 3H), 7.11-7.35 (m, 9H), 7.07 (dd, 3H), 6.73 (dd, 3H), 6.64 (d, 3H), 3.27 (s, 9H).

Synthesis of Compound (208)

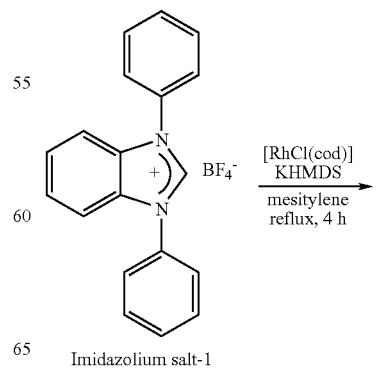

Imidazolium salt-1

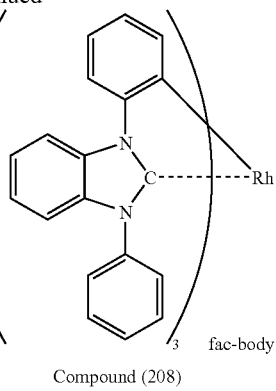

Compound (208)

In the flow of nitrogen, potassium hexamethyldisilazide (3.84 g; 18.3 mmol) was added to a mesitylene (200 ml) suspended liquid of imidazolium salt-1 (6.55 g; 18.3 mmol), iridium (I) chloride 1, and 5-cyclooctadiene complex dimer (1.00 g; 2.02 mmol) at a room temperature, and the mixture solution was heated and stirred in reflux for 15 hours. Then, the mixture solution was cooled to the room temperature. Thereafter, the solvent was removed by evaporation, and the residue was refined by the use of silica gel column chromatography (hexane/chloroform=1/1), obtaining Compound (208) of 1.04 g as solid. The yield was 29%. Here, $^1$H-NMR (CDCl$_3$) 300 MHz: δ 8.12 (d, 3H), 7.92 (d, 3H), 7.20-7.30 (m, 6H), 6.97-7.12 (m, 6H), 6.65-6.81 (m, 9H), 6.44-6.53 (m, 6H), 6.19-6.30 (m, 6H).

Comparative Example 1

A cleaned ITO substrate is placed into a vapor deposition apparatus and is coated with h copper phthalocyanine with a thickness of 10 nm. NPD(N,N'-di-α-naphthyl-N,N'-diphenyl-benzidine) is deposited thereon with a thickness of 40 nm. Ir(ppy)$_3$ and CBP(4,4-N,N' dicarbazole biphenyl) are deposited on the resultant structure with a ratio (mass ratio) of 5:95 with a thickness of 30 nm. BAlq is deposited thereon with a thickness of 10 nm, and then Alq (tris(8-hydroxyquinoline) aluminum complex) is deposited thereon with a thickness of 30 nm. Thereafter, by installing a patterned mask (light-emitting area of 4 mm×5 mm) on the resultant organic thin film, depositing lithium fluoride thereon with a thickness of 3 nm, and then depositing aluminum thereon with a thickness of 100 nm, an EL device is manufactured. As a result of applying a DC steady voltage to the EL device to emit light by the use of Source Measure Unit 2400 made by Toyo Corporation, the green light could be obtained.

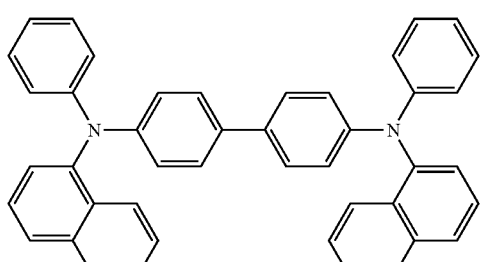

NPD

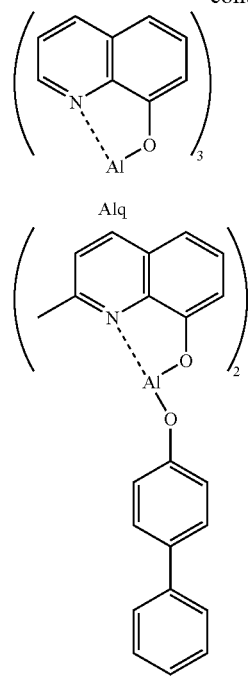

Alq

BAlq

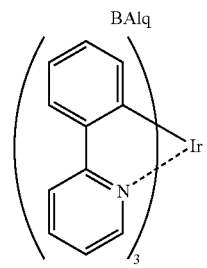

Ir(ppy)$_3$

Example 1

By using Compound (1) according to the present invention instead of Ir(ppy)$_3$ in the light emitting device according to Comparative Example 1, a device is manufactured similarly to Comparative Example 1. The resultant device could be decreased to a half in the number of dark spots generated in comparison with the device according to Comparative Example 1, thereby reducing the driving voltage for allowing current of 1 mA to flow in the EL device.

Example 2

By using Ir(ppy)$_3$, CBP(4,4-N,N' dicarbazole-biphenyl), and Compound (113) according to the present invention with a ratio (mass ratio) of 5:70:25, instead of Ir(ppy)$_3$ and CBP (4,4-N,N' dicarbazole-biphenyl) in the light emitting device according to Comparative Example 1, a device is manufactured similarly to Comparative Example 1. The resultant device could be decreased to a half in the number of dark spots generated in comparison with the device according to Comparative Example 1, thereby reducing the driving voltage for allowing current of 1 mA to flow in the EL device.

Example 3

By using Ir(ppy)$_3$ and Compound (184) according to the present invention with a ratio (mass ratio) of 1:2, instead of Ir(Ppy)$_3$ and CBP(4,4-N,N' dicarbazole-biphenyl) in the light emitting device according to Comparative Example 1, a device is manufactured similarly to Comparative Example 1. The resultant device could be decreased to a half in the number of dark spots generated in comparison with the device according to Comparative Example 1, thereby reducing the driving voltage for allowing current of 1 mA to flow in the EL device.

Comparative Example A-0

A cleaned ITO substrate was placed into a vapor deposition apparatus and NPD ((N,N'-di-α-naphthyl-N,N'-diphenyl)-benzidine) was deposited thereon as a hole transporting layer with a thickness of 10 nm. Ir(ppy)$_3$ as a light emitting material and CBP (4,4-N,N'-dicarbazolbiphenyl) as a host material were deposited on the resultant structure at a ratio (mass ratio) of 5:95 with a thickness of 30 nm and BAlq was deposited thereon as an electron transporting layer with a thickness of 40 nm. Thereafter, a patterned mask (of which the light emitting area is 4 mm×5 mm) was placed on the obtained organic thin film, lithium fluoride was deposited thereon with a thickness of about 1 nm, and then aluminum was co-deposited thereon with a thickness of 100 nm, thereby manufacturing an EL device. As a result of applying a DC steady voltage to the EL device to emit light by the use of Source measure unit 2400 made by Toyo Corporation, green light resulting from Ir(ppy)$_3$ could be obtained. An EL external quantum yield calculated from the driving voltage and the front brightness of the EL device at 2000 cd/m$^2$ is shown in Table 1.

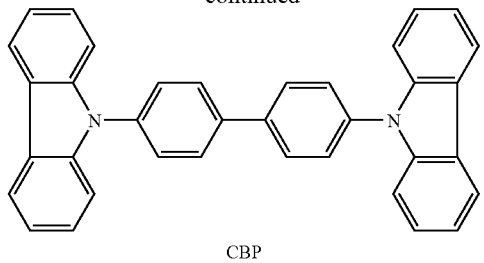

CBP

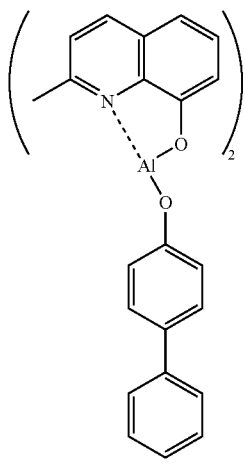

BAlq

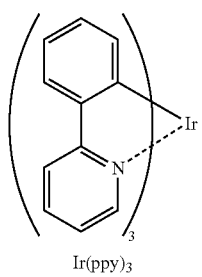

Ir(ppy)$_3$

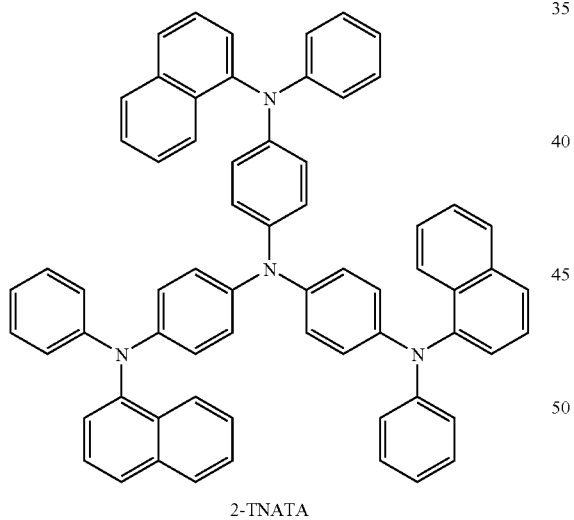

2-TNATA

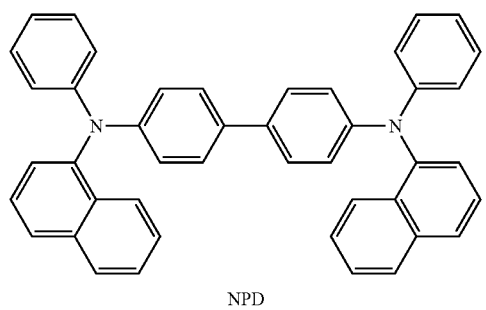

NPD

Example A-1

By using Compound (5) according to the present invention instead of the hole transporting layer NPD in the EL device according to Comparative Example A-0, an EL device was manufactured similarly to Comparative Example A-0. An EL external quantum yield calculated from the driving voltage and the front brightness of the EL device at 2000 cd/m$^2$ is shown in Table 1.

Example A-2

By using Compound (185) according to the present invention instead of the hole transporting layer NPD in the EL device according to Comparative Example A-0, an EL device was manufactured similarly to Comparative Example A-0. An EL external quantum yield calculated from the driving voltage and the front brightness of the EL device at 2000 cd/m$^2$ is shown in Table 1.

Example A-3

By using Compound (208) according to the present invention instead of the hole transporting layer NPD in the EL device according to Comparative Example A-0, an EL device was manufactured similarly to Comparative Example A-0. An EL external quantum yield calculated from the driving voltage and the front brightness of the EL device at 2000 cd/m² is shown in Table 1.

TABLE 1

Driving voltage and EL external quantum yield of the obtained devices at 2000 cd/m²

| No. | Driving voltage (V) | EL external quantum yield (%) |
|---|---|---|
| Comparative Example A-0 | 10.2 | 7.2 |
| Example A-1 | 9.3 | 10.0 |
| Example A-2 | 9.2 | 10.9 |
| Example A-3 | 10.0 | 9.8 |

As can be seen apparently from Table 1, the EL devices using the compounds according to the present invention as the hole transporting layer exhibit relatively high light emission efficiency in comparison with the EL device according to the comparative example, and the voltage values with the same brightness are equal to or smaller than that of the EL device according to Comparative Example A-0 from the view point of improvement in light emission efficiency.

Comparative Example B-0

A cleaned ITO substrate was placed into a vapor deposition apparatus, 2-TNATA was deposited thereon as a hole injecting layer with a thickness of 140 nm. NPD ((N,N'-di-α-naphthyl-N,N'-diphenyl)-benzidine) was deposited thereon as a hole transporting layer with a thickness of 7 nm. Carbazole derivative (1) was deposited thereon as a hole injection promoting layer with a thickness of 3 nm. Firpic as a light emitting material and mCP as a host material were deposited on the resultant structure at a ratio (mass ratio) of 8:92 with a thickness of 30 nm and BAlq was deposited thereon as an electron transporting layer with a thickness of 40 nm. Thereafter, a patterned mask (of which the light emitting area is 4 mm×5 mm) was placed on the obtained organic thin film, lithium fluoride was deposited thereon with a thickness of about 1 nm, and then aluminum was co-deposited thereon with a thickness of 100 nm, thereby manufacturing an EL device. As a result of applying a DC steady voltage to the EL device to emit light by the use of Source measure unit 2400 made by Toyo Corporation, blue-green light resulting from Firpic could be obtained. An EL external quantum yield calculated from the driving voltage and the front brightness of the EL device at 600 cd/m² is shown in Table 2.

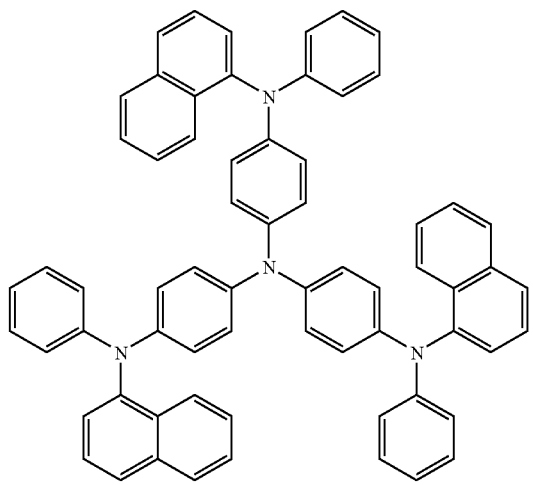

2-TNATA

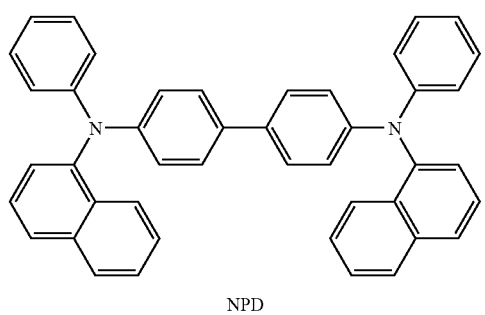

NPD

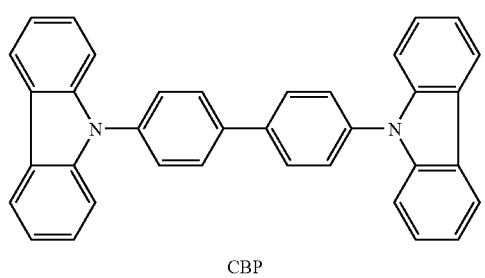

CBP

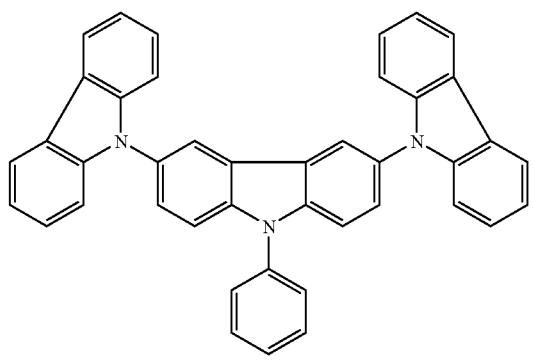

Carbazole derivative (1)

-continued

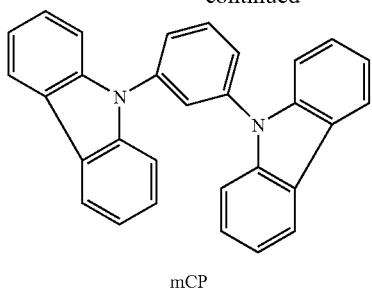

mCP

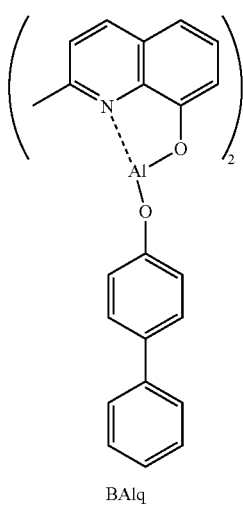

BAlq

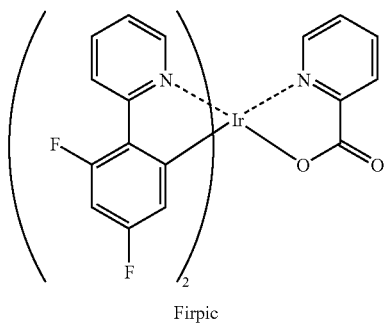

Firpic

Example B-1

By using Compound (5) according to the present invention instead of NPD of 7 nm as the hole transporting layer in the EL device according to Comparative Example B-0, an EL device was manufactured similarly to Comparative Example B-0. An EL external quantum yield calculated from the driving voltage and the front brightness of the EL device at 600 cd/m² is shown in Table 2.

Example B-2

By using Compound (185) according to the present invention instead of NPD of 7 nm as the hole transporting layer in the EL device according to Comparative Example B-0, an EL device was manufactured similarly to Comparative Example B-0. An EL external quantum yield calculated from the driving voltage and the front brightness of the EL device at 600 cd/m² is shown in Table 2.

Example B-3

By using Compound (208) according to the present invention instead of NPD of 7 nm as the hole transporting layer in the EL device according to Comparative Example B-0, an EL device was manufactured similarly to Comparative Example B-0. An EL external quantum yield calculated from the driving voltage and the front brightness of the EL device at 600 cd/m² is shown in Table 2.

TABLE 2

Driving voltage and EL external quantum yield of the obtained devices at 600 cd/m²

| No. | Driving voltage (V) | EL external quantum yield (%) |
|---|---|---|
| Comparative Example B-0 | 9.1 | 5.5 |
| Example B-1 | 8.8 | 10.0 |
| Example B-2 | 8.6 | 11.4 |
| Example B-3 | 9.1 | 8.8 |

As can be seen apparently from Table 2, the EL devices using the compounds according to the present invention as the hole transporting layer exhibit relatively high light emission efficiency in comparison with the EL device according to the comparative example, and the voltage values with the same brightness are equal to or smaller than that of the EL device according to Comparative Example B-0 from the view point of improvement in light emission efficiency.

Comparative Example C-0

A cleaned ITO substrate was placed into a vapor deposition apparatus, 2-TNATA was deposited thereon as a hole injecting layer with a thickness of 140 nm. NPD ((N,N'-di-α-naphthyl-N,N'-diphenyl)-benzidine) was deposited thereon as a hole transporting layer with a thickness of 7 nm. Carbazole derivative (1) was deposited thereon as a hole injection promoting layer with a thickness of 3 nm. Compound (P-2) as a light emitting material (P-2) and mCP as a host material were deposited on the resultant structure at a ratio (mass ratio) of 15:85 with a thickness of 30 nm and BAlq was deposited thereon as an electron transporting layer with a thickness of 40 nm. Thereafter, a patterned mask (of which the light emitting area is 4 mm×5 mm) was placed on the obtained organic thin film, lithium fluoride was deposited thereon with a thickness of about 1 nm, and then aluminum was co-deposited thereon with a thickness of 100 nm, thereby manufacturing an EL device. As a result of applying a DC steady voltage to the EL device to emit light by the use of Source measure unit 2400 made by Toyo Corporation, blue light resulting from the light emitting material (P-2) could be obtained. An EL external quantum yield calculated from the driving voltage and the front brightness of the EL device at 400 cd/m² is shown in Table 3.

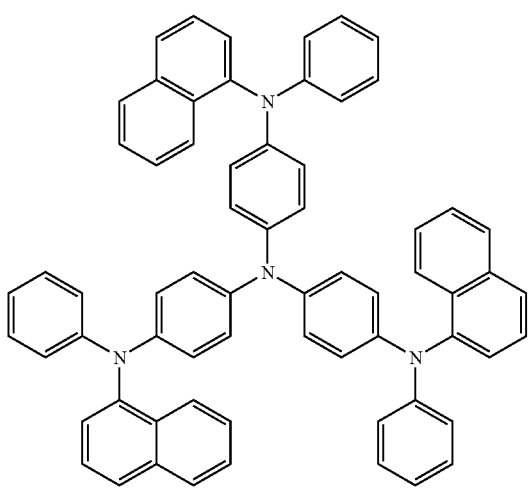
2-TNATA

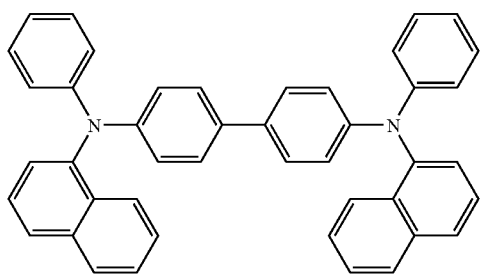
NPD

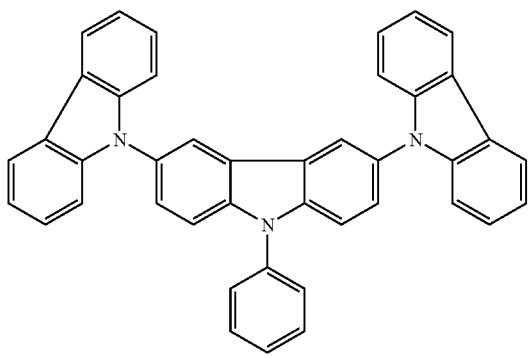
Carbazole derivative (1)

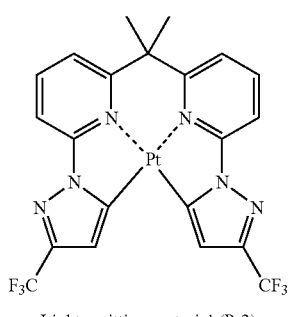
Light emitting material (P-2)

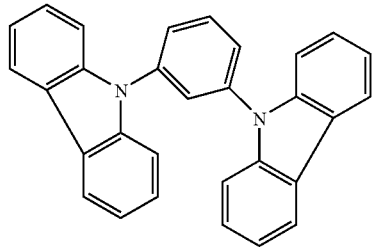
mCP

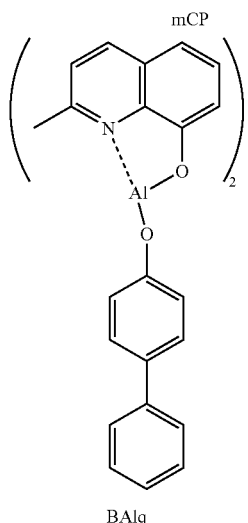
BAlq

Example C-1

By depositing Compound (5) according to the present invention with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

Example C-2

By depositing Compound (185) according to the present invention with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

Example C-3

By depositing Compound (208) according to the present invention with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

Example C-4

By depositing Compound (5) according to the present invention and Carbazole derivative 1 at a ratio (mass ratio) of 70:30 with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

Example C-5

By depositing Compound (185) according to the present invention and Carbazole derivative 1 at a ratio (mass ratio) of 70:30 with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

Example C-6

By depositing Compound (208) according to the present invention and Carbazole derivative 1 at a ratio (mass ratio) of 70:30 with a thickness of 10 nm instead of NPD of 7 nm as the hole transporting layer and Carbazole derivative 1 of 3 nm as the hole injection promoting layer 1 in the EL device according to Comparative Example C-0, an EL device was manufactured similarly to Comparative Example C-0. An EL external quantum yield calculated from the driving voltage and the front brightness of the EL device at 400 cd/m² is shown in Table 3.

TABLE 3

Driving voltage and EL external quantum yield of the obtained devices at 400 cd/m²

| No. | Driving voltage (V) | EL external quantum yield (%) |
| --- | --- | --- |
| Comparative Example C-0 | 9.3 | 5.3 |
| Example C-1 | 9.2 | 9.3 |
| Example C-2 | 9.0 | 9.6 |
| Example C-3 | 9.3 | 8.8 |
| Example C-4 | 8.9 | 7.8 |
| Example C-5 | 8.7 | 8.2 |
| Example C-6 | 8.6 | 7.3 |

As can be seen apparently from Table 3, the EL devices employing the hole injection promoting layer combined with the hole injecting layer containing the compounds according to the present invention exhibit relatively high light emission efficiency in comparison with the EL device according to the comparative example, and the voltage values with the same brightness are equal to or smaller than that of the EL device according to Comparative Example C-0 from the view point of improvement in light emission efficiency.

As described above with reference to the comparative examples and the examples, the organic EL device using the compounds according to the present invention as an adjacent layer can realize light emission with high efficiency and driving with a low voltage.

INDUSTRIAL APPLICABILITY

The organic electroluminescent device having the compound according to the present invention has excellent durability. In addition, by using a compound having a specific structure in a specific layer of an organic layer, it is possible to emit light with high efficiency.

The entire disclosure of each and every foreign patent application from which the benefit of foreign priority has been claimed in the present application is incorporated herein by reference, as if fully set forth.

The invention claimed is:

1. An organic electroluminescent device comprising:
   a pair of electrodes consisting of a positive electrode and a negative electrode; and
   at least two organic layers between the pair of electrodes, wherein the organic layers comprises a hole transporting layer and a light emitting layer,
   wherein the hole transporting layer contains a compound represented by Formula (1):

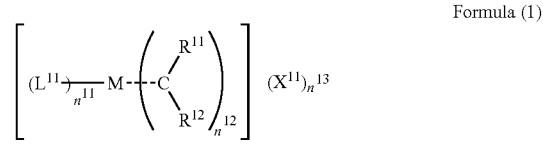

Formula (1)

wherein M represents Ir;
$R^{11}$ and $R^{12}$ each independently represents a hydrogen atom or a substituent group, and $R^{11}$ and $R^{12}$ may be independently bonded to M or $R^{11}$ and $R^{12}$ may be bonded to each other to form a cyclic structure;
$L^{11}$ represents a ligand, and $L^{11}$ may be bonded to at least one of $R^{11}$ and $R^{12}$;
$X^{11}$ represents a counter ion;
$n^{11}$ represents an integer of 0 to 5;
$n^{12}$ represents an integer of 1 to 6;
$n^{13}$ represents an integer of 0 to 3; and
C represents a carbene carbon, which is bonded to $R^{11}$ and $R^{12}$ to coordinate with M, wherein the light emitting layer contains a compound represented by Formula (P-2):

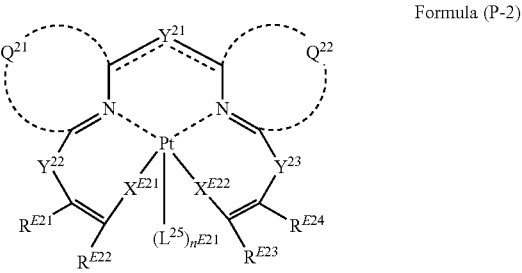

Formula (P-2)

wherein Pt represents a platinum ion;
$Y^{21}$ represents a connection group, a single bond, or a double bond;
$Y^{22}$ and $Y^{23}$ each independently represent a single bond or a connection bond;
$Q^{21}$ and $Q^{22}$ each independently represent an atom group constituting a nitrogen-containing heterocycle, and the bond between a ring formed by $Q^{21}$ and $Y^{21}$ and the bond between a ring formed by $Q^{22}$ and $Y^{21}$ each independently represent a single bond or a double bond;

$X^{E21}$ and $R^{E22}$ each independently represent an oxygen atom, a sulfur atom, or a substituted or non-substituted nitrogen atom;

$R^{E21}$, $R^{E22}$, $R^{E23}$, and $R^{E24}$ each independently represent a hydrogen atom or a substituent group, and $R^{E21}$, $R^{E22}$, $R^{E23}$, and $R^{E24}$ may form a ring by means of bonding, respectively;

$L^{25}$ represents a ligand coordinating with the platinum ion; and $n^{E21}$ represents an integer of 0 to 4, and wherein the compound represented by Formula (P-2) has a maximum luminescence wavelength of from 390 to 495 nm.

2. The organic electroluminescent device according to claim 1,
wherein the compound represented by Formula (1) is a compound represented by Formula (2):

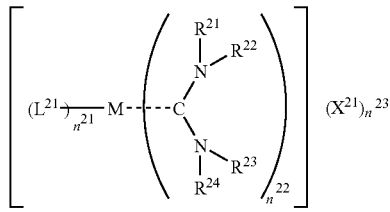

Formula (2)

wherein M represents Ir;

$R^{21}$, $R^{22}$, $R^{23}$ and $R^{24}$ each independently represents a hydrogen atom or a substituent group, and $R^{21}$, $R^{22}$, $R^{23}$ and $R^{24}$ may be independently bonded to M or $R^{21}$, $R^{22}$, $R^{23}$ and $R^{24}$ may be bonded to each other to form a cyclic structure;

$L^{21}$ represents a ligand, and $L^{21}$ may be bonded to at least one of $R^{21}$, $R^{22}$, $R^{23}$ and $R^{24}$;

$X^{21}$ represents a counter ion;

$n^{21}$ represents an integer of 0 to 5;

$n^{22}$ represents an integer of 1 to 6;

$n^{23}$ represents an integer of 0 to 3; and

C represents a carbene carbon, which is bonded to two nitrogen atoms to coordinate with M.

3. The organic electroluminescent device according to claim 2,
wherein the compound represented by Formula (2) is a compound represented by Formula (3):

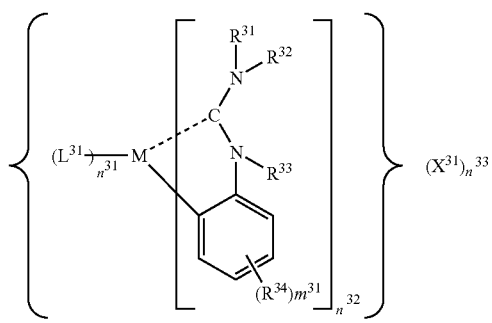

Formula (3)

wherein M represents Ir;

$R^{31}$, $R^{32}$ and $R^{33}$ each independently represents a hydrogen atom or a substituent group, and $R^{31}$, $R^{32}$ and $R^{33}$ may be bonded to each other to form a cyclic structure or $R^{31}$, $R^{32}$ and $R^{33}$ may coordinate with M through an atom of $R^{31}$, $R^{32}$ and $R^{33}$ respectively;

$R^{34}$ represents a substituent group, provided that when $R^{34}$ is plural, a plurality of $R^{34}$ may equal to or different from each other, and a plurality of $R^{34}$ may be bonded to each other to form a cyclic structure or $R^{34}$ may coordinate with M through an atom of $R^{34}$;

$L^{31}$ represents a ligand;

$X^{31}$ represents a counter ion;

$n^{31}$ represents an integer of 0 to 4;

$n^{32}$ represents an integer of 1 to 3;

$n^{33}$ represents an integer of 0 to 2;

$m^{31}$ represents an integer of 0 to 4; and

C represents a carbene carbon, which is bonded to two nitrogen atoms to coordinate with M by means of two electrons of the carbene carbon.

4. The organic electroluminescent device according to claim 3,
wherein the compound represented by Formula (3) is a compound represented by Formula (4):

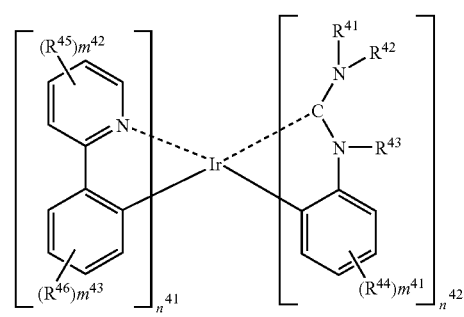

Formula (4)

wherein $R^{41}$, $R^{42}$ and $R^{43}$ each independently represents a hydrogen atom or a substituent group, and $R^{41}$, $R^{42}$ and $R^{43}$ may be bonded to each other to form a cyclic structure or $R^{41}$, $R^{42}$ and $R^{43}$ may coordinate with M through an atom of $R^{41}$, $R^{42}$ and $R^{43}$ respectively;

$R^{44}$, $R^{45}$ and $R^{46}$ each independently represents a substituent group, provided that when $R^{44}$, $R^{45}$ and $R^{46}$ are plural respectively, a plurality of $R^{44}$, a plurality of $R^{45}$ and a plurality of $R^{46}$ may be bonded to each other to form a cyclic structure respectively or $R^{44}$, $R^{45}$ and $R^{46}$ may coordinate with M through an atom of $R^{44}$, $R^{45}$ and $R^{46}$ respectively;

$n^{41}$ represents an integer of 0 to 2;

$n^{42}$ represents an integer of 1 to 3; and $m^{41}$, $m^{42}$ and $m^{43}$ each independently represents an integer of 0 to 4.

5. The organic electroluminescent device according to claim 1,
wherein a ligand containing the carbene carbon is a tridentate to hexadentate ligand.

6. The organic electroluminescent device according to claim 1,
wherein at least one layer between the light emitting layer and the negative electrode contains a compound represented by Formula (1).

* * * * *